United States Patent [19]
Fukuda et al.

[11] Patent Number: 6,131,807
[45] Date of Patent: Oct. 17, 2000

[54] INFORMATION RECORDING MEDIUM AND INFORMATION REPRODUCTION SYSTEM

[75] Inventors: Hiroyuki Fukuda; Seiji Tatsuta, both of Hachioji, Japan

[73] Assignee: Olympus Optical Co., Ltd., Tokyo, Japan

[21] Appl. No.: 09/432,499

[22] Filed: Nov. 2, 1999

Related U.S. Application Data

[60] Continuation of application No. 09/168,710, Oct. 8, 1998, which is a division of application No. 08/571,776, Dec. 13, 1995, Pat. No. 5,866,895.

[30] Foreign Application Priority Data

Dec. 16, 1994 [JP] Japan .................................. 6-313698

[51] Int. Cl.$^7$ ........................... G06K 19/06; G06K 07/14
[52] U.S. Cl. ......................... 234/494; 235/460; 235/454; 283/70; 283/72; 283/93
[58] Field of Search .................. 235/494, 454, 235/461, 460; 283/70, 72, 93

[56] References Cited

U.S. PATENT DOCUMENTS

| | | | |
|---|---|---|---|
| 5,101,096 | 3/1992 | Ohyama et al. . | |
| 5,189,292 | 2/1993 | Batterman et al. | 235/494 |
| 5,304,787 | 4/1994 | Wang | 235/494 |
| 5,315,098 | 5/1994 | Tow | 235/494 |
| 5,327,510 | 7/1994 | Morikawa et al. | 235/494 |
| 5,449,896 | 9/1995 | Hecht et al. | 235/494 |
| 5,453,605 | 9/1995 | Hecht et al. | 235/494 |
| 5,481,103 | 1/1996 | Wang | 235/494 |
| 5,541,396 | 7/1996 | Rentsch | 235/454 |
| 5,572,010 | 11/1996 | Petrie | 235/494 |
| 5,623,479 | 4/1997 | Takahashi . | |

(List continued on next page.)

FOREIGN PATENT DOCUMENTS

| | | |
|---|---|---|
| 0 007 660 | 2/1980 | European Pat. Off. . |
| 0 354 581 | 2/1990 | European Pat. Off. . |
| 0 670 555 A1 | 4/1994 | European Pat. Off. . |
| 0670555 | 6/1995 | European Pat. Off. . |
| 1292483 | 11/1989 | Japan . |
| 3127341 | 5/1991 | Japan . |
| 5109068 | 4/1993 | Japan . |
| WO 82/02105 | 6/1982 | WIPO . |
| WO 85/02284 | 5/1985 | WIPO . |
| WO 95/34049 | 12/1995 | WIPO . |
| WO 96/03710 | 2/1996 | WIPO . |

OTHER PUBLICATIONS

Electronics & Communications in Japan, Part II—Electronics, vol. 75, No. 4, Apr. 1, 1992, pp. 73–84, Shinji Ohyama et al "Optical Sheet Memory System".

Computer Technology Review, vol. 9, No. 2, Feb. 1989, p. 26, 28/29 "Digital Paper Feeds at OA Data Banquet".

*Primary Examiner*—Donald Hajec
*Assistant Examiner*—Douglas X. Rodriguez
*Attorney, Agent, or Firm*—Frishauf, Holtz, Goodman, Langer & Chick, P.C.

[57] ABSTRACT

A dot code recorded on an information recording medium consists of a data code corresponding to the contents of multimedia information to be reproduced, and a pattern code for determining a read reference point for the data code. The pattern code consists of pattern dots arranged at predetermined positions with respect to the data code, and markers arranged at predetermined positions with respect to the pattern dots and used to detect the pattern dots. In an information reproduction system for optically reading and reproducing a dot code from an information recording medium on which such a dot code is recorded, the dot code is imaged by an image input section. A data read reference point determining section then recognizes the pattern code from the picked-up image, and determines a data read reference point for reading the data code. A data reading section reads the data code on the basis of the data read reference point determined by the data read reference point determining section. A reproducing section reproduces/outputs the data read by the data reading section.

10 Claims, 34 Drawing Sheets

U.S. PATENT DOCUMENTS

| | | | |
|---|---|---|---|
| 5,684,885 | 11/1997 | Cass et al. | 382/100 |
| 5,694,102 | 12/1997 | Hecht | 235/456 |
| 5,717,197 | 2/1998 | Petrie | 235/494 |
| 5,754,687 | 5/1998 | Fujimori et al. | 382/190 |
| 5,774,583 | 6/1998 | Sasaki et al. | 382/190 |
| 5,860,679 | 1/1999 | Fukuda et al. | |
| 5,866,895 | 2/1999 | Fukuda et al. | 235/494 |
| 5,896,403 | 4/1999 | Nagasaki et al. | |
| 5,898,166 | 4/1999 | Fukuda et al. | |
| 5,898,709 | 4/1999 | Imade et al. | |

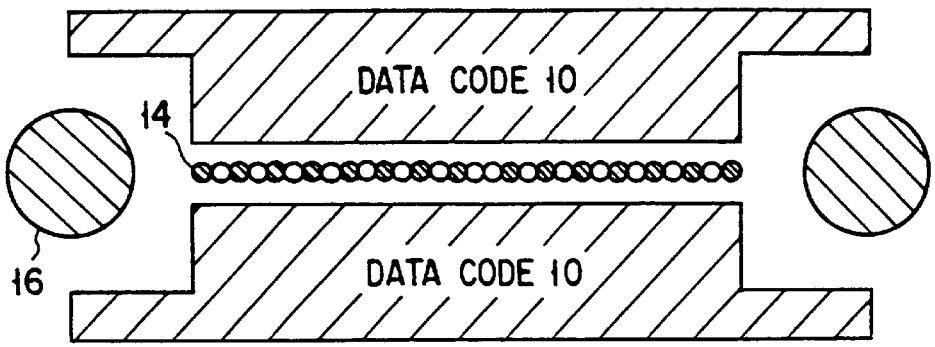
F I G. 12
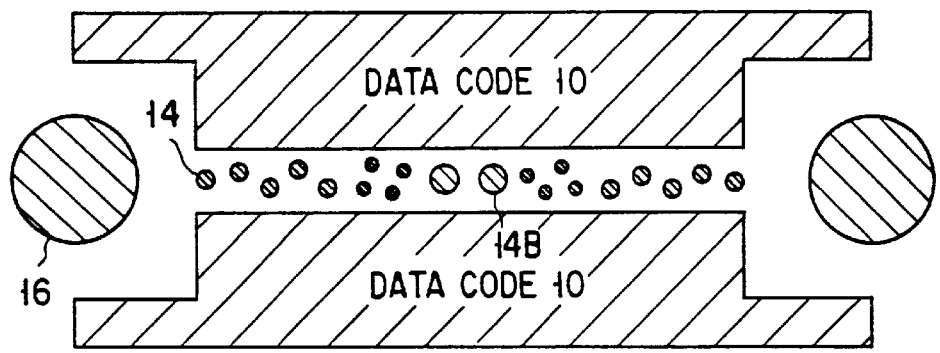
F I G. 15
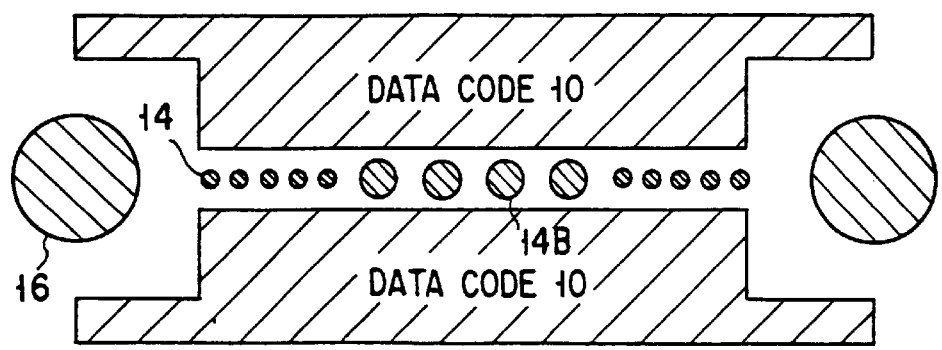
F I G. 18

| INPUT SIGNAL (4 BIT) | OUTPUT SIGNAL (6 BIT) |
|---|---|
| 0 (0 0 0 0) | 36 (1 0 0 1 0 0) |
| 1 (0 0 0 1) | 1 (0 0 0 0 0 1) |
| 2 (0 0 1 0) | 2 (0 0 0 0 1 0) |
| 3 (0 0 1 1) | 4 (0 0 0 1 0 0) |
| 4 (0 1 0 0) | 5 (0 0 0 1 0 1) |
| 5 (0 1 0 1) | 8 (0 0 1 0 0 0) |
| 6 (0 1 1 0) | 9 (0 0 1 0 0 1) |
| 7 (0 1 1 1) | 10 (0 0 1 0 1 0) |
| 8 (1 0 0 0) | 16 (0 1 0 0 0 0) |
| 9 (1 0 0 1) | 17 (0 1 0 0 0 1) |
| 10 (1 0 1 0) | 18 (0 1 0 0 1 0) |
| 11 (1 0 1 1) | 20 (0 1 0 1 0 0) |
| 12 (1 1 0 0) | 21 (0 1 0 1 0 1) |
| 13 (1 1 0 1) | 32 (1 0 0 0 0 0) |
| 14 (1 1 1 0) | 33 (1 0 0 0 0 1) |
| 15 (1 1 1 1) | 34 (1 0 0 0 1 0) |
F I G. 13
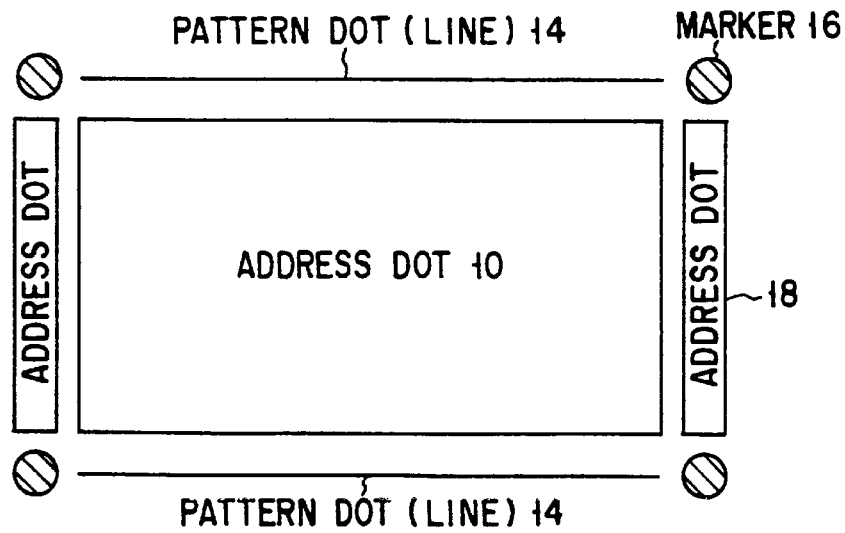
F I G. 14

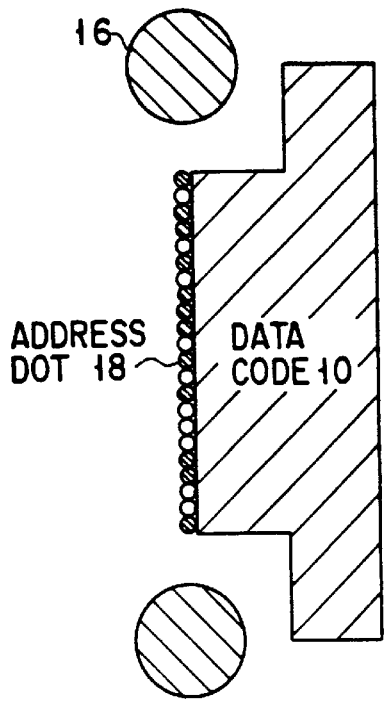
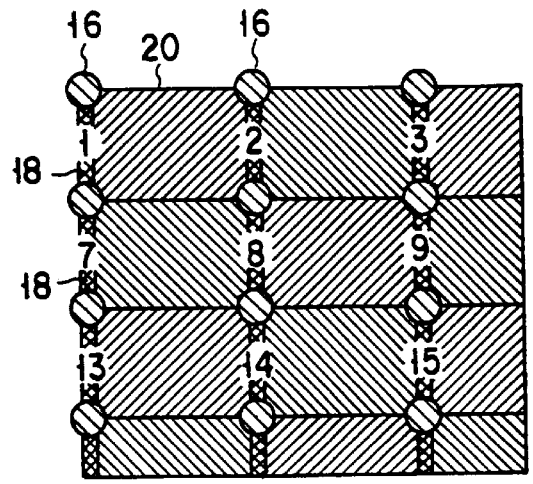
F I G. 19A
F I G. 19B
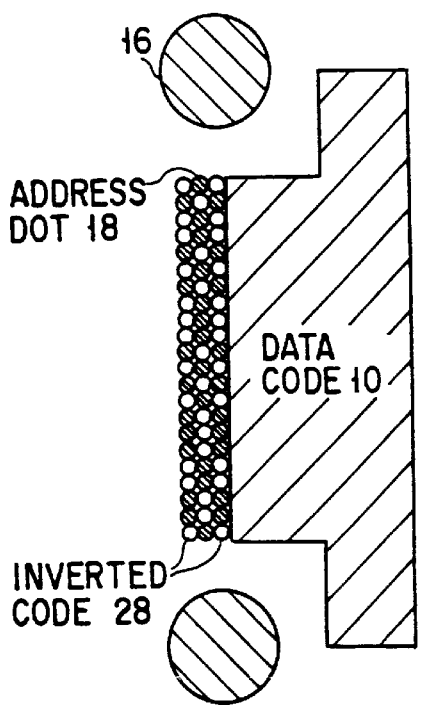
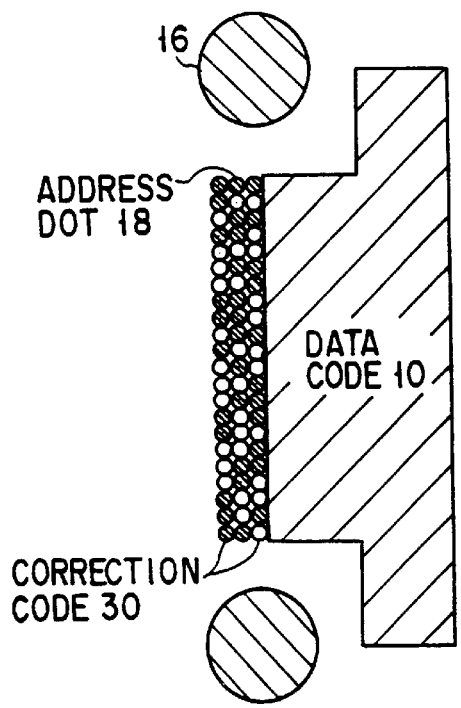
F I G. 20
F I G. 21

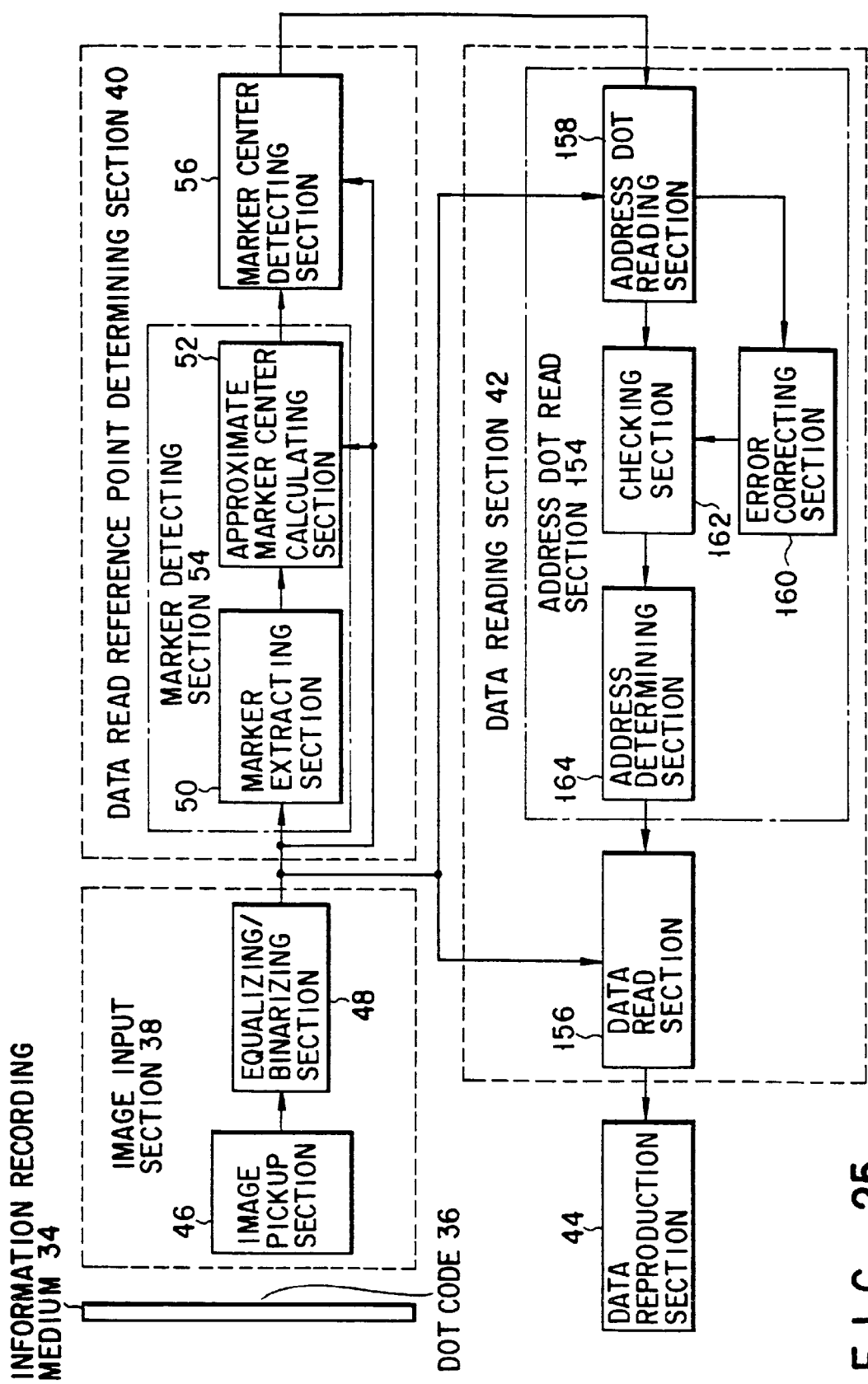
F I G. 25

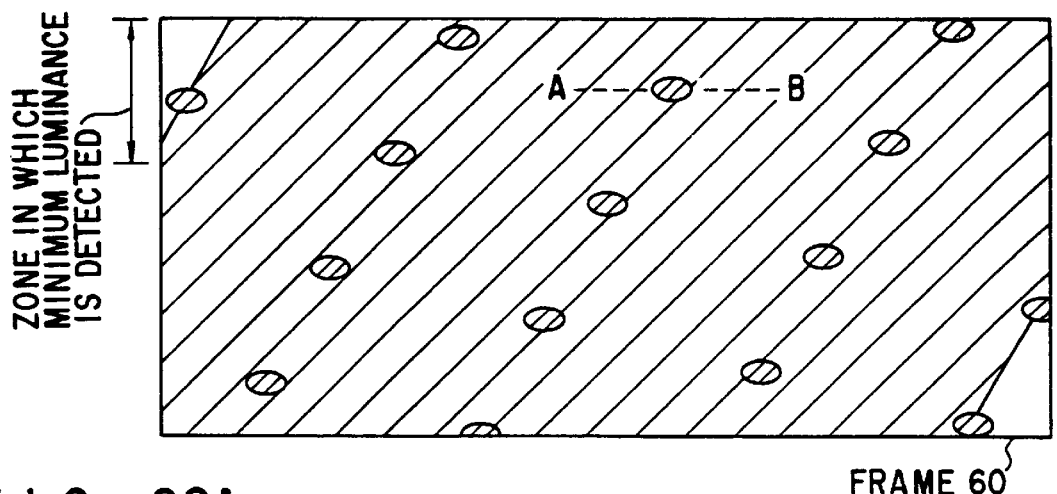
F I G. 28A
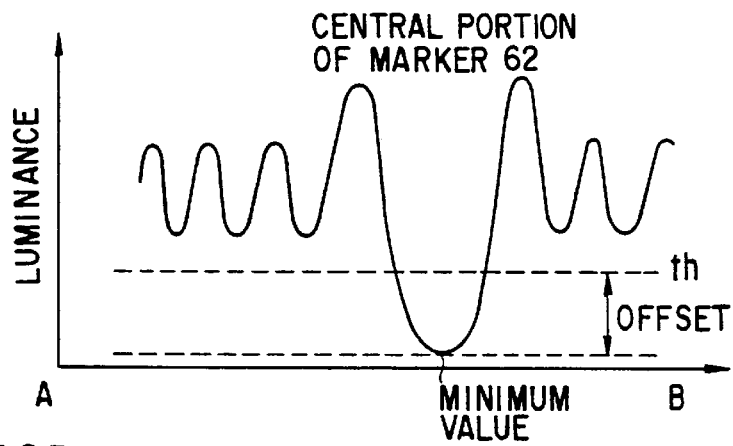
F I G. 28B
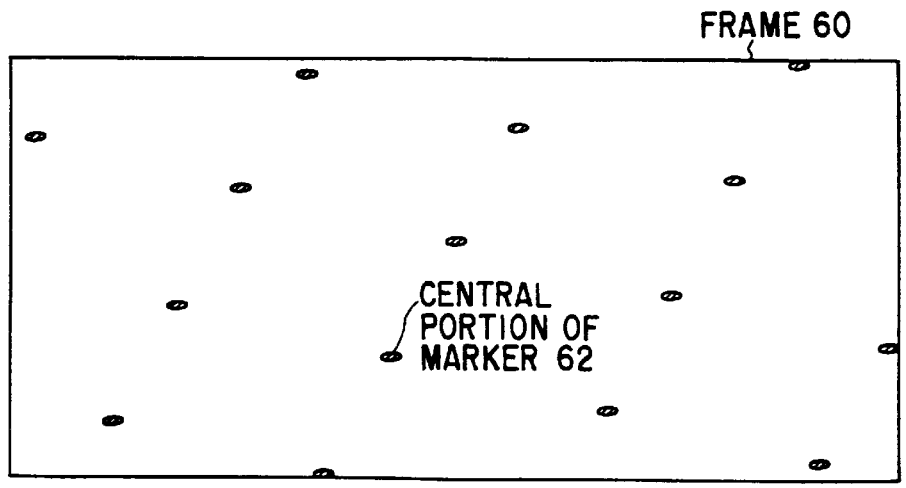
F I G. 28C

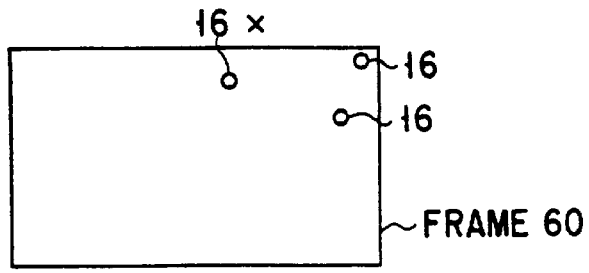
F I G. 31
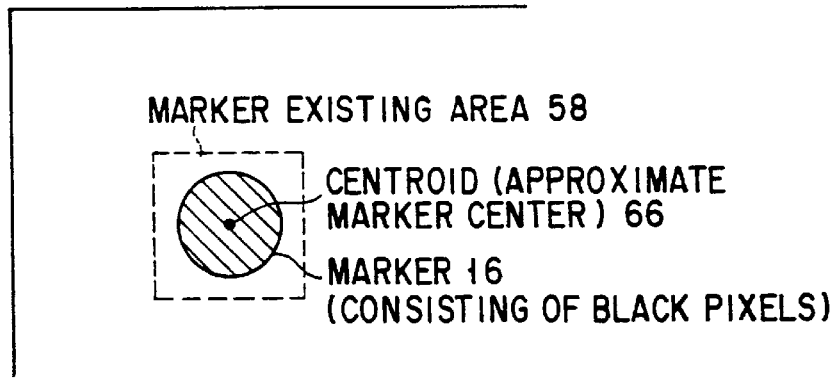
F I G. 32
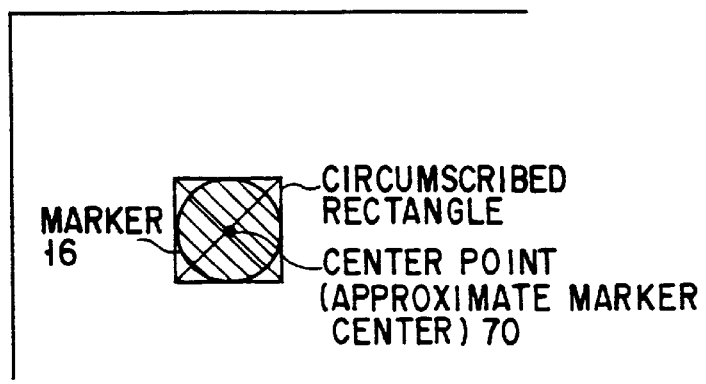
F I G. 33

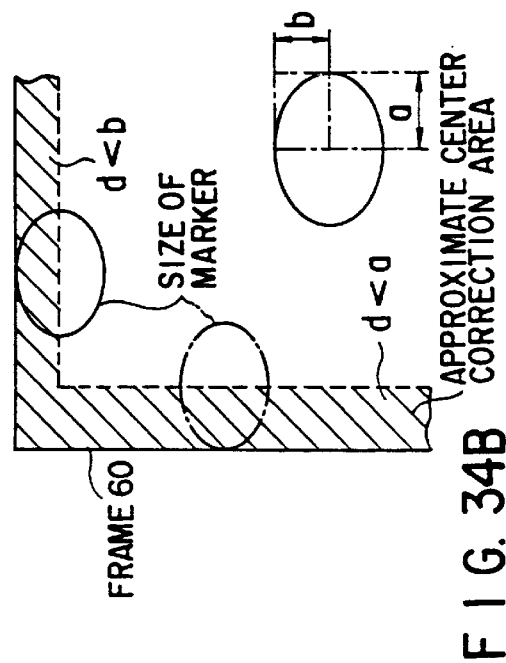
F I G. 34B
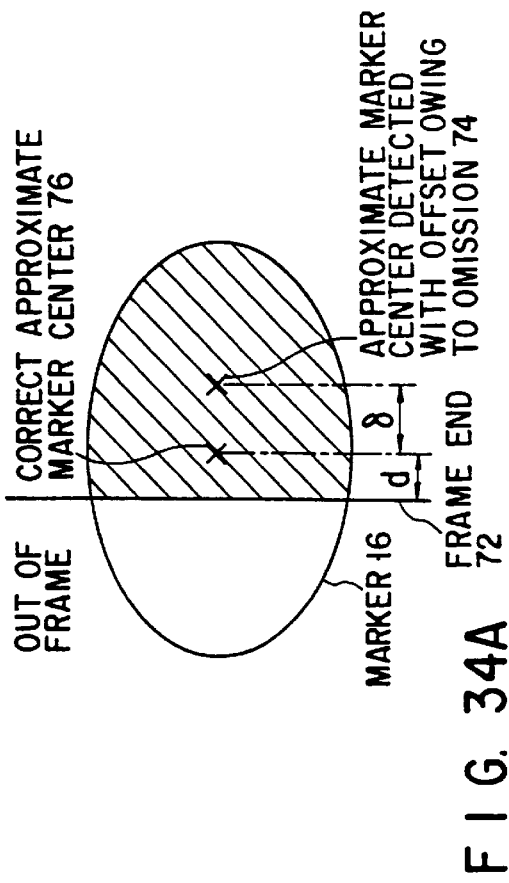
F I G. 34A
F I G. 35

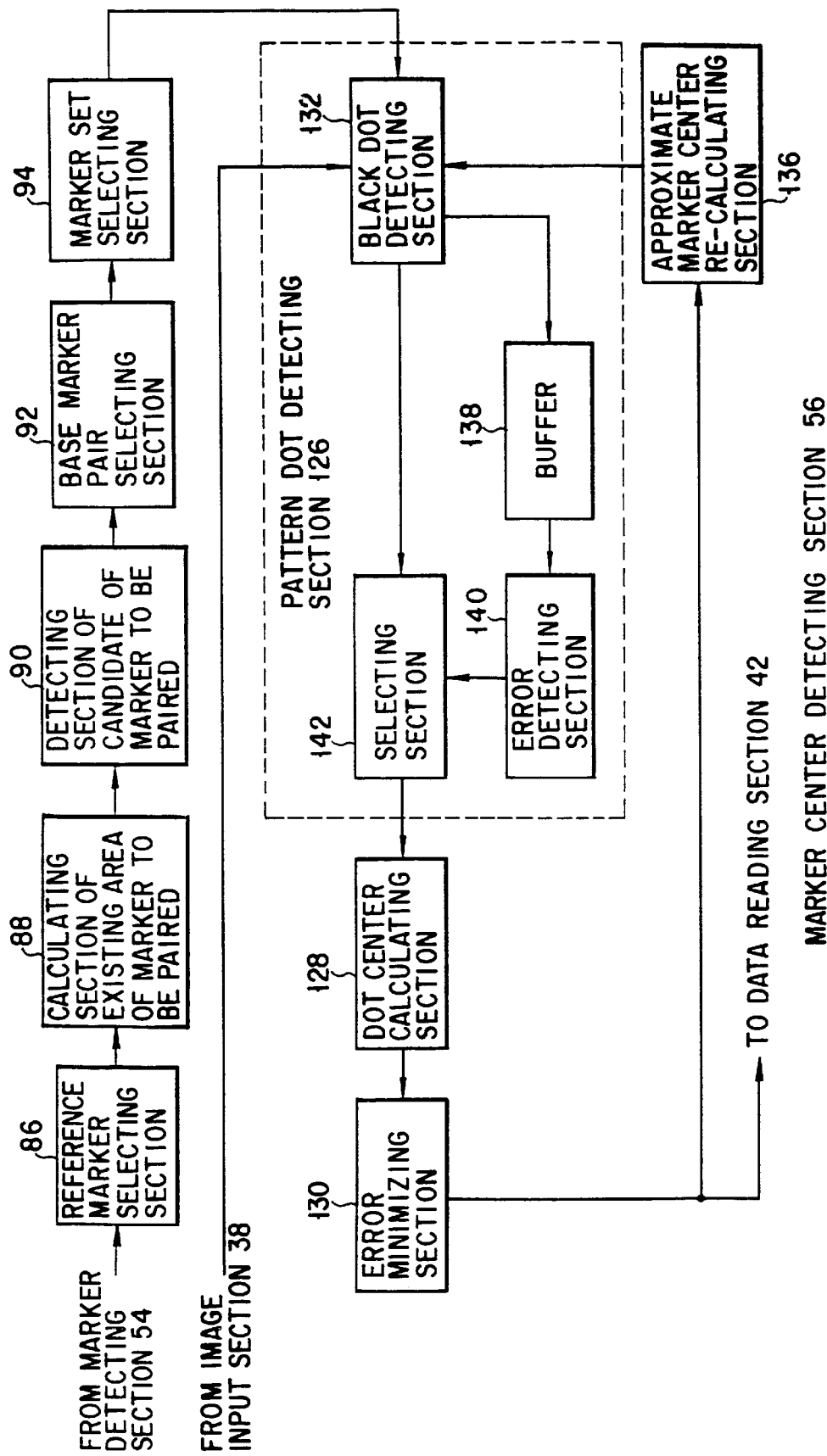
F I G. 38

$$\begin{cases} exv.fx = 35/43 \times RAT \times \Delta y \\ exv.fy = 35/43 \times RAT \times \Delta x \end{cases}$$
$$RAT = 3.47/2.70$$

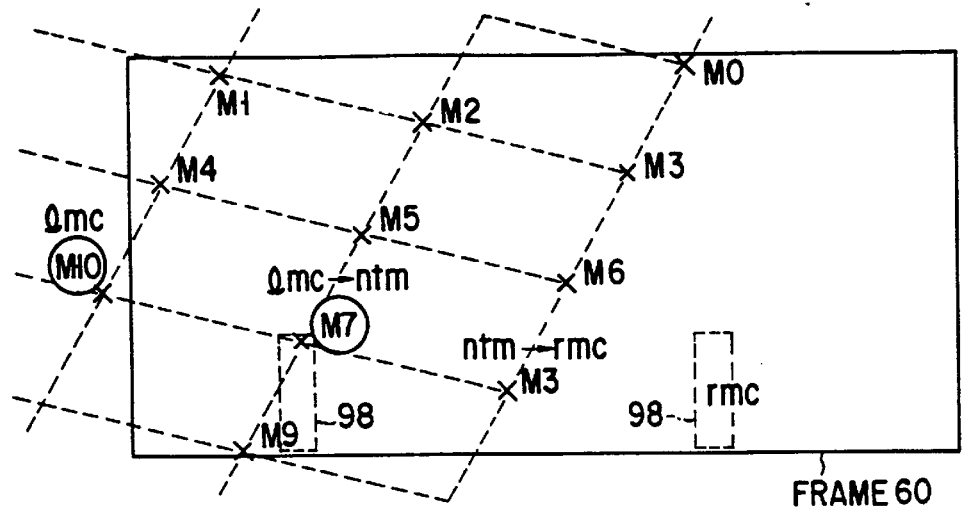
F I G. 46
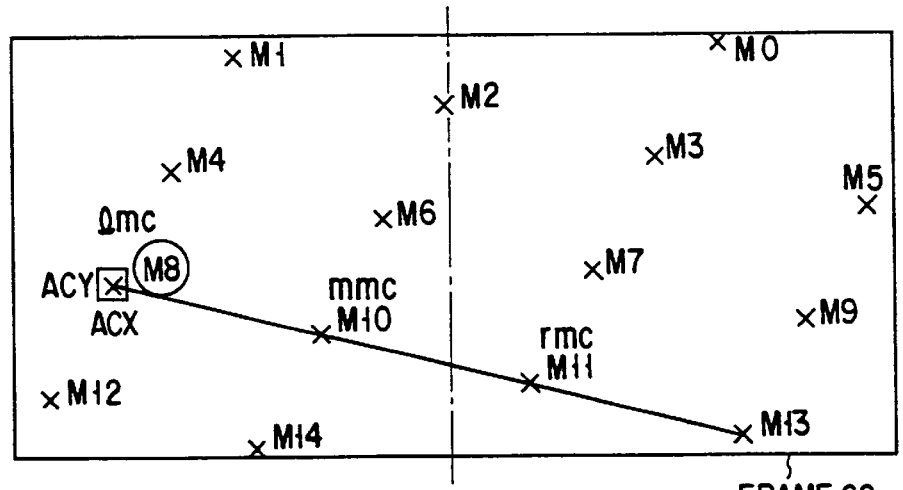
F I G. 48
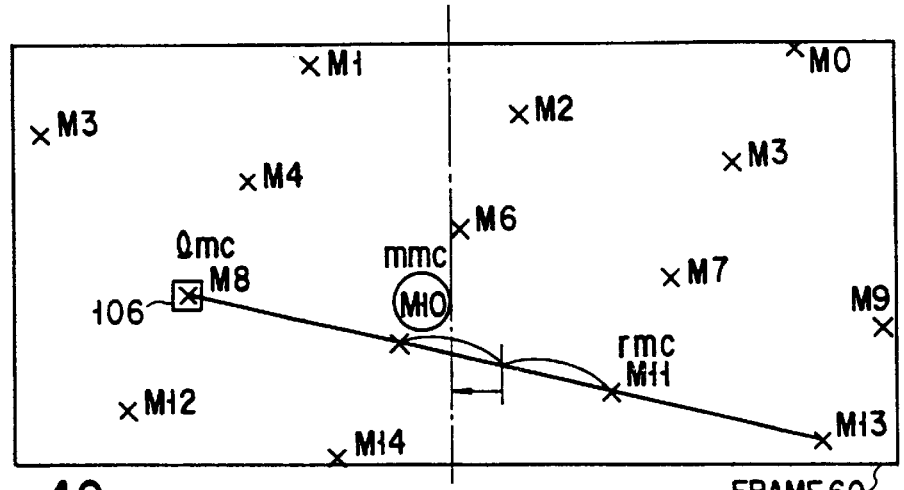
F I G. 49

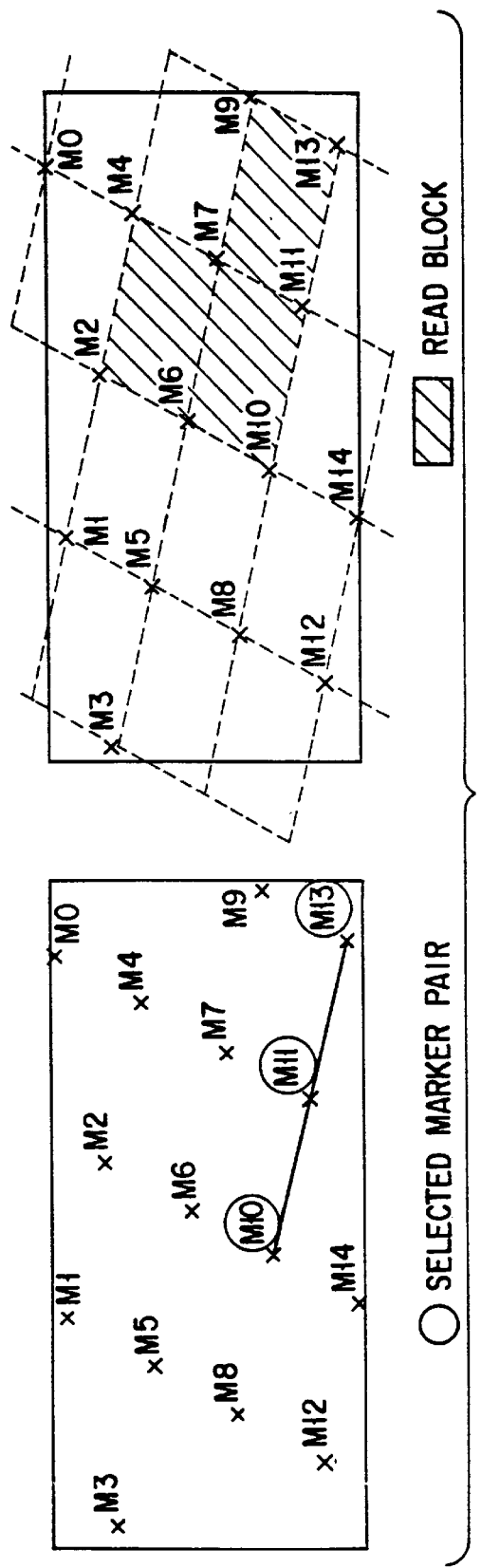
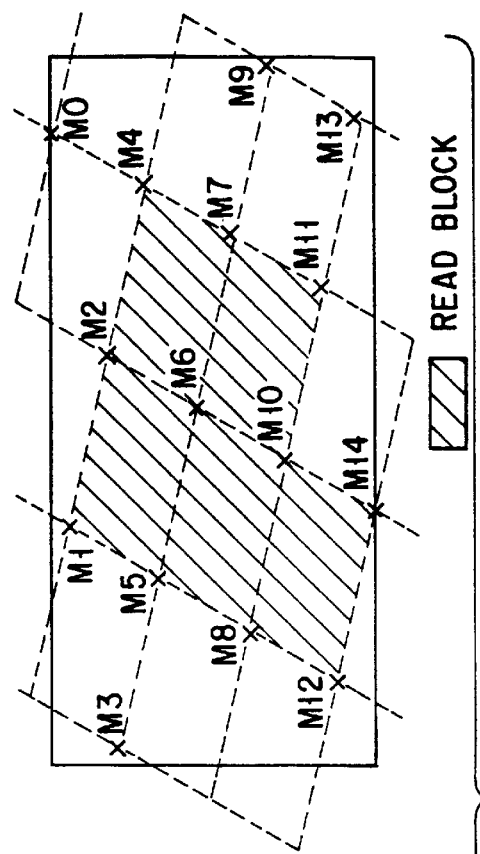
FIG. 47A
FIG. 47B

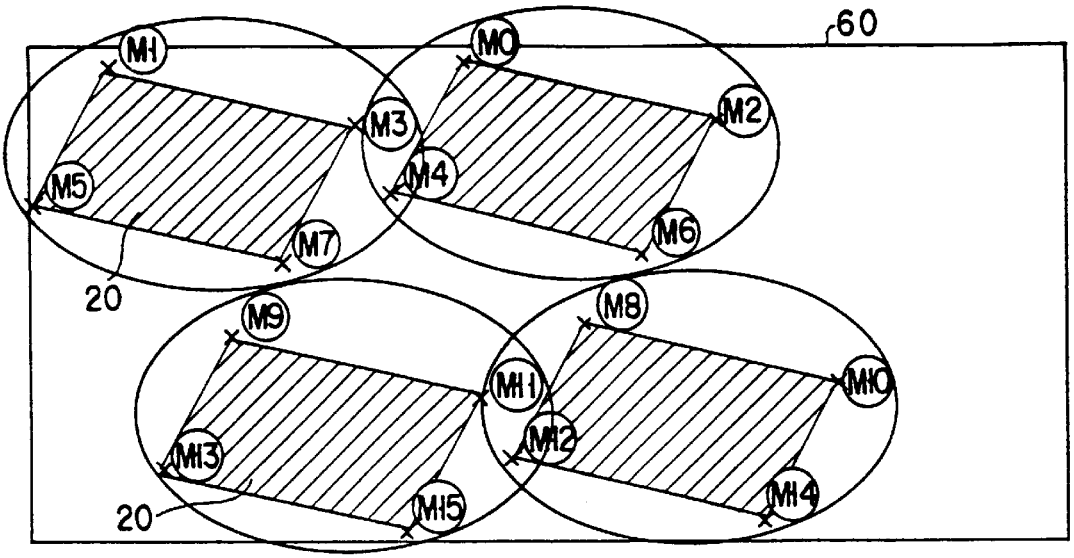
FIG. 50A
| SET OF MARKERS | UPPER LEFT | UPPER RIGHT | LOWER RIGHT | LOWER LEFT |
|---|---|---|---|---|
| FIRST BLOCK | 0 | 2 | 6 | 4 |
| SECOND BLOCK | 1 | 3 | 7 | 5 |
| THIRD BLOCK | 8 | 10 | 14 | 12 |
| FOURTH BLOCK | 9 | 11 | 15 | 13 |
FIG. 50B
| SET OF MARKERS | UPPER LEFT | RELATIONAL EXPRESSION |
|---|---|---|
| FIRST BLOCK | 1 | UPPER RIGHT: +1 |
| SECOND BLOCK | 2 | |
| THIRD BLOCK | 4 | LOWER LEFT: +3 |
| FOURTH BLOCK | 5 | LOWER RIGHT: +4 |
| FIFTH BLOCK | 7 | |
FIG. 51B
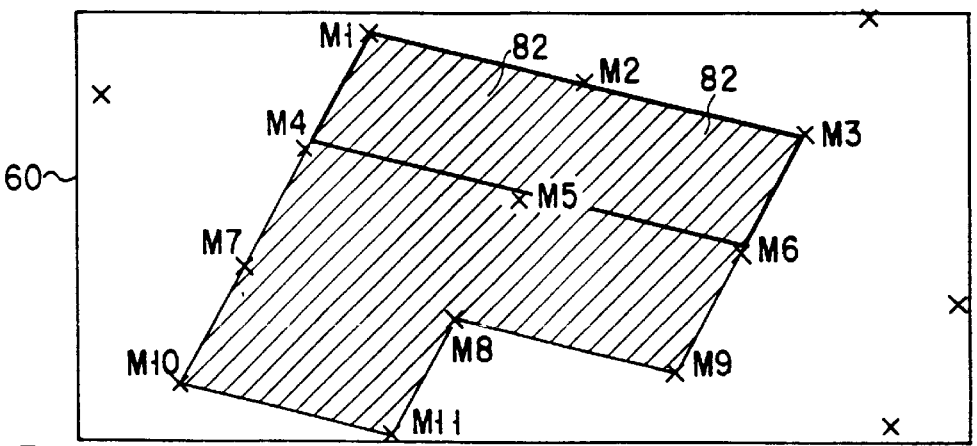
FIG. 51A

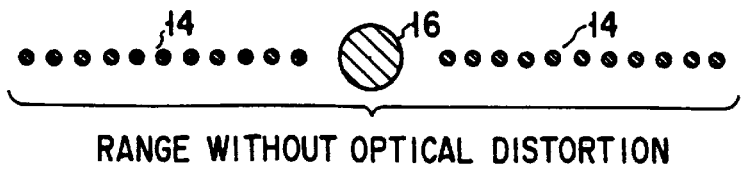
FIG. 61A
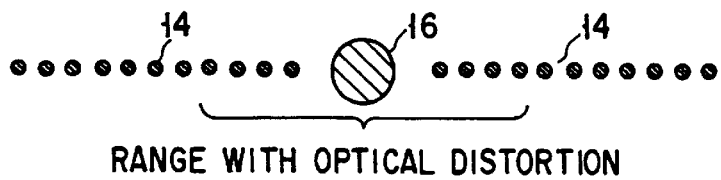
FIG. 61B
FIG. 62A
```
0 1 1        0 2 0
1 6 2        6 ⑨ 7
2 6 ⑧        2 4 1
```
FIG. 62B
```
  1  2  3  4  5  6  7  8  9 10
  ⊙  ⦸  ⦸  ⦸  ⦸  ⊗  ⊗  ⊗  ⊗  ⊙
```
FIG. 63A
```
  1  2  3  4  5  6  7  8  9
  ⊙  ⦸  ⦸  ⊗  ⦸  ⦸  ⦸  ⊗  ⊙
     +1  0 -1  0 +1  0 -1
```
FIG. 63B

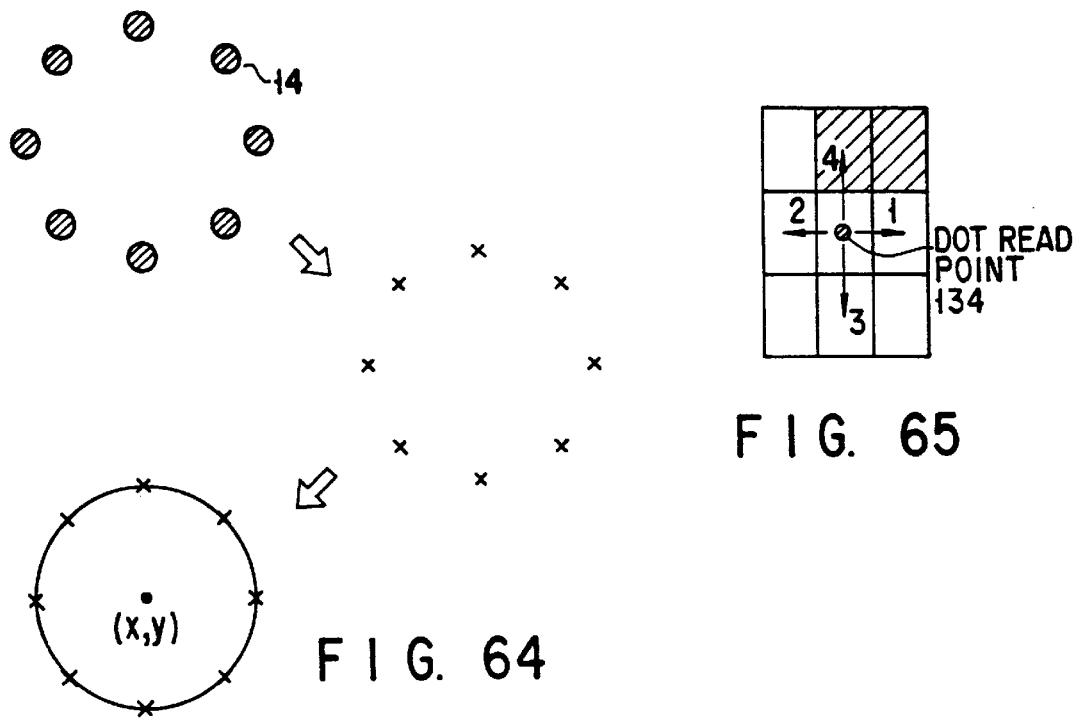
FIG. 65
FIG. 64
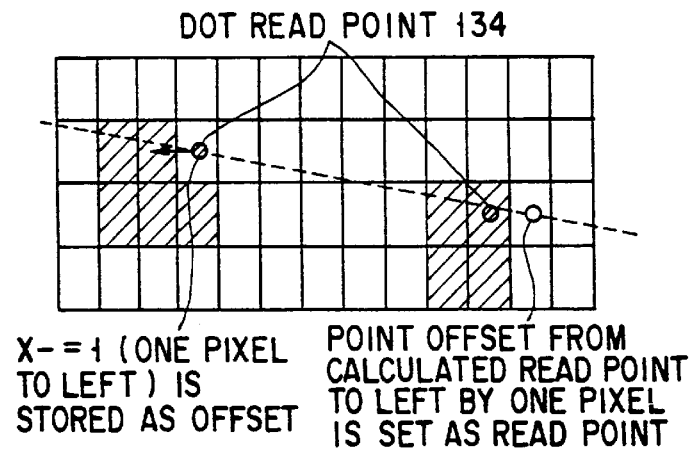
FIG. 66
FIG. 67

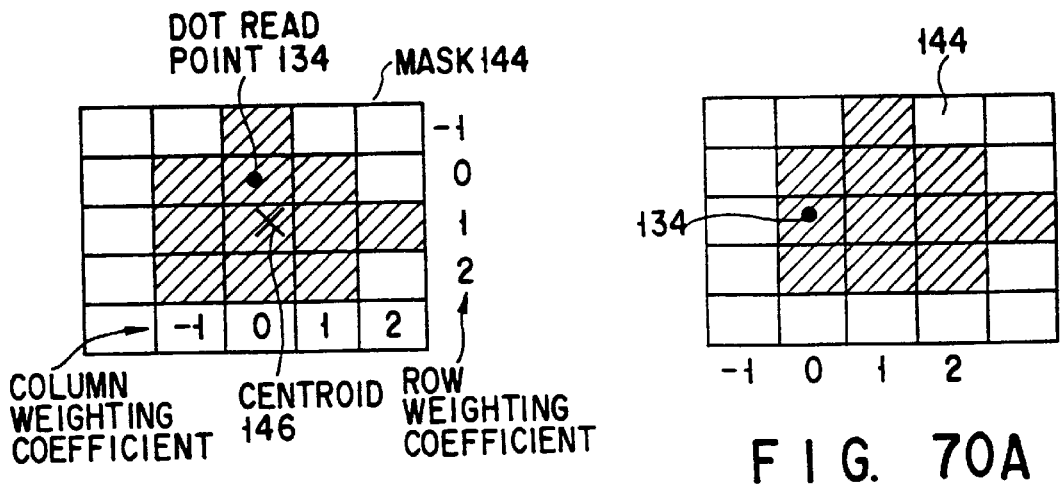
FIG. 69    FIG. 70A
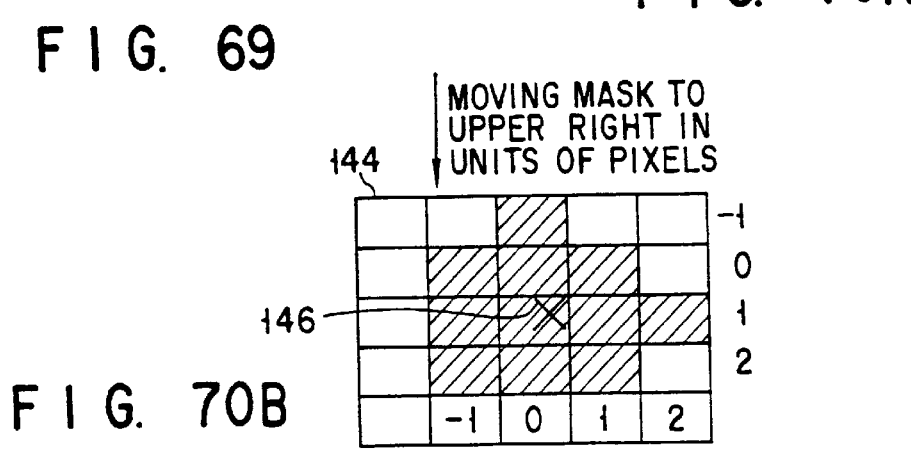
FIG. 70B
| UPWARD BY ONE ROW (TO LEFT BY ONE COLUMN) | UPWARD BY ONE ROW (TO RIGHT BY ONE COLUMN) | DOWNWARD BY TWO ROWS (TO RIGHT BY TWO ROWS) | MOVING AMOUNT OF MASK |
|---|---|---|---|
| ○ | ○ | ○ | FIXED |
| ○ | ○ | × | UPWARD BY ONE PIXEL (TO LEFT) |
| ○ | × | ○ | ERROR |
| ○ | × | × | UPWARD BY TWO PIXEL (TO LEFT) |
| × | ○ | ○ | DOWNWARD BY ONE PIXEL (TO RIGHT) |
| × | ○ | × | FIXED |
| × | × | ○ | ERROR |
| × | × | × | FIXED |
○ : ONE BLACK PIXEL OR MORE
× : NO BLACK PIXEL
FIG. 70C

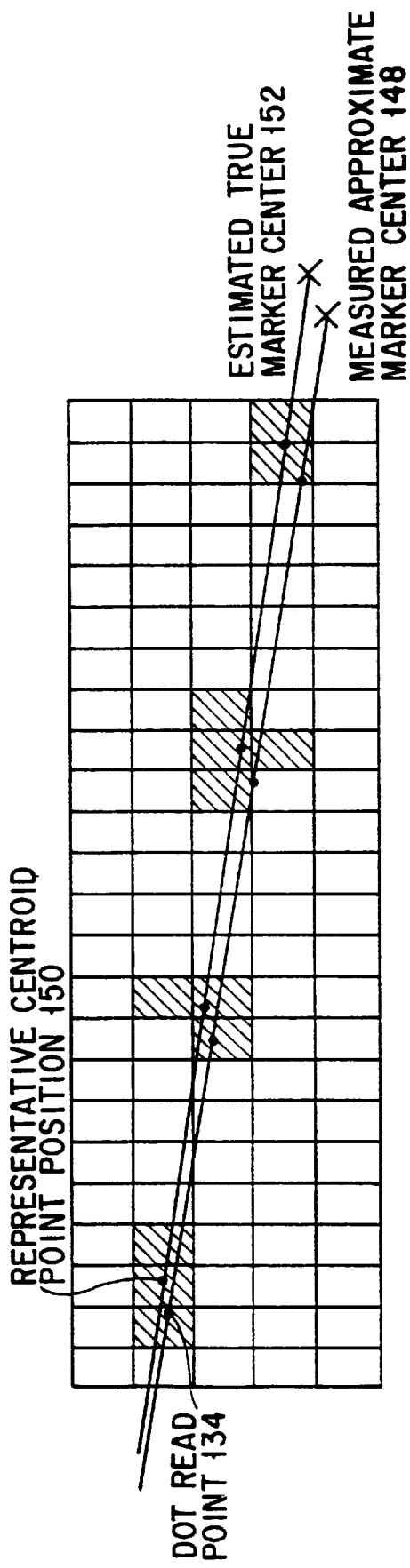
F I G. 72
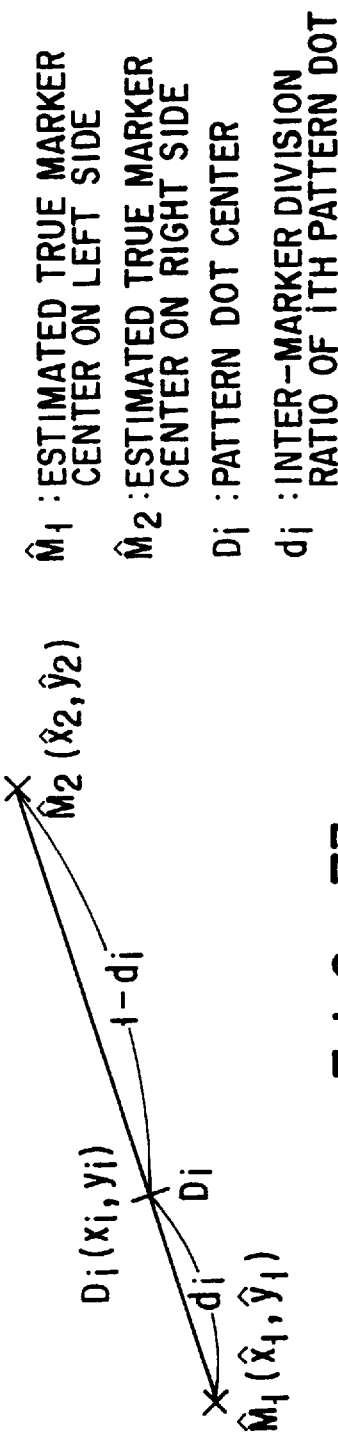
$\hat{M}_1$ : ESTIMATED TRUE MARKER CENTER ON LEFT SIDE
$\hat{M}_2$ : ESTIMATED TRUE MARKER CENTER ON RIGHT SIDE
$D_i$ : PATTERN DOT CENTER
$d_i$ : INTER-MARKER DIVISION RATIO OF ITH PATTERN DOT
F I G. 73

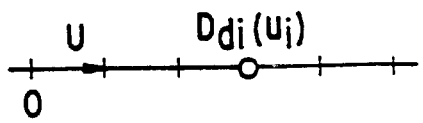
COORDINATE SYSTEM ON
RECORDING MEDIUM
$D_{di}(u_i)$ : DESIGN DOT POSITION
U : FIRST UNIT VECTOR
O : ORIGIN POSITION
F I G. 74A
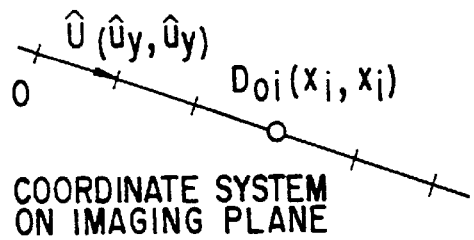
COORDINATE SYSTEM
ON IMAGING PLANE
$D_{oi}(x_i, y_i)$ : OBSERVED DOT POSITION
$\hat{U}(\hat{u}_x, \hat{u}_y)$ : FIRST ESTIMATED UNIT VECTOR
$\hat{O}(\hat{o}_x, \hat{o}_y)$ : ESTIMATED ORIGIN POSITION
$\hat{D}_{oi}(x_i, x_i)$ : ESTIMATED DOT POSITION
F I G. 74B
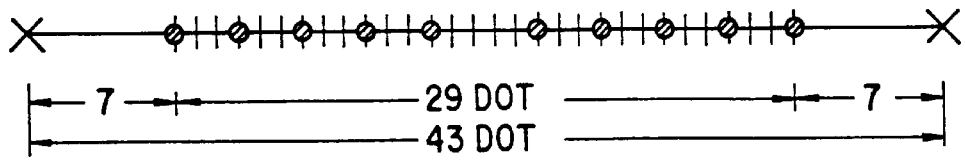
F I G. 75

INFORMATION RECORDING MEDIUM AND INFORMATION REPRODUCTION SYSTEM

This is a continuation of application Ser. No. 09/168,710 filed Oct. 8, 1998 which is a Divisional of application Ser. No. 08/571,776 filed Dec. 13, 1995 (now U.S. Pat. No. 5,866,895).

BACKGROUND OF THE INVENTION

1. Field of the Invention

The present invention relates to an information recording medium such as paper on which multimedia information including audio information of voice, music, etc., video information obtained from cameras, video equipment, etc., digital code data obtained from personal computers, wordprocessors, etc. is recorded as a two-dimensional code pattern which can be optically read, a two-dimensional code of the information recording medium, and an information reproduction system for optically reading the two-dimensional code pattern recorded on the information recording medium and reproducing the original multimedia information.

2. Description of the Related Art

Various recording mediums, such as magnetic tapes and optical disks, have been conventionally known as those for recording voice information, music information, etc. However, even though their reproductions are mass-produced, they increase in unit cost and require a very large space for keeping themselves. Furthermore, it takes time and trouble to transfer a recording medium on which voice information is recorded from one person to another far away therefrom, even though it is mailed or sent by hand. These problems are true of all the so-called multimedia information including video information obtained from cameras, video equipment, etc., digital code data obtained from personal computers, wordprocessors, etc., as well as audio information.

International Publication No. WO 94/08314 (corresponding to U.S. patent application Ser. No. 08/407,018) discloses a system capable of dealing with the above problems. According to this system, multimedia information containing at least one of audio information, video information and digital code data is recorded on an information recording medium, such as paper, in the form of a two-dimensional code formed by two-dimensionally arranging a plurality of dots, i.e., image information or encoded information which can be facsimiled and mass-produced at low cost, and it is reproduced therefrom.

In the system of the international publication, two-dimensional codes are optically read by holding an information reproduction apparatus and manually scanning the recording medium along the two-dimensional codes.

The structure of a two-dimensional code pattern is still being studied so as to improve in recording density. If higher density recording is achieved, the locations of respective dots of the two-dimensional code pattern have to be calculated with high precision. However, such high-precision calculation is not particularly taken into consideration by the above International Publication.

SUMMARY OF THE INVENTION

An object of the present invention is to provide an information recording medium, a two-dimensional code, an information reproduction system and an information reproduction method, each capable of accurately calculating the locations of respective dots of a code pattern recorded with high density.

According to one aspect of the present invention, there is provided an information recording medium on which a dot code is recorded, the dot code being constituted by a data code corresponding to contents of multimedia information to be reproduced, and a pattern code for determining a read reference point, wherein the pattern code includes: pattern dots arranged at predetermined positions with respect to the data code; and markers arranged at predetermined positions with respect to the pattern dots and used to detect the pattern dots.

According to another aspect of the present invention, there is provided an information reproduction system for optically reading and reproducing a dot code including a data code corresponding to contents of multimedia information to be reproduced from an information recording medium on which the dot code is recorded, the information reproduction system comprising: image input means for imaging the dot code; reconstruction means for reconstructing original data from an image picked up by the image input means; and data reproduction means for reproducing the data reconstructed by the reconstruction means, wherein the dot code recorded on the recording medium further includes a pattern code for determining a read reference point for the data code, and the reconstruction means includes: data read reference point determining means for recognizing the pattern code from the image picked up by the image input means and determining a data read reference point for reading the data code; and data reading means for reading the data code on the basis of the data read reference point determined by the data read reference point determining means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 12 is a view showing pattern dots;

FIG. 13 is a view for explaining modulation of pattern dots;

FIGS. 14 and 15 are views respectively showing other examples of pattern dots;

FIG. 18 is a view showing another example of pattern dots;

FIGS. 19A and 19B are views each showing an example of address dots;

FIGS. 20 and 21 are views showing other examples of how address dots are recorded;

FIG. 25 is a block diagram showing the arrangement of an information reproduction system of an embodiment of the present invention;

FIGS. 28A to 28C are views for explaining a method of extracting the central portion of a marker;

FIG. 31 is a view for explaining a case wherein processing of a frame is stopped in marker extraction processing;

FIGS. 32 and 33 are views for explaining a method of calculating approximate marker centers;

FIGS. 34A and 34B are views for explaining a method of correcting an approximate center when a marker is chipped upon crossing a frame end;

FIG. 35 is a view showing a table used in another case of such correction;

FIG. 38 is a block diagram showing the arrangement of a marker center detecting section in FIG. 25;

FIG. 46 is a view for explaining the approximate center of a virtual marker;

FIGS. 47A and 47B are views for explaining a method of re-selecting a base marker pair when two or more base marker pairs can be selected;

FIGS. 48 and 49 are views each for explaining a method of re-selecting a base marker pair when a code skews;

FIGS. 50A and 50B are views for explaining a set of markers selected when blocks are not aligned, and a method of storing them;

FIGS. 51A and 51B are views for explaining a set of markers selected when blocks are aligned, and a method of storing them;

FIGS. 61A and 61B are views each for explaining still another data read reference point estimation method;

FIGS. 62A and 62B are views for explaining a tree search method;

FIGS. 63A and 63B are views each for explaining limited tree search processing;

FIG. 64 is a view for explaining another arrangement of pattern dots;

FIG. 65 is a view for explaining an operation of a black dot detecting section;

FIG. 66 is a view for explaining another operation of the black dot detecting section;

FIG. 67 is a view for explaining the operation of an approximate marker center re-calculating section;

FIG. 69 is a view for explaining a centroid calculating operation as another center calculation method in the dot center calculating section;

FIGS. 70A to 70C are views for explaining another method of calculating the centroid;

FIGS. 72 and 73 are view for explaining method of calculating a data read reference point by using the least mean-square method;

FIG. 74A is a view showing a coordinate system on a recording medium;

FIG. 74B is a view showing a coordinate system on an image pickup plane;

FIG. 75 is a view showing the relationship between a marker pair and ten pattern dots;

DETAILED DESCRIPTION OF THE PREFERRED EMBODIMENTS

Embodiments of the present invention will be described below with reference to the accompanying drawings.

Figure 1:
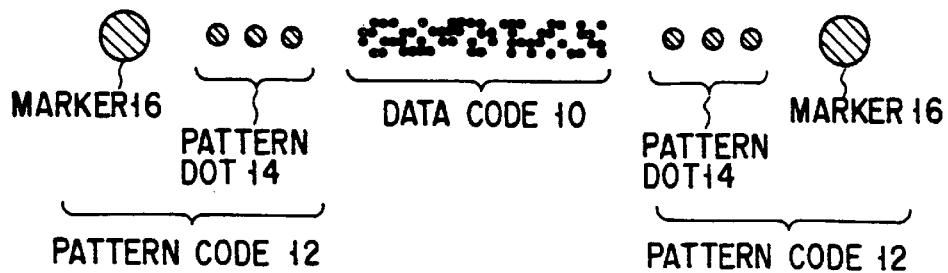
FIGS. 1 to 3 are views respectively showing two-dimensional codes (dot codes) recorded on information recording mediums to be optically read.
Figure 2:
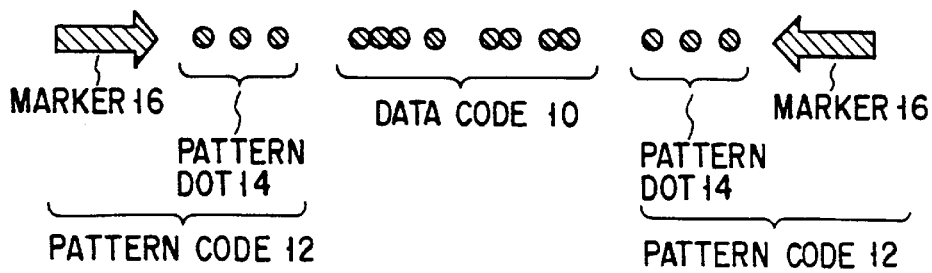
Figure 3:
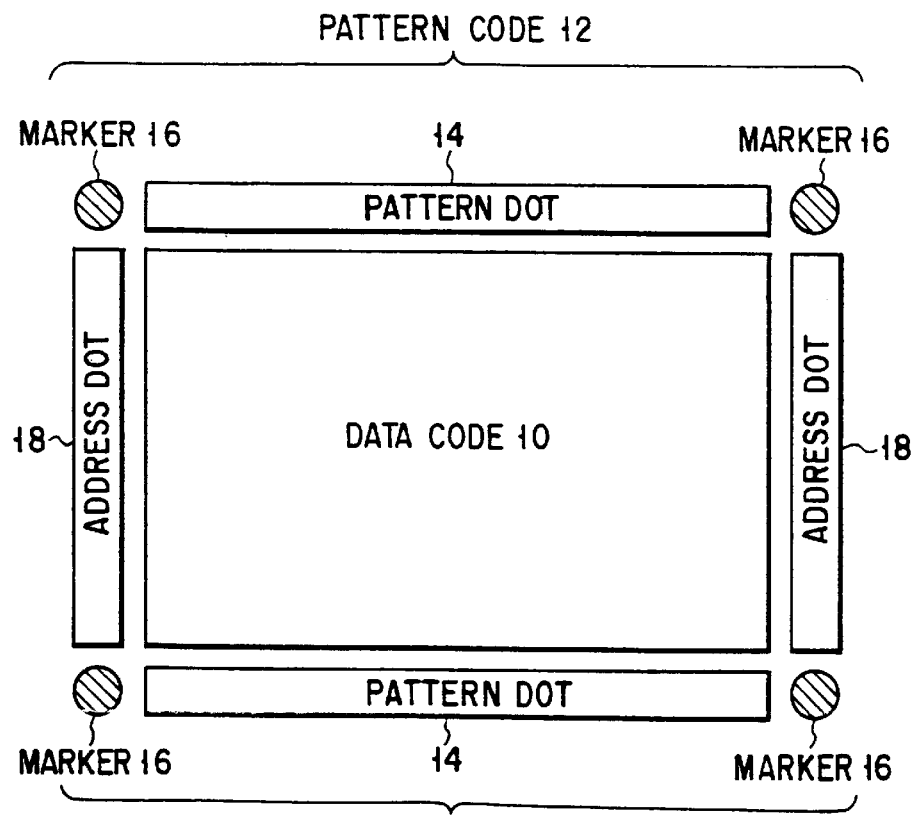

FIGS. 1 to 3 respectively show two-dimensional codes (dot codes) which are recorded on information recording mediums to be optically read.

More specifically, as shown in FIG. 1, a dot code consists of a data code 10 and a pattern code 12. The data code 10 represents contents corresponding to actual multimedia information. The pattern code 12 serves to determine a read reference point for the data code 10 and consists of pattern dots 14 and markers 16. In this case, the pattern dot 14 is one or each of a plurality of dots, other than a marker, which constitute the pattern code 12.

The dots (to be referred to as data dots hereinafter) constituting the data code 10 are recorded with a very high density (e.g., a density near the resolution limit of an image pickup device such as a CCD). For this reason, in order to properly reproduce the data code 10, each data dot must be accurately read. That is, a read position must be accurately detected. Under the circumstances, in order to accurately recognize the relative positional relationship between the pixels of the CCD and the data dots, the pattern dots 14 are used. The pattern dots 14 are placed at predetermined positions with respect to the data code 10, and have a predetermined dot pattern ("10101" in FIG. 1, with black and white dots respectively representing "1" and "0"). The pattern dot 14 is slightly larger than the data dot. Since these pattern dots 14 are difficult to find without any mark, the large marker 16 is placed at a predetermined position with respect to the pattern dots 14. In this case, the marker 16 is circular and has a diameter which satisfies the following relation: (marker 16)>(pattern dot 14)>(data dot).

As is apparent, each data dot 14 may be recorded as a dot having the same size and shape as those of the data dot, as shown in FIG. 2. In addition, a marker 16 may be recorded as a pattern having a special shape, color, or size different from that of each pattern dot 14 or each data dot. For example, a marker having an arrow shape may be recorded, as shown in FIG. 2.

Furthermore, as shown in FIG. 3, a data code 10 is arranged in a rectangular area, while pattern codes 12 are arranged on the upper and lower sides of the area, and address dots 18 are arranged on the right and left sides of the area, thereby forming a block. Such blocks may be arranged in the form of a matrix to form a two-dimensional code. In this case, the pattern dots 14 are recorded as 30 dots representing "100100100100100001001001001001" with black and white dots respectively representing "1" and "0". The address dots 18 consist of 22 dots, i.e., "1,**********##########0". The symbol "*" represents "1" or "0", and ten such symbols represent an address. The symbol "#" represents "1" or "0", and ten such symbols represent an error correction code.

According to an information recording medium on which dot codes, each consisting of the data code 10 corresponding to the contents of multimedia information to be reproduced, and the pattern codes 12 for determining a read reference point for the data code 10, are recorded, each pattern code 12 is constituted by the pattern dots 14 placed at predetermined positions with respect to the data code 10, and markers 16 placed at predetermined positions with respect to the pattern dots 14 and used to detect the pattern dots 14. With this arrangement, even if each pattern dot 14 is similar to each of the data dots constituting the data code 10, the pattern dots 14 can be detected on the basis of the markers 16. A read reference point can be accurately obtained from the detected pattern dots 14.

When a dot code is formed into a block as shown in FIG. 3, the above markers 16 need not be placed on the four corners of the block. For example, the markers 16 may be arranged in the manners shown in FIGS. 4 to 8.

Figure 4:
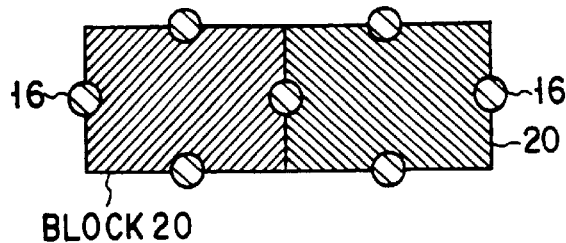
FIGS. 4 to 8 are views respectively showing the arrangements of markers in a case wherein a dot code is formed into a block as shown in FIG. 3.

FIG. 4 shows a case wherein the markers 16 are arranged on the respective sides of rectangular blocks 20.

Figure 5:
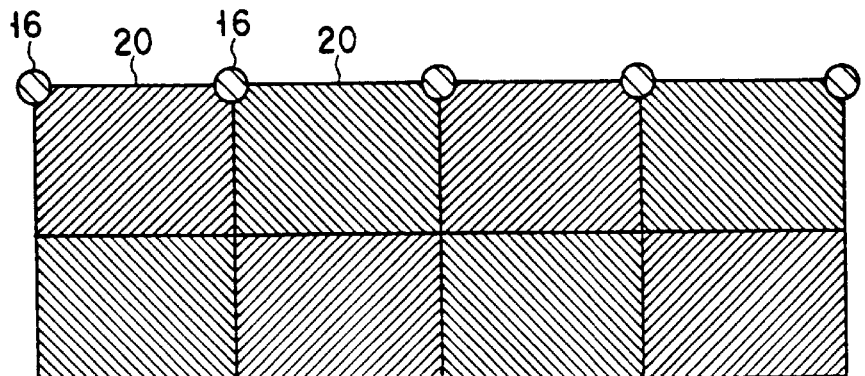

FIG. 5 shows a case wherein the markers 16 are arranged on only the uppermost row of blocks 20 aligned in rows.

Figure 6:
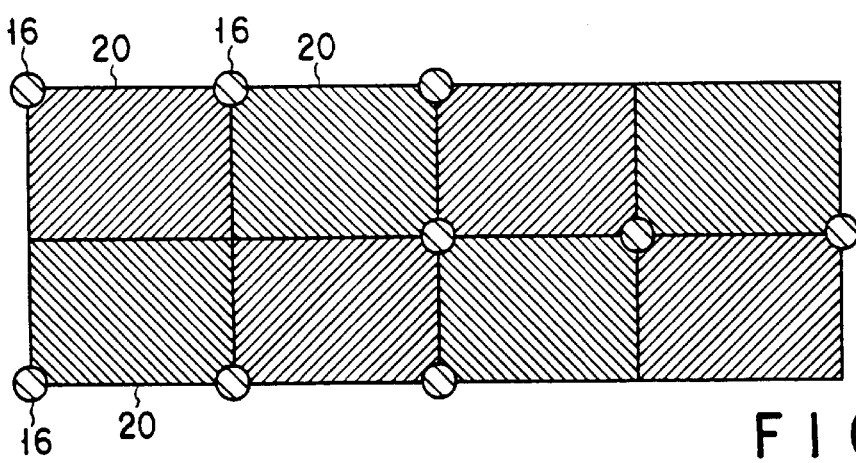

FIG. 6 shows a case wherein the markers 16 are recorded on blocks 20 aligned in rows while some markers are omitted.

Figure 7:
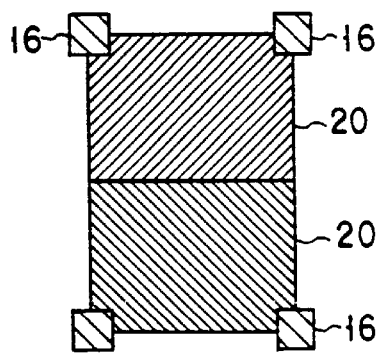

FIG. 7 shows a case wherein each marker 16 is recorded in the form of a square. As in this case, even if the markers 16 are not circular, various marker arrangements can be used, as shown in FIGS. 4 to 6.

The markers 16 are preferably circular for the following reason. When the markers 16 are circular, they are not distorted upon rotation (skew) of the dot code and an image pickup element (camera) such as a CCD. Even if, therefore, such skew occurs, the markers 16 can be easily extracted. If, however, skew falls within a certain range, e.g., an image pickup operation is to be performed while the relative relationship between the camera and the dot code is in a defined state, the markers 16 may take other shapes, e.g., rectangular and hexagonal shapes. With the use of such anisotropic shapes, when one marker 16 is detected, the skew angle, i.e., a specific inclination in a specific direction, can be obtained simply from the shape of the detected marker.

Figure 8:
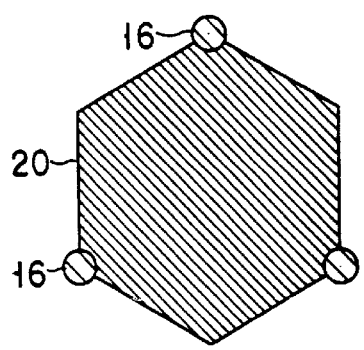

FIG. 8 shows a case wherein the markers 16 are arranged on three vertexes of a hexagonal block 20. As in this case, the shape of each block is not limited to a rectangular shape.

In this manner, a dot code is formed by two-dimensionally arranging a plurality of blocks, each having the data code 10 which consists of a plurality of dots and is arranged in a predetermined area, and the markers 16 are arranged at some portions of each block to clarify the relative positional relationship between the respective blocks. With these markers 16, therefore, the boundaries between the blocks can be easily extracted.

In addition, since the approximate center of each marker 16 can be obtained from a marker pair by extrapolation, the markers 16 need not be arranged on all the four corners of each block. As shown in FIGS. 5 and 6, therefore, some markers can be omitted. In this case, only a point or nothing is recorded at each position where a marker is omitted.

Figure 9:
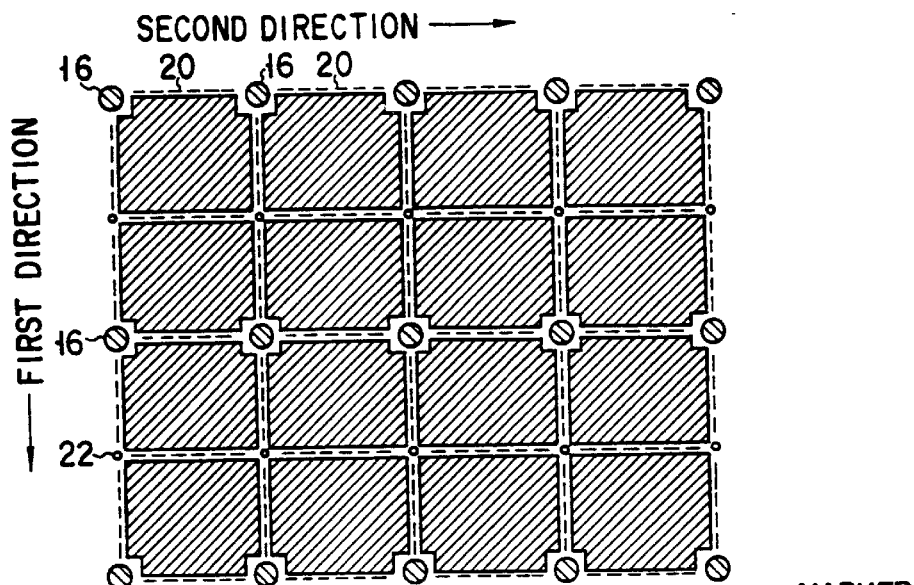
FIGS. 9 and 10 are views each showing a code from which markers are omitted in the form of a striped pattern.
Figure 10:
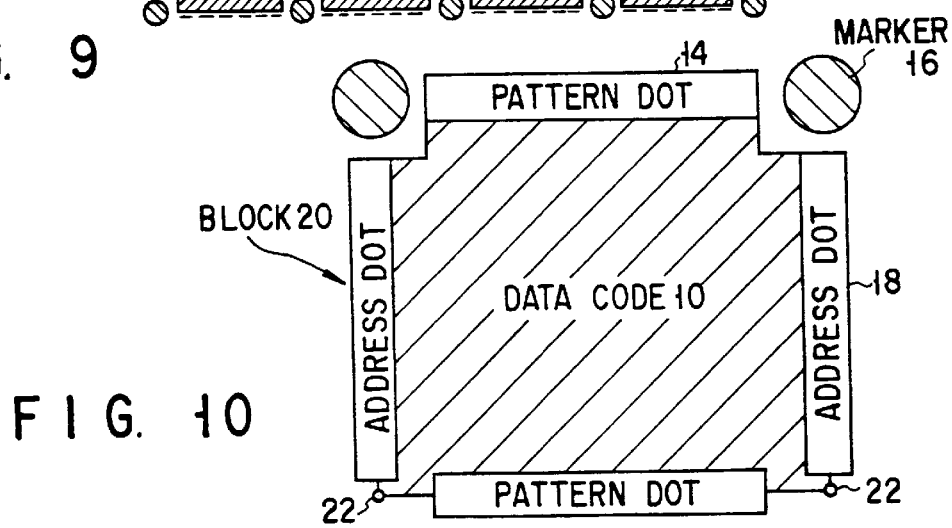

FIGS. 9 and 10 show a case wherein a point 22 is recorded at each position where a marker is omitted. In this case, markers 16 are arranged on the vertexes which define different opposite sides between adjacent blocks in the first direction, and which also define the same opposite sides between adjacent blocks in the second direction. Referring to FIGS. 9 and 10, when blocks are adjacent to each other in the horizontal direction, markers are recorded on the upper side. When blocks are adjacent downward, markers are recorded on the lower side. When blocks are further adjacent downward, markers are recorded on the upper side. In this manner, markers are alternately recorded. That is, the markers 16 are recorded (or omitted) in the form of a striped pattern.

As described above, the markers 16 are arranged on the vertexes which define different opposite sides between adjacent rectangular blocks in the first direction, which also define the same opposite sides between adjacent blocks in the second direction perpendicular to the first direction. That is, the markers 16 are arranged in the form of a striped pattern. With this arrangement, the number of markers 16, each requiring a large area, can be decreased to ½ that required when the markers 16 are arranged on the four corners of each block 20. Data dots can also be arranged at the marker positions where markers 16 are omitted, and the recording capacity can be increased accordingly.

Figure 11:
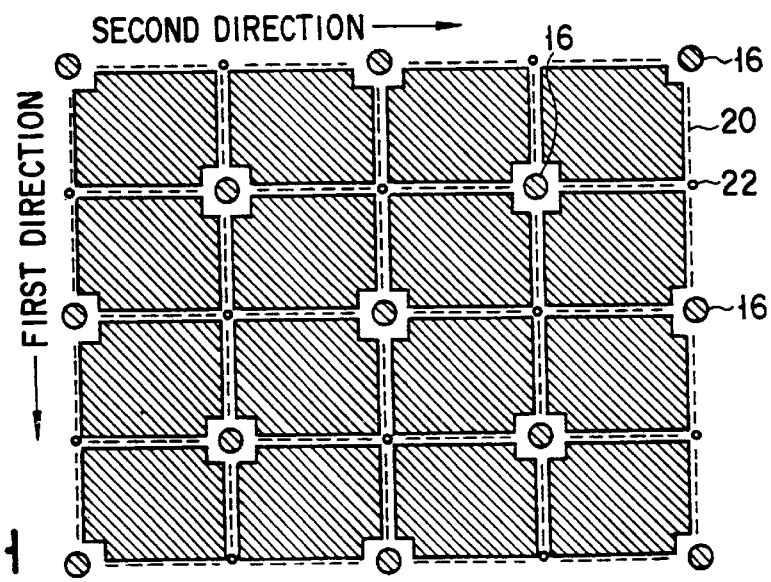
FIG. 11 is a view showing a code from which markers are omitted in the form of a checkered pattern.

FIG. 11 shows a case wherein markers 16 are arranged (or omitted) in the form of a checkered pattern.

If the markers 16 are arranged on vertexes of adjacent blocks which define different diagonals (i.e., in the form of a checkered pattern) in this manner, the number of markers which require large areas can be decreased to ½ that required when markers are arranged on the four corners of each rectangular block. Data dots can also be arranged at the positions where markers are omitted. The recording capacity can be increased accordingly. In addition, since at least one pair of makers 16 can be detected on one line, this arrangement is more resistant to distortion than the above arrangement in which the markers are arranged in the form of a striped pattern.

The pattern dots 14 will be described next.

As the pattern dots 14, for example, as shown in FIG. 12, adjacent black dots must be arranged to be separated from each other, like "10101010100101010101" with "1" and "0" respectively representing black and white dots. That is, the black dots need to be isolated from each other. As is apparent, black and white dots need not be alternately recorded as long as spaces are left between the respective black dots. Similarly, spaces are left between data dots and pattern dots such that black dots are isolated from each other.

Such an arrangement is required for the following reason. If, for example, two of the black dots constituting the pattern dots 14 are arranged to be adjacent to each other, the two black dots are detected as one black dot in read reference point determination processing (to be described in detail later) based on the pattern dots 14. This will cause an error. That is, in the read reference point determination processing, the central coordinates of each black dot of the pattern dots 14 are obtained to determine a read reference point. For this reason, the central point position of each dot of the pattern dots 14 must be obtained. If, therefore, two black dots are adjacent to each other, the correct center position of each dot cannot be obtained.

As described above, as the format of pattern dots, an arrangement in which adjacent dots can be isolated from each other is used. With this format, the center of each dot of the pattern dots 14 can be accurately obtained by a relatively easy calculation such as a calculation for a center of gravity or the center of a circumscribed rectangle. In addition, even if information (address information or header information) is recorded on a pattern code, black dots can be prevented from being coupled and inseparable.

In addition, some modulation may be performed in dot recording to prevent the occurrence of an array of "11" or the like. With such modulation, even if dots are recorded at adjacent positions, data such as address information or header information can be superposed/recorded on the pattern dots 14.

For example, 4-bit/6-bit modulation may be performed, as shown in FIG. 13. In this case, an input signal 0 (i.e., "0000") is not converted into 0 (i.e., "000000") but is converted into 36 (i.e., "100100"). This is because pattern dots cannot be regarded meaningful unless they have at least one black dot.

As described above, when a dot code is recorded as a code which is modulated such that adjacent dots can be separated from each other, black dots can be prevented from being coupled and inseparable even if information (address information or header information) is recorded on a pattern code.

Although various other formats for the pattern dots 14 are conceivable, the pattern dots need to constitute a special code having a positional relationship or structure which allows estimation of the position of a read reference point. With the use of such a special code, a read reference point can be easily estimated.

For example, as shown in FIG. 14, a linear pattern dot 14, i.e., a pattern line, may be used. As a linear detection algorithm, a method (e.g., a linear detection algorithm, e.g., Hough transformation) of obtaining straight lines by representing each straight line with parameters $\theta$ and $\rho$ and performing a counting operation on the $\theta$-$\rho$ plane, which method is known well in the field of image processing, can be used. The intersection between straight lines extracted by straight lines extracted by this method can be used as a read reference point.

Alternatively, as shown in FIG. 15, phase offsets may be given to the recording points of at least some of pattern dots 14. With such phase offsets, the detection condition for the pattern dots 14 is made stricter, and hence the read reference point estimation precision can be improved.

The recording positions of pattern dots 14 and the dots of a data code 10 are generally arranged almost in the form of a matrix. In this case, however, the pattern dots 14 are slightly offset from the matrix points. These offsets will be called phase offsets.

Figure 16:
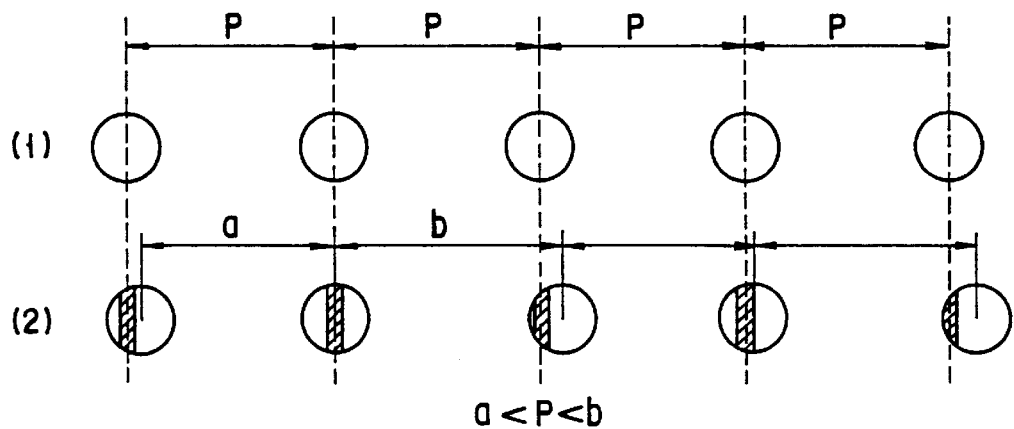
FIGS. 16 and 17 are views each showing a case wherein phase offsets are given to the recording points for some pattern dots.

For example, referring to FIG. 16, "(1)" indicates an equal pitch array, which allows detection of the dots at any point of the dots, and "(2)" indicates an unequal pitch array. If the dots in the latter array are read at the equal pitch points, the dots cannot be read unless the read points are in the hatched portions in FIG. 16. For this reason, the read reference point existing range in which all dots can be detected is narrower than that set when no phase offsets are set, and hence the read reference point estimation precision can be improved.

By setting phase offsets in this manner, the offset of a read reference point position can be estimated from the position or deviation of a non-detected dot.

Assume that phase offsets are set, and a given dot cannot be detected but the remaining dots can be detected. In this case, the phase offset of the non-detected dot can be known from format information set in advance. The offset direction of the read reference point position can be estimated from the phase offset.

Figure 17:
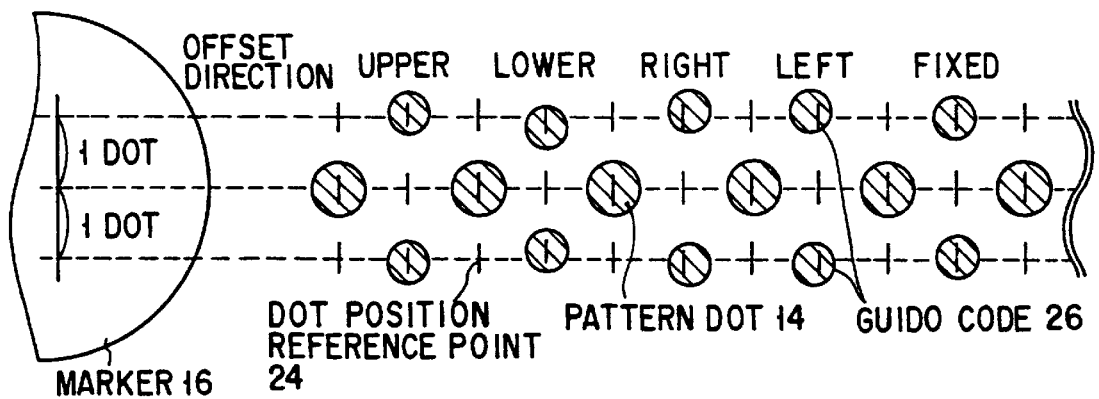

As shown in FIG. 17, a pattern code 12 may be designed such that pattern dots 14 for detecting a read reference point for a data code 10 are arranged between markers 16, and guide codes 26 to which vertical and horizontal phase offsets with respect to dot position reference points 24 are given and which are smaller in size than the pattern dots 14 are arranged.

With the use of this pattern code 12, after the pattern dots 14 are read, points shifted upward and downward from the center of the marker 16 by one dot are connected to each other, and the center position is moved near each guide code 26 to read it. With this operation, the read reference point (the marker center position in this case) estimation precision can be improved, owing to the strict read condition for the guide codes 26, without making the read condition for the pattern dots 14 strict.

As described above, when at least some pattern dots are recorded with their diameter being smaller than that of the remaining pattern dots, more pattern dots can be recorded in the same space, thereby increasing the recording density of pattern dots. By making the pattern dot detection condition stricter, the read reference point estimation precision can be improved.

In addition, as shown in FIGS. 15 and 18, some dots 14B near the center of the pattern dots 14 may be recorded to have a diameter larger than that of the remaining pattern dots.

In detecting pattern dots 14 on a line connecting the approximate centers of a marker pair (to be described later), if the dots 14B near the center, which are most difficult to detect, are recorded in advance to have a large size, the pattern dots 14 will not be missed. In addition, the dots 14B near the center may be detected first, and the remaining dots can be coarsely detected.

The address dots 18 will be described next.

For example, as shown in FIGS. 19A and 19B, the address dots 18 are arranged between markers 16 in a direction perpendicular to pattern dots 14 to indicate the address of a corresponding block 20.

With such address dots 18, even if blocks are not read orderly, proper reproduction can be performed by rearranging the read blocks in the address order indicated by the address dots 18.

If inverted codes 28 obtained by inverting the address dots 18 are recorded on both sides of the address dots 18 as shown in FIG. 20, error correction and read position correction can be performed by using these codes.

If correction codes 30 for error correction are arranged on both sides of address dots 18 as shown in FIG. 21, address error correction can also be performed. That is, address error correction can be performed by reading the correction codes 30 in addition to the address dots 18.

Figure 22:
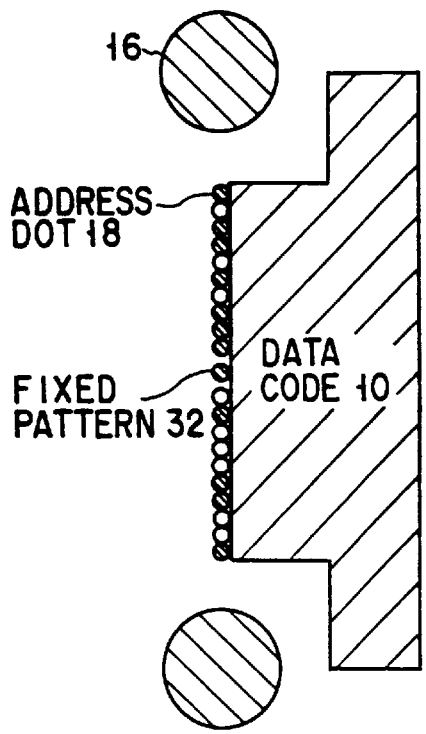
FIGS. 22 to 24 are views showing still other examples of how address dots are recorded.

A fixed pattern 32 as a black pattern, i.e., "1", may be placed at a position in address dots 18, e.g., in the middle thereof, as shown in FIG. 22, no matter what the address is. With this arrangement, a positional offset or an error can be detected by reading the black dot of the fixed pattern 32.

Figure 23:
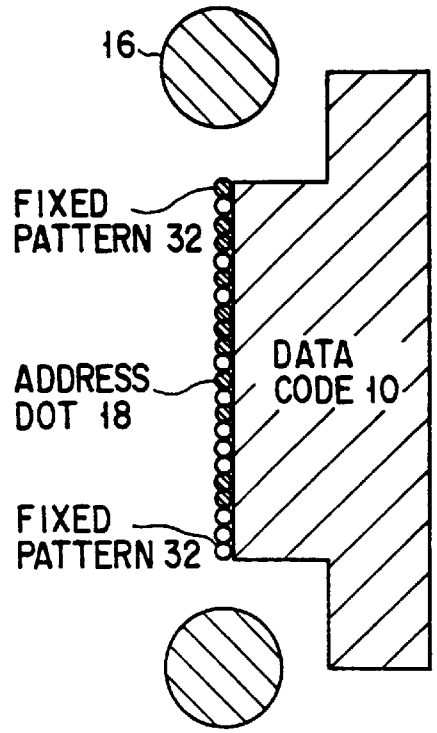

Alternatively, as shown in FIG. 23, fixed patterns 32 may be placed at both ends of address dots 18. In this case, if black and white dots as the fixed patterns 32 are placed at one end and the other end of the address dots 18, respectively, the read direction of the address dots 18 can be specified. Even if, therefore, this dot code is read upside-down, the address can be accurately read.

As described above, if the fixed pattern 32 is included at least a position in the address dots 18, positioning and error detection can be performed by using the fixed pattern 32. Alternatively, the read direction of the address dots 18 can be specified.

If blocks 20 are aligned and recorded in the address order, the address of a given block can be easily estimated from the addresses of neighboring blocks. Address dots 18 can therefore be omitted as needed.

Figure 24:
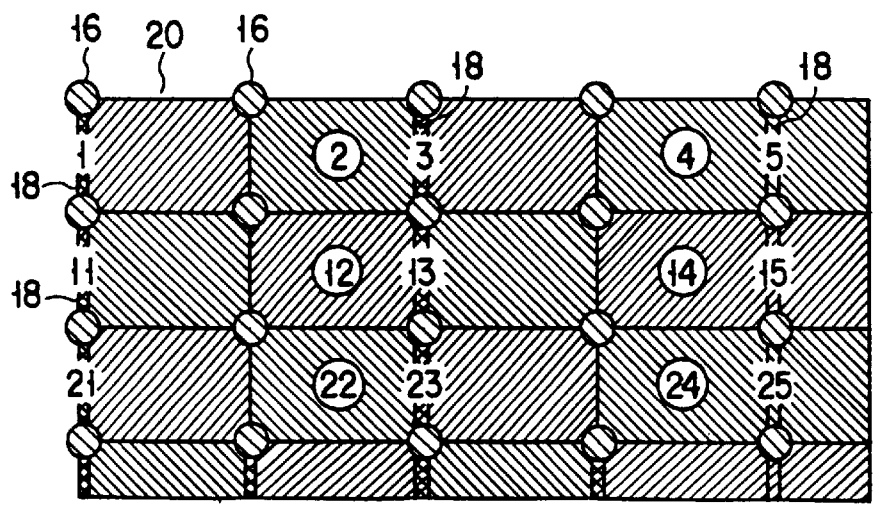

Assume that blocks 20 are aligned, and addresses are orderly assigned thereto, as shown in FIG. 24. In this case, if the addresses of the first and third blocks can be detected, it can be easily estimated that the address of the block between them is that of the second block. For this reason, the address of the second block need not be recorded, and a data code 10 can be recorded on the corresponding portion, thereby increasing the recording capacity.

If the address relationship between adjacent blocks is set to be, e.g., "+10" in advance, the block addresses need not be arranged orderly, unlike the case shown in FIG. 24.

As described above, the address dots 18 are properly omitted and recorded such that the addresses of at least two blocks can be determined at once by each set of address dots, data codes 10 can be recorded in the omitted portions. The recording capacity can therefore be increased accordingly.

An information reproduction system for optically reading dot codes like those described above and reproducing the original multimedia information will be described next.

FIG. 25 shows the arrangement of this system.

A dot code 36 recorded on an information recording medium 34 such as paper is imaged by an image input section 38. A data read reference point determining section 40 determines a read reference point for reading a data code 10 on the basis of the image picked up by the image input section 38. A data reading section 42 reads the data code 10 from the image obtained by the image input section 38 on the basis of the read reference point determined by the data read reference point determining section 40. A data reproduction section 44 reproduces the data read by the data reading section 42.

With this arrangement, dot codes can be read quickly and accurately.

Note that the data reproduction section 44 also reproduces the read data upon demodulation and error correction, as needed. In this case, to reproduce data is to output video data to a monitor if the data is image data, and is to output audio data to a loudspeaker if the data is audio data. If the data is a compressed signal, the data reproduction section 44 outputs the signal after performing decoding processing. If, for example, a Reed-Solomon triple product code is used for error correction, since the data has undergone 8–10 modulation, the data reproduction section 44 performs 10–8 modulation (8–10 inversion).

The image input section 38 includes an image pickup section 46 such as a CCD camera, and an equalizing/binarizing section 48 for equalizing and binarizing an output image from the image pickup section 46. More specifically, in the image input section 38, the image obtained by imaging the dot code 36 is binarized. In the data read reference point determining section 40 and the subsequent sections, only the binarized data is processed. With this arrangement, a memory (not shown) for holding the image can be reduced, and the data transfer amount can also be reduced, thereby allowing high-speed processing.

With the use of such binarized data, the data read reference point determining section 40 and the subsequent sections can be constituted by an information processing apparatus such as a personal computer. Furthermore, in this case, since a small housing can be used to stored only the image input section 38, the load of the operator in performing a scanning operation can be reduced.

The data read reference point determining section 40 may be designed to detect the middle point of the pattern dots 14 as a read reference point. In this embodiment, however, the center position of each marker 16 is determined as a read reference point.

More specifically, the data read reference point determining section 40 comprises a marker detecting section 54 constituted by a marker extracting section 50 for detecting the marker existing area where the marker 16 exists from the image data binarized by the equalizing/binarizing section 48 and an approximate marker center calculating section 52 for obtaining the approximate center of the marker 16 in the detected marker existing area, and a marker center detecting section 56 for detecting the pattern dots 14 by using the approximate center of the marker 16, which is obtained by the marker detecting section 54, and estimating the true central coordinates of the marker 16 as a read reference point for the data code 10 and the address dots 18 on the basis of the detected pattern dots 14.

The marker extracting section 50 of the marker detecting section 54 detects a marker existing area by performing erosion processing and labeling processing.

Figure 26A:
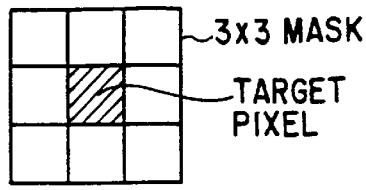
FIGS. 26A to 26D are views for explaining erosion processing.
Figure 26C:
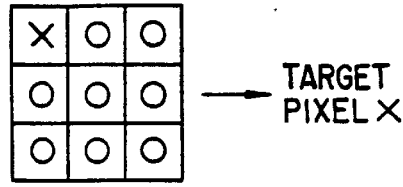
Figure 26B:
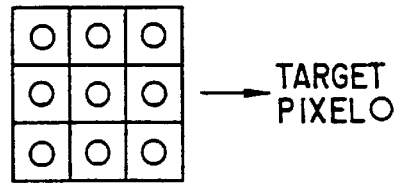
Figure 26D:
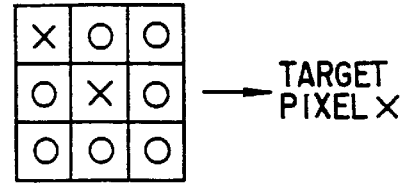

This erosion processing is known in the field of image processing. There are various types of hardware for executing this processing. In the erosion processing, a mask having a predetermined size, e.g., a mask of 3×3 pixels like the one shown in FIG. 26A, is applied to a target pixel. If all the pixels in the mask are black pixels (indicated by "o") is shown in FIG. 26B, the target pixel is converted into a black pixel. If at least-one pixel in the mask is a white pixel (indicated by "x") as shown in FIG. 26C or 26D, the target pixel is converted into a white pixel.

Figure 27:
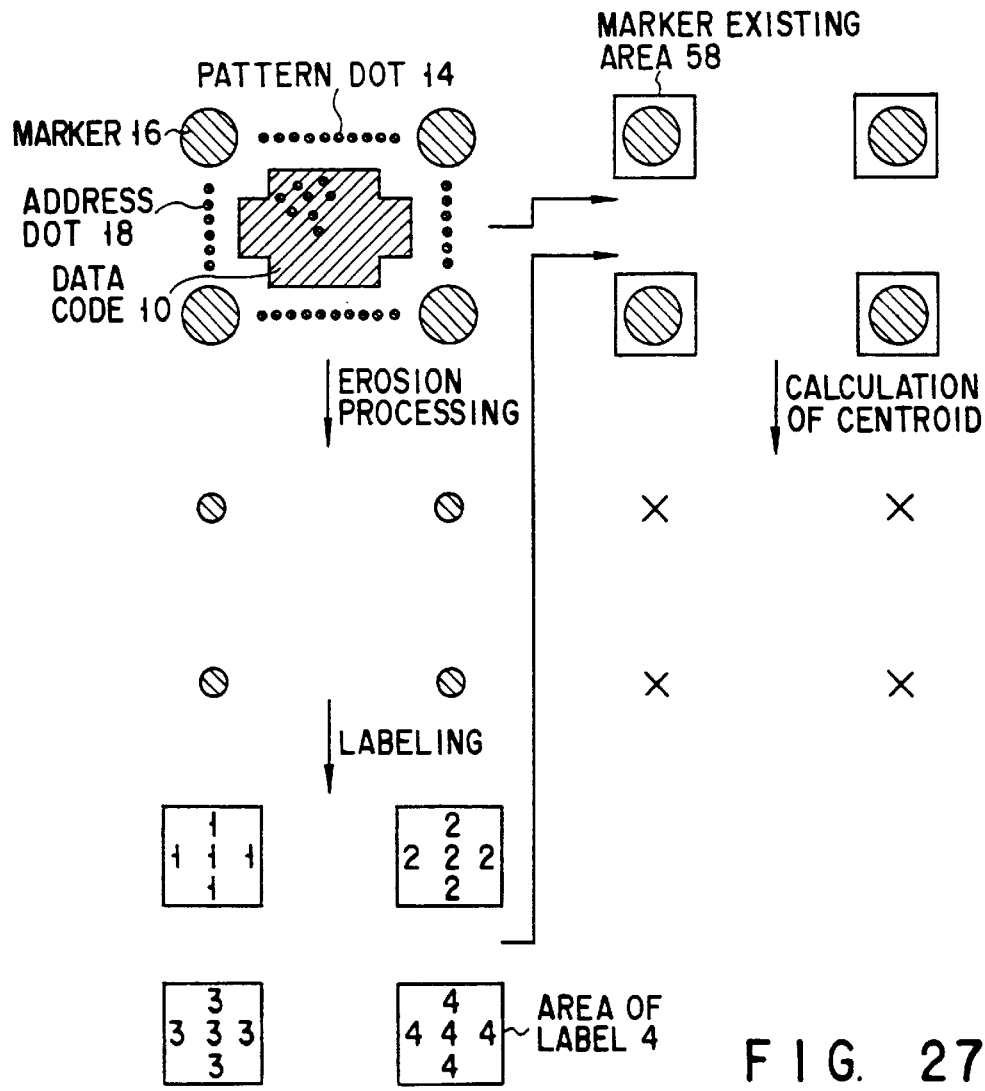
FIG. 27 is a view for explaining erosion processing and labeling processing.

When such erosion processing is performed for the dot code 36, the data code 10, the pattern dots 14, and the address dots 18, which are constituted by small dots, disappear, as shown in FIG. 27, and only the pixels corresponding to the markers 16 which are much larger than these dots can be left.

The left pixels are sequentially labeled in units of groups, and existing areas, each having identical levels, are obtained. In each area, a portion having undergone degeneracy upon erosion is expanded to obtain a marker existing area 58.

The approximate marker center calculating section 52 calculates the centroid of the black pixels in each marker existing area 58 as an approximate marker center, and sets it as a reference point used to read the pattern dots 14.

By performing erosion processing and labeling processing in this manner, the marker 16 can be easily detected by using existing hardware, and the influence of noise near the marker 16 can be suppressed.

The marker extracting section 50 can also obtain the marker existing area 58 without performing processing which requires calculation, such as the above erosion processing and streak processing known in the field of image processing.

Consider a frame image like the one shown in FIG. 28A. Since this image is picked up as in the presence of an LPF because of the characteristics of an optical system (not shown) in the image pickup section 46, a low black level is detected at a portion on which black pixels are concentrated, like the marker 16, as shown in FIG. 28B. The minimum luminance value is obtained while an area, of a frame 60, which includes at least one marker is scanned. The obtained value is then offset (by about 15 to 20). The resultant value is then used as a threshold th to binarize the frame image. As a result, a marker central portion 62 can be easily extracted, as shown in FIG. 28C.

Since the marker 16 is large, when the marker is imaged, the luminance value of the central portion becomes considerably small. In contrast to this, an image of a dot of the data code 10 or the pattern dot 14 is slightly blurred by the optical system. For this reason, white information around the dot is superposed and becomes slightly light. As a result, a luminance profile like the one shown in FIG. 28B is obtained, and hence only the central portion of the marker 16 can be extracted by performing binarization with the predetermined threshold th.

As described above, if the minimum luminance value of at least a portion of the frame 60 is obtained, and binarization is performed by using a threshold obtained by giving a predetermined offset to the obtained minimum value, the marker central portion 62 can be detected without requiring calculation such as erosion or streak processing.

In this case, if such processing performed after the data is filtered by a low-pass filter, detection of the marker central portion 62 can be facilitated. More specifically, if a frame image like the one shown in FIG. 28A is filtered by a low-pass filter, small dots such as data dots are blurred and become vague, and only the central portion of the marker 16 is left.

By using the low-pass filter in this manner, the marker central portion 62 can be detected more reliably when the marker 16 is recorded with a dot larger than other dots such as the data dots of the data code 10 and the pattern dots 14.

In addition, a center calculation range may be obtained by streak processing as a known technique in the field of image processing and the number of adjacent streaks.

Figure 29:
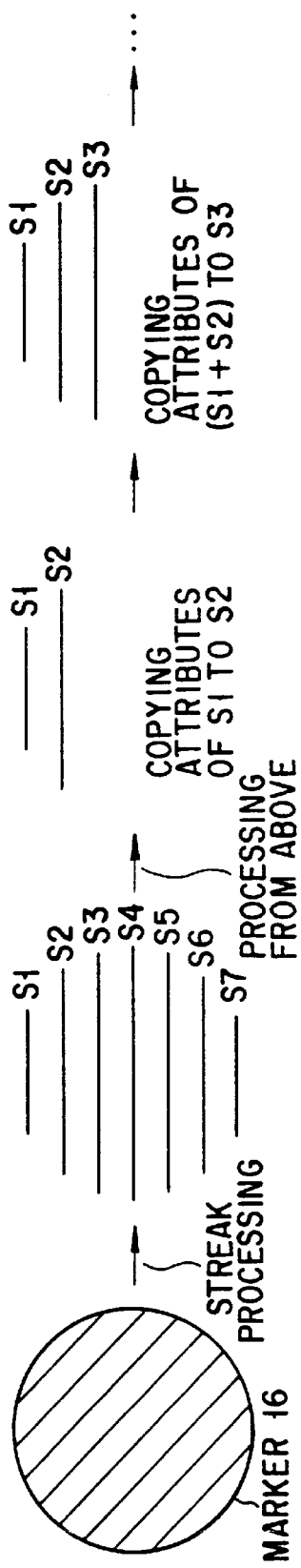
FIG. 29 is a view for explaining streak processing.

More specifically, as shown in FIG. 29, streak processing (obtaining the numbers of pixels of black runs, i.e., the numbers of consecutive black pixels, and the start points) is performed in units of frames, and the adjacent streaks (streaks S1 to S7 in FIG. 29) are grouped. The grouped streaks copy their attribute data to each other. In this case, the attribute data includes the coordinates of the upper, left, and right ends of a given streak and adjacent streaks, and the number of adjacent streaks. When no streak is present downward, the range in the direction of height is obtained from the number of the preceding streaks.

When a frame image is decomposed into data representing the start points of black pixels and lengths therefrom, since small dots such as data dots take only short streak data, only streaks which are adjacent to each other and constitute a mass of a certain size can be determined as the marker 16.

Adjacent streaks are therefore grouped, and the attribute data, i.e., the start point and the length (end point), of each streak is copied to a lower streak in this group of streaks. Note that the lower streak of adjacent streaks copies the attribute data of the upper streak, i.e., the start and end points of the upper streak. In this manner, each streak copies left, right, upper and lower end data.

For example, the small streak S1 at the uppermost position copies only its uppermost data, i.e., the upper side, to the lower streak S2, and the lower streak S2 has left and right end data. When processing is completed up to the streak S7 at the lowermost position, the left and right end data of the longest streak S4 and the attribute data of the uppermost and lowermost streaks S1 and S7 are recorded on the lowermost streak S7. The area where the marker 16 exists can be obtained from this attribute data.

If a center calculation range is obtained by streak processing and the number of adjacent streaks in this manner, processing requiring a large calculation amount like erosion processing need not be performed. The processing can therefore be facilitated. In addition, an increase in resistance to spot-like flaws in the marker 16 can be attained.

Furthermore, all markers can be extracted without performing the above marker extraction processing for all the data in a frame.

Figure 30:
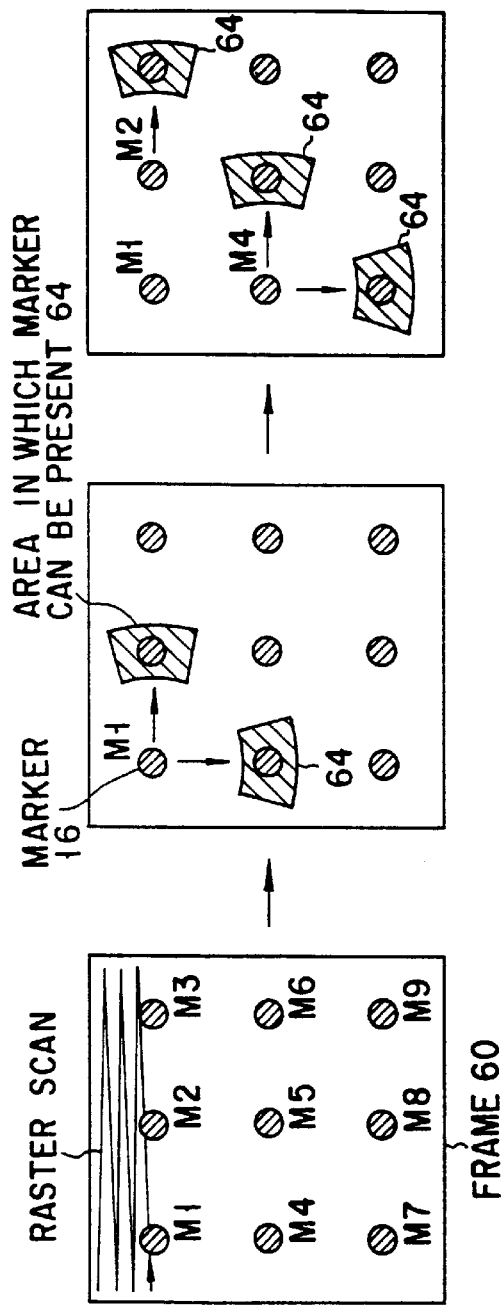
FIG. 30 is a view for explaining another method of performing marker extraction processing.

Assume that nine markers (M1 to M9) are present in a frame 60, as shown in FIG. 30. In this case, the frame image is raster-scanned, and the marker 16 is detected by one of the marker extraction processes described above. Assume that the marker M1 is detected in this manner. If the markers M2 and M4 which are relatively adjacent to the marker M1 have preset information indicating specific distances from the marker M1, fine raster scanning need not be performed from the marker M1 to search for the next markers M2 and M4. Instead, the scanning position can jump to an area 64 where a marker may be present, which area is determined in accordance with the preset information in consideration of the possibility of skew. That is, a search for the marker 16 only needs to be made within the area 64. When the markers M2 and M4 are detected, searches for the markers 16 may be sequentially performed from the areas 64.

As described above, at least one marker is detected, and searches for the remaining markers are made in only the areas 64 where the markers may be present, which areas are determined on the basis of the detected marker. With this operation, calculation for marker extraction need not be performed for the entire frame, and hence the processing speed can be increased. If there is a speck of black dust between the markers 16, such dust is extracted as a candidate for the marker 16 by the above erosion processing or the like. However, if searches of the markers are made in only the areas 64 where the markers may be present, such dust is not extracted as a marker candidate.

In the above marker extraction processing, if only three markers are detected in a frame 60 as shown in, e.g., FIG. 31, since it is apparent that a set of markers (markers on the four corners of a block in this case) constituting a block cannot be obtained, the processing for this frame may be stopped.

More specifically, if it is determined after erosion or streak processing that only three labels are assigned to a dot code which should have marker 16 arranged on the four corners, it is known that there are only three markers. If, therefore, the number of markers detected in a frame in this manner is smaller than that required to form a block, unnecessary processing can be omitted by stopping the processing for the frame.

As shown in FIG. 32, the approximate marker center calculating section 52 calculates a centroid 66 of all the black pixels in the marker existing area 58. This centroid 66 is set as an approximate marker center used as reference coordinates for detection of the pattern dots 14.

By setting the centroid of all the black pixels in the marker existing area 58 as an approximate marker center, the dot code can be made resistant to blooming noise, smearing noise, and glitch noise.

Alternatively, for example, as shown in FIG. 33, the approximate marker center calculating section 52 may obtain a circumscribed rectangle 68 of the marker 16, and calculate a central point 70. This point may be used as an approximate marker center. With this operation, the calculation amount can be made smaller than that required when the centroid is calculated in the above manner.

For example, if the marker 16 crosses a frame end 72 and is partly omitted as shown in FIG. 34A, the approximate marker center calculating section 52 obtains an approximate center 74 of the remaining portion in the frame 60 which is indicated by hatching. If the approximate center 74 calculated in this manner is offset from an actual correct approximate marker center 76, the pattern dots 14 may not be properly detected when the dots are detected by the marker center detecting section 56 with reference to this point. That is, if the marker 16 crosses the frame end 72, a portion of the marker 16 is omitted. As a result, the detected approximate marker center position may be offset from the correct center. In this case, each dot of the pattern dots 14 cannot be properly detected, and hence the maker center position detection precision deteriorates.

In the approximate marker center calculating section 52, the partial omission of the marker 16 is preferably estimated on the basis of the distance from this calculated approximate central position to the frame end 72. If there is a partial omission, an offset amount k is preferably calculated to perform processing of correcting the approximate marker central position to the correct approximate marker center 76.

In this case, whether the marker 16 is omitted can be determined depending on whether the calculated approximate center position is in an approximate center correction area 78, as shown in FIG. 34B.

The width of this approximate center correction area 78 at the left or right end of the frame is set such that a distance d the frame end 72 to the correct approximate marker center 76 is smaller than a half a of the horizontal size of the marker 16 (i.e., d<a). The height of the approximate center correction area 78 at the upper or lower end of the frame is set such that the distance d from the frame end 72 to the correct approximate marker center 76 is smaller than a half b of the vertical size of the marker 16 (i.e., d<b).

The offset amount δ of the approximate center is given by the following equations:
(when the marker 16 protrudes from the right or left end of the frame)

$$\delta = \frac{4(a^2 - d^2)^{\frac{3}{2}}}{3\left\{a^2\pi + 2a^2\sin^{-1}\left(\frac{d}{a}\right) + 2d\sqrt{a^2 - d^2}\right\}}$$

(when the marker 16 protrudes from the upper or lower end of the frame)

$$\delta = \frac{4(b^2 - d^2)^{\frac{3}{2}}}{3\left\{b^2\pi 2b^2\sin^{-1}\left(\frac{d}{b}\right) + 2d\sqrt{b^2 - d^2}\right\}}$$

Each pixel of the CCD of the image pickup section 46 is not square, and the vertical and horizontal pixel pitches of the CCD are different from each other. As shown in FIGS. 34A and 34B, an image obtained by imaging the circular marker 16 therefore becomes elliptic. For this reason, the different equations are used to calculate the offset amounts δ when the marker 16 protrudes from the right or left end of the frame and the upper or lower end of the frame, respectively.

As described above, by correcting the approximate center position of a marker which may be chipped, the approximate center position of a marker which crosses the frame end can be obtained as a position of the marker which is not chipped. For this reason, a pattern dot can be detected more reliably.

In addition, instead of sequentially calculating the above offset amount δ, i.e., the correction amount, these equations may be stored in the form of a table which indicates the relationship between the distance from the frame end to the detected approximate center and the correction amount.

For example, as shown in FIG. 35, the approximate marker center calculating section 52 has a table indicating the relationship between the distance from a frame end to a detected approximate center and the distance from the frame end to a corrected approximate center. Note that these tables indicate a case wherein the marker 16 has a diameter corresponding to seven dots, and one dot in an image pickup operation has a size of 3.47 pixels (horizontal)×2.70 pixels (vertical).

As described above, with the use of a table for outputting a predetermined correction amount in accordance with the distance from a frame end, calculation for a correction amount need not be performed.

The above approximate center position correction processing need not be performed for all the markers in a frame but may be performed for only the markers associated with the blocks 20 from which data dots are actually read.

Figure 36:
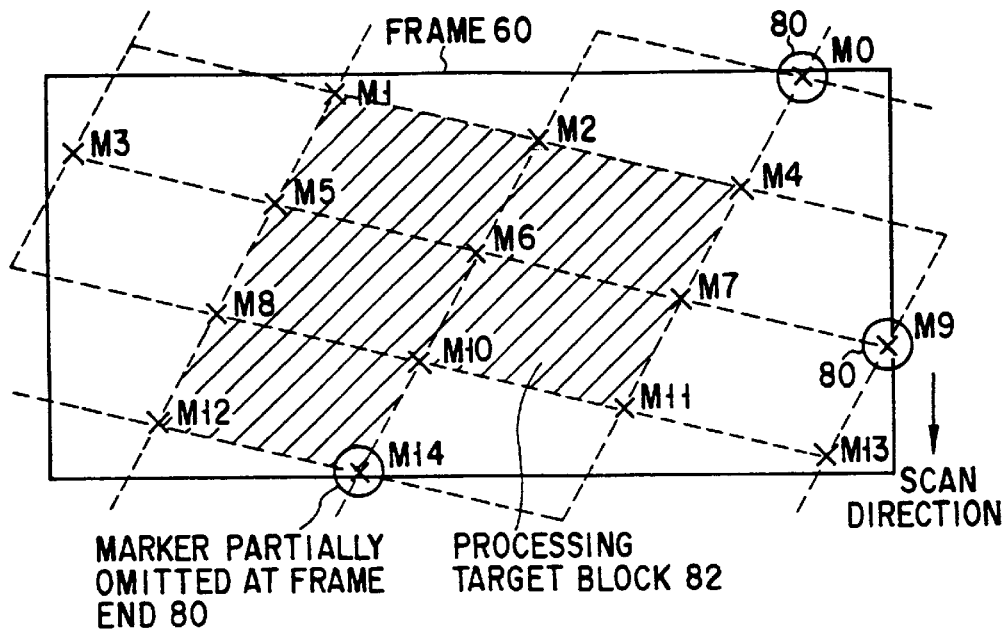
FIG. 36 is a view for explaining a marker in a frame which is subjected to approximate center position correction processing.

For example, referring to FIG. 36, when approximate marker centers M0 to M14 of the markers indicated by "x" in the frame 60 are calculated, markers requiring approximate center position correction, i.e., markers 80 from which portions are omitted at frame ends, are markers M0, M9, and M14.

However, blocks to be actually read, i.e., processing target blocks 82, are five blocks, each having markers on the four corners, indicated by half-tone dots, are five blocks (note that a detailed description of a block having markers M7, M9, M11, and M13 arranged on the four corners will be omitted for the reason to be described later). For this reason, when it is determined that a given marker of the markers constituting the five blocks crosses a frame end and is chipped, correction is performed for only the given marker but is not performed for the remaining markers. That is, in the case shown in FIG. 36, of the markers 80 which are chipped at frame ends, only the marker M14 is associated with the processing target block 82. The above approximate center position correction processing is therefore executed for only the marker M14 (in this case, each of the markers M0 and M9 cannot be one of four markers constituting a block and hence will be excluded from a processing target).

As described above, correction is selectively performed for only a marker as a processing target. That is, instead of detecting markers requiring approximate center position correction from the entire frame and correcting them, this processing is performed for only markers associated with a block to be read. The calculation amount is therefore reduced.

The block having the markers M7, M9, M13, and M11 arranged on the four corners is excluded for the following reason. In the case of a code recorded with a double height like the one described later, the block having the markers M5, M6, M10, and M8 arranged on the four corners and the block having the markers M7, M9, M13, and M11 arranged on the four corners have the same data contents, and the former block is selected as the processing target block 82. The latter block is therefore excluded.

The marker center detecting section 56 will be described in detail next.

The marker center detecting section 56 selects two markers 16, i.e., a marker pair, to detect pattern dots 14.

Figure 37:
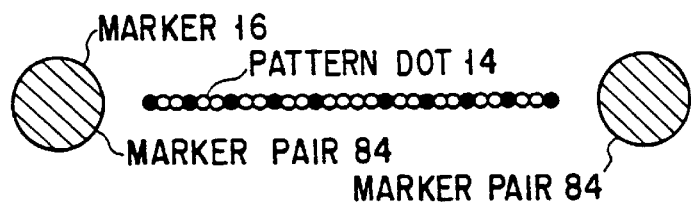
FIG. 37 is a view showing the relationship between each marker and each pattern dot.

Assume that in searching for pattern dots 14 by using markers 16, there is only one marker 16. In this case, if the dot code 36 is imaged while the dot code 36 skews as shown in FIG. 36, the locations of the pattern dots 14 cannot be detected. In contrast to this, assume that two markers 16 are detected as a marker pair 84, as shown in FIG. 37. In this case, if the positions of the pattern dots 14 are provided as format information indicating, e.g., that the pattern dots 14 are present between markers, the corresponding marker pair 84 may be detected. Therefore, the pattern dots 14 can be detected by sequentially searching pixels one by one from one of the markers 16 constituting the marker pair 84 to the other marker.

As described above, by selecting a marker pair, the pattern dots 14 can be reliably detected. That is, since the pattern dots 14 are recorded with a predetermined positional relationship being ensured with respect to the markers 14, even if skew occurs, the pattern dots 14 can be detected by obtaining the positions of at least two markers.

As shown in FIG. 38, therefore, in the marker center detecting section 56, a reference marker selecting section 86 selects one reference marker as a processing target, a calculating section 88 of existing area of marker to be paired calculates an existing area of marker to be paired in accordance with a specification skew angle and format information, and a detecting section 90 of candidate of marker to be paired searches the existing area of marker to be paired to detect all candidates of marker to be paired. A base marker pair selecting section 92 then selects a set of marker candidate pairs to determine markers as processing targets. A marker set selecting section 94 selects these processing target markers to determine a processing target block. Thereafter, the pattern dots 14 between the markers associated with this processing target block are detected.

Figures 39A, 39B:
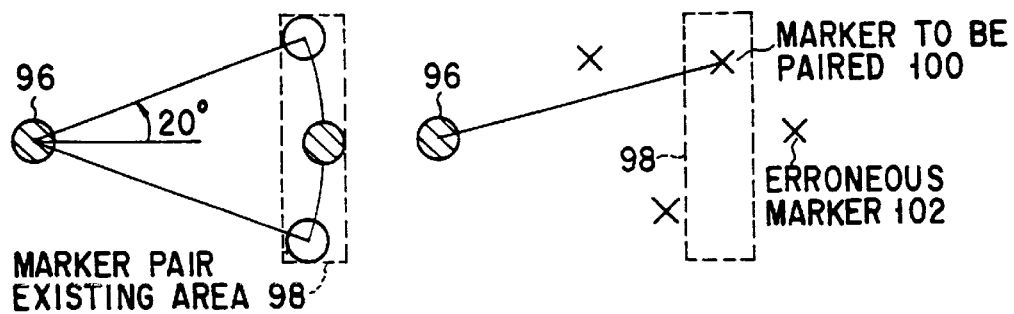
FIGS. 39A and 39B are views for explaining an existing area of a marker to be paired.

The calculating section 88 of existing area of marker to be paried calculates an existing area of marker to be paired in the following manner. As shown in FIG. 39A, a range in which a marker to be paired with one reference marker 96 selected by the reference marker selecting section 86 exists, i.e., an existing area 98 of marker to be paried, can be calculated on the basis of a specification skew angle (20° in the case shown in FIG. 39A) and inter-marker distance, i.e., format information. As shown in FIG. 39B, therefore, even if the marker detecting section 54 detects the approximate centers (indicated by "x" in FIG. 39B) of several marker candidates because of noise, it can be determined that only the marker candidates in the range of the existing area 98 of marker to be paired become a marker 100 to be paired, and the remaining markers are erroneous markers 102.

Note that a specification skew angle indicates a specific inclination limit within which the information reproduction system can read the dot code 36. If, for example, the image input section 38 is fixed, and the dot code 36 is automatically conveyed to be scanned, almost no skew occurs, and this specification skew angle is 1° or less. In contrast to this, when the operator is to manually scan the image input section 38 on the dot code 36, the image input section 38 may incline at about 20°. In addition, if the scan direction of the image input section 38 is restricted by a roller or the like, the skew can be reduced. As described above, the skew angle of an information reproduction system is determined by specifications depending on the structure.

As described above, in selecting a marker pair, an existing area of marker to be paired is calculated in accordance with the specification skew angle and the format information, and the calculated area is searched to detect marker candidates. With this operation, since all the marker candidates in the entire frame need not be detected, the search efficiency can be improved. In addition, since marker existing areas to be searched are narrowed down to adjacent marker existing areas in the horizontal direction, marker detection errors due to noise can be reduced. In other words, even if marker candidates are erroneously detected owing to noise, they can be removed owing to limitations on the format constituting a marker pair.

Alternatively, the marker center detecting section 56 may calculate the positions of a marker to be paired by extrapolation.

Figure 40A:
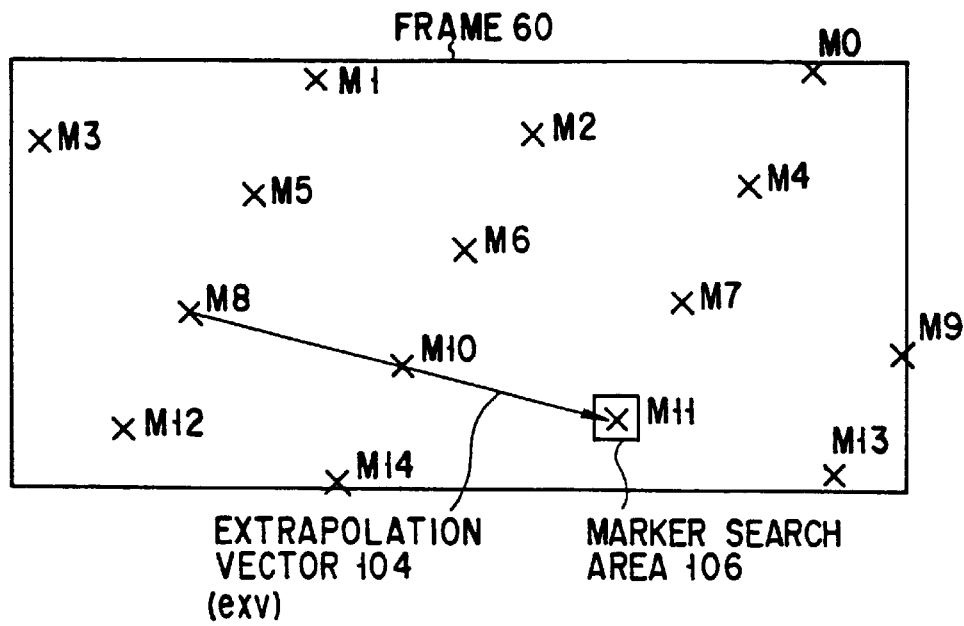
FIGS. 40A, 40B, and 41 are views for explaining calculation of the position of a marker to be paired by extrapolation.
Figure 40B:
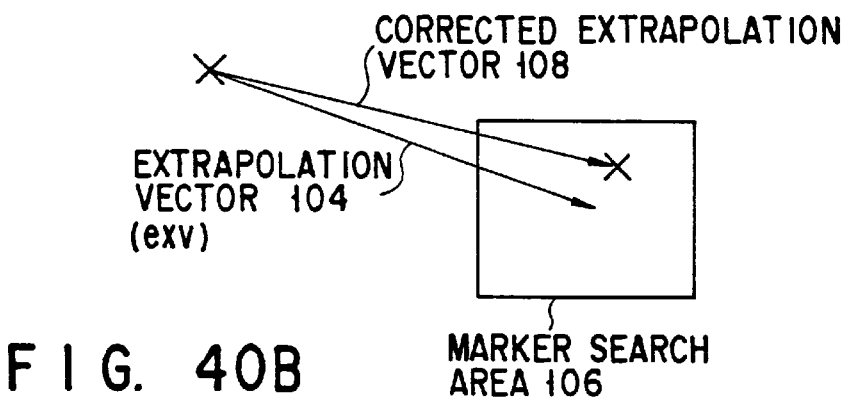

Assume that a set of marker pairs have been detected. In this case, for example, in the case shown in FIG. 40A, if the markers M8 and M10 have already been detected, the position of the next marker M11 can be determined without performing the above processing, i.e., calculating the existing area 98 of marker to be paired from the marker M10 on the basis of the specification skew angle and the format information, and searching the area. That is, since the skew angle and the inter-marker distance have already been known from the positional relationship between the markers M8 and M10, an extrapolation vector (exv) 104 may be extended from the marker M10, and a very narrow range near the distal end of the vector may be searched for a marker to be paired, as shown in FIG. 40B.

With this operation, since only a very narrow range becomes a marker search area 106, there is no possibility that marker candidates outside the area are erroneously detected. That is, an increase in resistance to noise is attained. Even if a plurality of marker candidates are present in the existing area 98 of marker to be paired, correct marker candidates can be selected as a marker 100 to be paired.

In addition, by using the extrapolation vector 104, a code from which the marker 16 is properly omitted can be read. For example, in the above case, even if the marker M11 is omitted, the approximate position of the marker M11 can be determined from the extrapolation vector 104, and hence the pattern dots 14 between the markers M10 and M11 can be read.

As described above, if the position of a marker to be paired is calculated by extrapolation, marker omission or a marker detection error due to noise is not easily caused. In addition, a code from which the marker 16 is properly omitted can be read.

Figure 41:
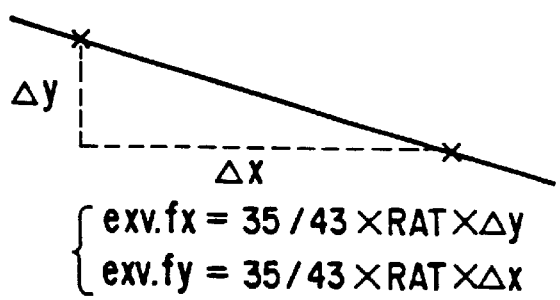

This extrapolation vector (exv) 104 can also be used to search for adjacent markers in the vertical direction. This vector can be calculated from the positional relationship between the previously detected marker pair in the horizontal direction. When the two markers 16 are detected as indicated by "x" in FIG. 41, the position of a marker adjacent to the marker pair is extrapolated by increases Δx and Δy in the x and y directions according to the following equations:

$$exv.f_x = 35/43 \times RAT \times \Delta y$$

$$exv.f_y = 35/43 / RAT \times \Delta x$$

where RAT is the aspect ratio for the pixels of an image pickup system used. In this case, $$RAT = 3.47/2.70$$

As described above, when a marker position is to be calculated by extrapolation, an extrapolation vector is calculated from the positional relationship of the previously detected marker pair, thereby reliably detecting a set of markers constituting a block in conjunction with the maker pair.

In addition, the extrapolation vector 104 can be used for processing of the next frame.

That is, the entire dot code 36 is not always imaged as one frame. In practice, however, frame images are consecutively picked up by scanning. In this case, since an abrupt change in skew angle hardly occurs between two consecutive frames, the extrapolation vector 104 obtained in the previous frame can be used for the next frame.

As described above, if the extrapolation vector 104 for the immediately preceding frame is referred to, the extrapolation vector 104 need not be obtained by calculation for the second and subsequent frames. That is, processing performed by the calculating section 88 of existing area of marker to be paired can be omitted.

In addition, when a corresponding marker is to be searched out in the marker search area 106 obtained by the extrapolation vector 104, the actual marker may be offset from the extrapolated position because of, e.g., distortion or inclination. For this reason, in such a case, as shown in FIG. 40B, the extrapolation vector is preferably corrected by using the approximate center of the marker 100 to be paired searched out in the marker search area 106. In searching for the next marker 100 to be paired, the marker search area 106 is preferably set by this corrected extrapolation vector, i.e., a corrected extrapolation vector 108.

As described above, by correcting the extrapolation vector 104 using the marker center position detected on the basis of the extrapolation vector 104, i.e., performing processing while correcting the extrapolation vector, a marker can be reliably detected without missing it even in the presence of distortion or inclination.

When all marker candidates as marker pairs are detected by one of the above techniques, the marker center detecting section 56 selects a series of marker pairs existing over two blocks as base marker pairs through the base marker pair selecting section 92.

Figure 42:
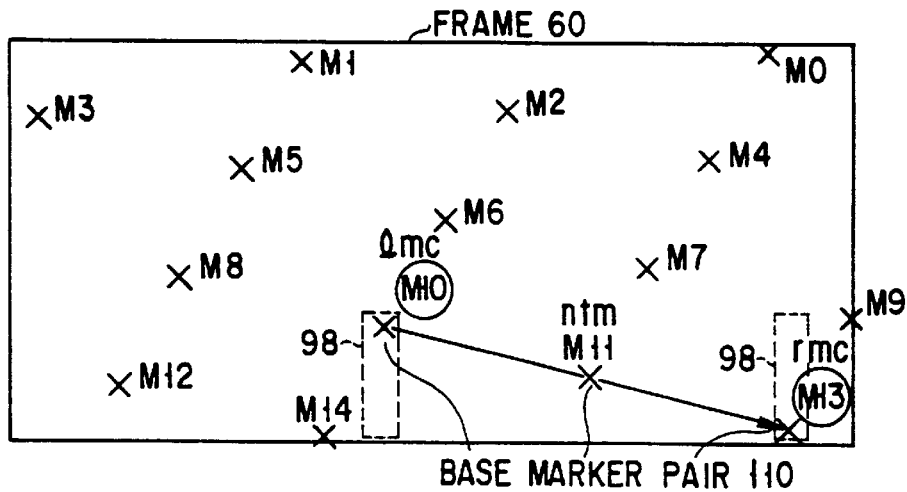
FIG. 42 is a view for explaining a base marker pair.

Assume that there are a series of marker pairs existing over two blocks, e.g., a marker pair constituted by the markers M10 and M11 and a marker pair constituted by the markers M11 and M13, as shown in FIG. 42. In this case, the three markers M10, M11, and M13 are selected as base marker pairs.

More specifically, an adjacent marker existing area, i.e., the existing area 98 of marker to be paired, is calculated from a reference marker (ntm) on the basis of the specification skew angle and the format information, and marker candidates in the existing area 98 of marker to be paired are detected. Of these candidates, a pair of markers are extracted as adjacent markers (lmc and rmc). This reference marker and the extracted markers are selected as a base marker pair 110.

Assume that an erroneously detected marker is present. In this case, owing to the limitation in terms of a format that markers should be arranged in a row, when three markers 16 including the erroneously detected marker are connected through a straight line, there is hardly any possibility that the intermediate marker coincides with the middle point of the straight line. For this reason, if a marker pair existing over two blocks are selected as a base marker pair, such an erroneously detected marker is excluded, and only actual markers are selected. That is, portions erroneously detected as markers owing to noise can be excluded.

Assume that the dot code 36 is recorded with a double height. In this case, by selecting such a base marker pair existing over two blocks, a specific one of two rows which is to be read can be determined.

Since the base marker pair exist over a plurality of blocks, many pattern dots can be used accordingly to improve the precision of a data read reference point. In the case shown in FIG. 42, the precision can be further improved by determining a read reference point using the pattern dots between the markers M10 and M11 as well as determining a read reference point, i.e., a true marker central coordinates, using the pattern dots within the range from the marker M10 to the marker M13.

In addition, since read reference points can be simultaneously determined over a plurality of blocks, the calculation amount is smaller than that required when read reference points are sequentially obtained as in the case wherein the true centers of the markers M10 and M11 are obtained first, and the true centers of the markers M11 and M13 are then obtained.

As described above, if a series of marker pairs existing over at least two blocks are selected as base marker pairs, marker detection errors due to noise can be reduced owing to the limitation on the format constituting the base marker pairs (i.e., pairs are limited). In the case of a code recorded with a double height, if a marker pair existing over reproduction block rows is selected as a base marker pair, the code need not be read twice. Furthermore, since a base marker pair exist over a plurality of blocks, many pattern dots can be read to improve the precision of a read reference point. Since data read reference points can be simultaneously determined over a plurality of blocks, the calculation amount can be reduced.

The double height will be described below.

Figure 43A:
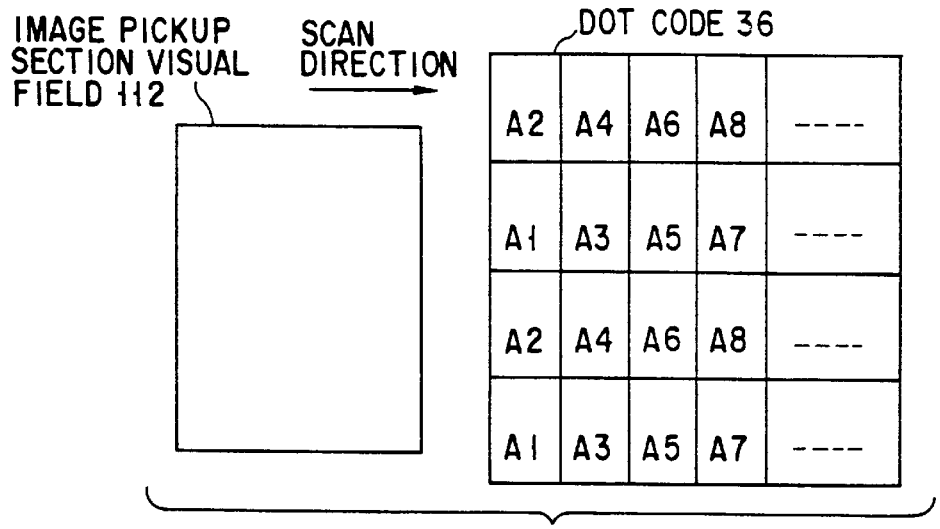
FIGS. 43A and 43B are views for explaining a double height.
Figure 43B:
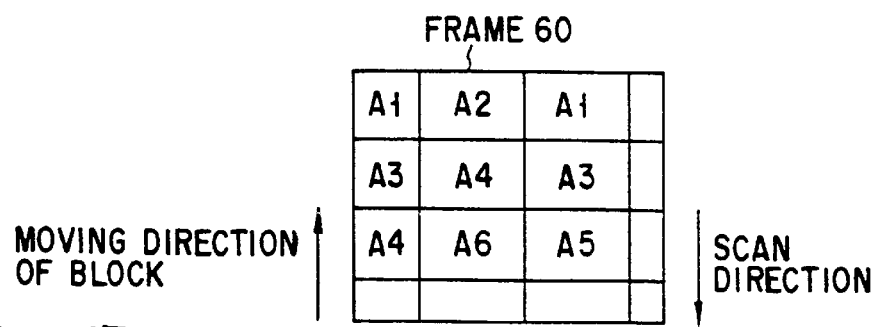

The double height indicates that identical codes are printed in two rows, as shown in FIG. 43A ("A1", "A2", . . . in FIG. 43A represent block addresses). That is, if an original code is printed in two rows. (two vertical blocks), the original code printed with a double height has four rows (four vertical blocks). When this dot code 36 is scanned by the image input section 38 in the horizontal direction, a frame image obtained by the image pickup section 46 (image pickup section visual field 112) such as a CCD camera is an image rotated through 90° with respect to the original code, as shown in FIG. 43B. That is, the obtained frame image is an image in which the blocks sequentially slide upward as if to move upward as the code is scanned.

In this case, owing to the size of each block and the size of a frame, the code imaged in units of three blocks in one frame in the horizontal direction. Of these three blocks recorded with a double height, two blocks have the same data contents. For this reason, one of the two blocks is to be processed. In the case shown in FIG. 36, therefore, the block having the markers M5, M6, M10, and M8 on the four corners has the same data contents as those of the block having the markers M7, M9, M13, and M11 on the four corners. Since the former block is selected as the processing target block 82, the latter block is excluded.

The base marker pair selecting section 92 selects a reference marker from marker candidates in the scan direction within a range in which at least right and left adjacent markers can be detected, and selects a base marker pair on the basis of the reference markers.

Figure 44A:
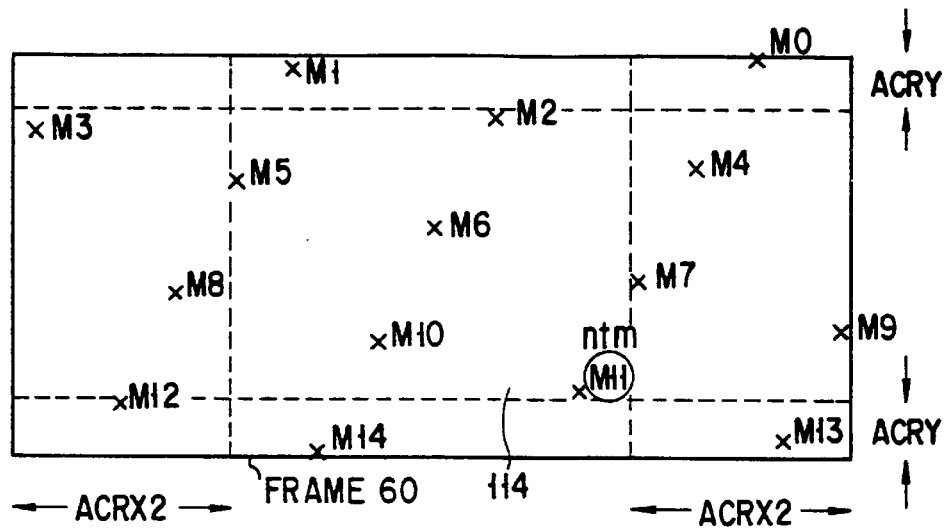
FIGS. 44A and 44B are views for explaining a method of selecting a reference marker in selecting a base marker pair.

That is, when a given marker is detected, the position of an adjacent marker can be defined by the specification skew angle and the format, as described above. Although a reduction ratio based on an inclination is also associated with the above case, since an adjacent marker is present in the frame 60 without fail only when the marker is present in an area 114 in FIG. 44A, a reference marker ntm is selected in this area 114.

Figure 44B:
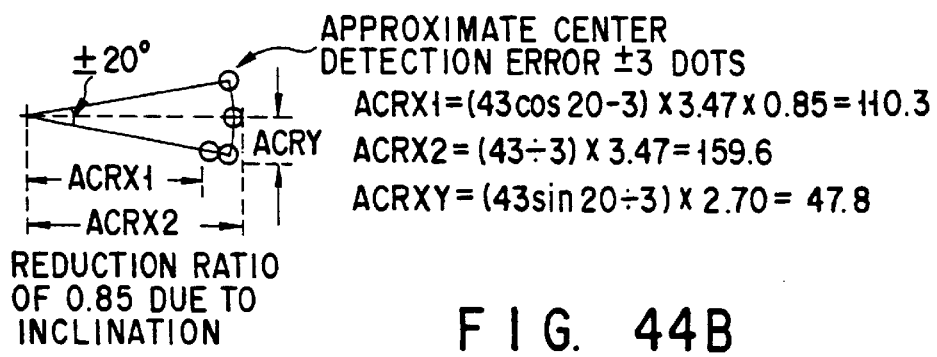

The area 114 is smaller than the frame 60 by a distance ACRY from each of the upper and lower ends of the frame and a distance ACRX2 from each of the right and left ends of the frame. As shown in FIG. 44B, the distances ACRY and ACRX2 respectively correspond to ½ the length of the marker pair existing area 98 in the Y direction and the length from the corresponding marker to the end of the existing area 98 of marker to be paired on the remote side. The values of these distances are calculated by the equations in FIG. 44B.

That is, when a reference marker is selected in this area 114, it is possible that adjacent markers are always detected on both sides of the reference marker within the area 114.

In addition, the purpose for selecting a reference marker from marker candidates in the scan direction is to select a block in a manner to be described later. When blocks are selected in the scan direction in this manner, a block which has been processed in the previous frame is selected later. For this reason, if the processed block is detected, the processing of the frame is stopped, thereby omitting unnecessary processing for the processed block.

In the case shown in FIG. 42, the reference marker corresponds to the marker in the center of the base marker pair 110, and a marker located as lower as possible in a frame is selected as the reference marker ntm. In this case, therefore, the marker M11 is selected as the reference marker ntm.

As described above, a reference marker is selected from marker candidates in the scan direction within the range in which at least right and left adjacent markers can be detected, and a base marker pair are selected on the basis of this reference marker. If, therefore, an adjacent marker which should be detected cannot be detected, it can be estimated that the code protrudes from the frame or some accident has occurred. In addition, by selecting a reference marker from marker candidates in the scan direction, processing is started from a marker which has not been detected in the previous frame. For this reason, redundant processing can be prevented.

When a marker candidate is detected only on one side of the reference marker ntm, the base marker pair selecting section 92 re-selects this marker as a reference marker, and further searches for adjacent markers. Note that in this marker search operation, an existing area is limited by extrapolation.

Figure 45:
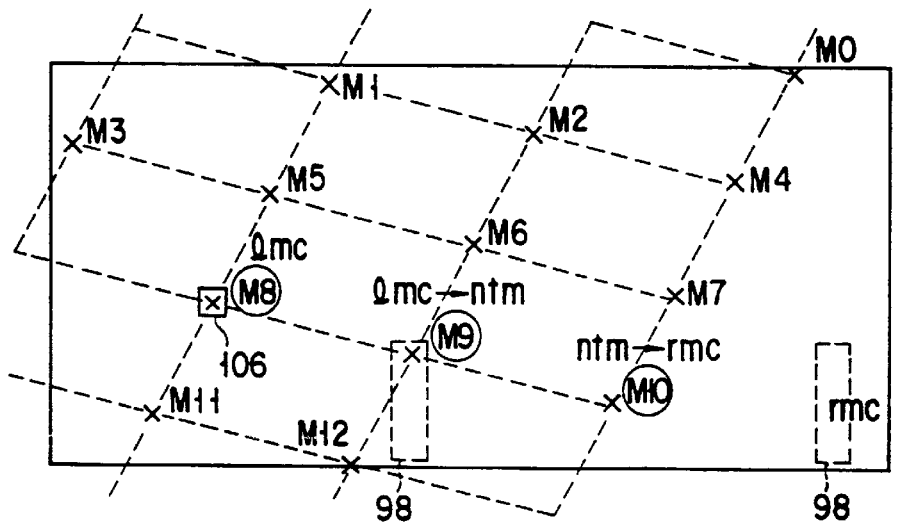
FIG. 45 is a view for explaining a method of searching for an adjacent marker when marker candidates are detected on only one side of a reference marker.

Assume that the marker M10 is selected first as the reference marker ntm, and each existing area 98 of marker to be paired is searched for the corresponding markers lmc and rmc, as shown in FIG. 45. In this case, if no marker is detected from the right existing area 98 of marker to be paired, but the marker M9 is detected as the left adjacent marker lmc from the left existing area 98 of marker to be paired, the marker M10 is determined as a marker on an end portion of the dot code 36. The detected marker M9 is then determined as the reference marker ntm. The marker search area 106 is obtained from the detected marker M10 by using an extrapolation vector, thereby searching for the left adjacent marker lmc in this area. The marker M8 is then detected, and markers M8, M9, and M10 are used as base marker pair.

When only a marker on one of the right and left sides of a reference marker can be detected, the reference marker is replaced with the detected adjacent marker to search for a marker by extrapolation. With this operation, more blocks can be read. That is, since blocks are read on the basis of a reference marker, if a marker on a code end is selected as a reference marker, the number of blocks which can be read decreases. For this reason, when a selected reference marker is on a code end, another reference marker is selected to read more blocks. In addition, since a search area is narrowed down by extrapolation, marker detection errors due to noise can be reduced.

Note that when the marker position extrapolated in the above manner protrudes from the frame 60, the base marker pair selecting section 92 stores this extrapolated position as the approximate center of a virtual marker.

Assume that the marker M8 is set first as the reference marker ntm, and the existing areas 98 of markers to be paired on both sides of the reference marker are searched, as shown in FIG. 46. In this case, if the right adjacent marker rmc is not detected, the reference marker is replaced with the marker M7 to search for the left adjacent marker lmc from a marker pair consisting of the markers M7 and M8 by extrapolation. When this extrapolation point protrudes from the frame 60 at this time, a virtual marker is set for the extrapolation point.

With this operation, in the case shown in FIG. 46, the pattern dots 14 between the marker M7 and the virtual marker M10 can be used.

When this virtual marker M10 is not set, only the markers M7 and M8 are detected, and hence only blocks in the same row as that of the block including the markers M7 and M8 are read. If, however, the virtual marker M10 is set in this manner, the block having the markers M1, M2, M5, and M4 on the four corners can be read, thereby preventing the omission of a block.

As described above, when a marker search area protrudes from a frame upon extrapolation, the extrapolation point is set as a virtual marker. With this operation, even if a marker protrudes from the frame, pattern dots 14 left in the frame can be used, thereby allowing effective use of the pattern dots 14.

Although blocks are sequentially read on the basis of reference markers by extrapolation, even if a marker adjacent to a reference marker protrudes from a frame, markers constituting blocks obtained by extrapolation may enter the frame owing to skew. In this case, these blocks can be read.

In addition, when two or more base marker pairs can be selected, the base marker pair selecting section 92 re-selects a base marker with which the possibility that more blocks can be read is high.

That is, in the case of the double height, identical codes are printed in two rows. When the original code consists of two horizontal blocks, a frame image consists of four horizontal blocks. The codes generally are imaged in units of three horizontal blocks in one frame owing to the size of each block and the size of the frame 60. For this reason, the number of blocks to be read can be increased by re-selecting a base marker pair with which the possibility that more blocks can be read is high.

When, for example, the markers M10, M11, and M13 are selected as base marker pairs as indicated on the left side of FIG. 47A, the following three blocks become read blocks, as indicated by hatching on the right side of FIG. 47A: the block having the markers M2, M4, M7, and M6 on the four corners, the block having the markers M6, M7, M11, and M10 on the four corners, and the block having the markers M7, M9, M13, and M11 on the four corners.

In contrast to this, when the markers M8, M10, and M11 are selected as base marker pairs as indicated by the left side of FIG. 47B, the following five blocks become read blocks, as indicated by hatching on the right side of FIG. 47B: the block having the markers M1, M2, M6, and M5 on the four corners, the block having the markers M5, M6, M10, and M8 on the four corners, the block having the markers M8, M10, M14, and M12 on the four corners, the block having the markers M2, M4, M7, and M6 on the four corners, and the block having the markers M6, M7, M11, and M10 on the four corners.

In the case of the double height, since identical data are recorded in the block having the markers MS, M6, M10, and M18 and the block having the markers M7, M9, M13, and M11, the same data is obtained by reading either one of the blocks. For this reason, the markers M8, M10, and M11 with which more blocks can be read are selected as base marker pair.

If two or more base marker pairs can be selected, one of the base marker pairs with which the possibility that more blocks can be read is high is re-selected, thereby extracting more read blocks from one frame.

In re-selecting a base marker pair in the above manner, when the code skews to the left, the base marker pair on the right side are re-selected, whereas when the code skews to the right, the base marker pair on the right side are re-selected. In searching for markers, an existing area is limited by extrapolation.

For example, as shown in FIG. 48, if the code skews to the right, a set of the markers M8, M10, and M11 on the left side or a set of the markers M10, M11, and M13 on the right side may be selected as base marker pair. If the set on the left side is selected, five blocks can be read. If the set on the right side is selected, only four blocks can be read. For this reason, when the code skews to the right in this manner, the marker pair on the left side are selected.

Markers constituting blocks are sequentially obtained by extrapolation with reference to base marker pair. As described above, in re-selecting a base marker pair, when the code skews to the right, the base marker pair on the left side are re-selected, and when the code skews to the left, the base marker pair on the right side are re-selected, thereby preventing a block omission caused when the code skews and a marker constituting a block protrudes from the frame (in the horizontal direction).

Alternatively, in the above re-selection of a base marker pair, a base marker pair near the middle point may be selected. More specifically, when the middle point between the left marker and the reference marker is on the right side of the frame center, or the middle point between the right marker and the reference marker is on the left side of the frame center, the marker pair near the center are re-selected.

Assume that the code skews to the right, as shown in FIG. 49. In this case, when the markers M10, M11, and M13 are detected as base marker pair, since the middle point between the left marker M10 and the reference marker M11 is on the right side of the center, it can be determined that this base marker pair is on the right side of the frame 60. In this case, therefore, a marker pair consisting of the markers M10 and M11 closer to the center than a marker pair consisting of the markers M11 and M13 are re-selected as a marker pair. The marker M8 is then searched out by extrapolation, and the markers M8, M10, and M11 are selected as base marker pair.

When the code skews to the left, whether to re-select a base marker pair can be determined by checking whether the middle point between the right marker and the reference marker is on the left side of the frame center.

Markers constituting blocks are sequentially obtained by extrapolation with reference to base marker pair. As described above, when the middle point between the left marker and the reference marker is on the right side of the frame center, or the middle point between the right marker and the reference marker is on the left side of the frame center, the marker pair closer to the center are re-selected, thereby preventing a block omission caused when the code skews and a marker constituting a read block protrudes from the frame. In addition, since the block closer to the center is selected, the influence of distortion can be reduced.

The marker set selecting section 94 selects all sets or some sets of markers constituting blocks.

Assume that each block 20 is rectangular, and markers are arranged on the vertexes of each block 20, as shown in FIG. 50A. In this case, all the sets of four markers constituting the blocks 20 are selected.

By selecting marker sets constituting the blocks 20 in this manner, read data can be separately processed in units of blocks.

Note that the marker set selecting section 94 stores all the marker sets constituting the selected blocks 20 in a memory (not shown).

In the case shown FIG. 50A, when it is determined from format information that markers M0, M2, M6, and M4 constitute one block, these markers are stored as the marker set for the first block in the memory such that the upper left corner corresponds to M0; the upper right corner, M2; the lower right corner, M6; and the lower left corner, M4, as shown in FIG. 50B. Similarly, markers M1, M3, M7, and M5 are stored as a marker set for the second block; markers M8, M10, M14, and M12, as a marker set for the third block; and markers M9, M11, M15, and M13, as a marker set for the fourth block. That is, in this case, since there are four blocks, the first to fourth blocks are stored in the memory with marker numbers in this manner.

By storing all the marker sets constituting the blocks 20 in the memory on the basis of the approximate center position in this manner, data can be read in units of blocks even if the blocks 20 are not aligned.

Instead of storing all the marker sets in this manner, a predetermined one of the markers constituting the block 20 and a relation representing the relationships between the predetermined marker and the remaining markers may be stored in the memory.

Assume that processing target blocks 82 indicated by hatching in FIG. 51A are aligned. In this case, if a predetermined one of the four markers constituting the block, i.e., the upper left marker, and the relation representing the relationship between the upper left marker and the three remaining markers are known, all the marker sets need not be stored in the memory.

For example, in the case shown in FIG. 51B, if a relation indicating that the upper right marker corresponds to "+1"; the lower left marker, "+3"; and the lower right marker, "+4" is stored in the memory, only the upper left marker M1 of the first block needs to be stored in the memory. It can be determined from the relation that the marker number of the upper right marker is M2, which is obtained by adding "+1" to M1, the marker number of the lower left marker is M4, which is obtained by adding "+3" to M1, and the marker number of the lower right marker is M5, which is obtained by adding "+4" to M1. Therefore, these markers M2, M4, and M5 need not be stored in the memory.

As described above, if at least one of the markers constituting the block 20 and the relationship with the remaining markers are known, at least one marker needs to be stored in the memory. The memory capacity can therefore be saved.

Figure 52:
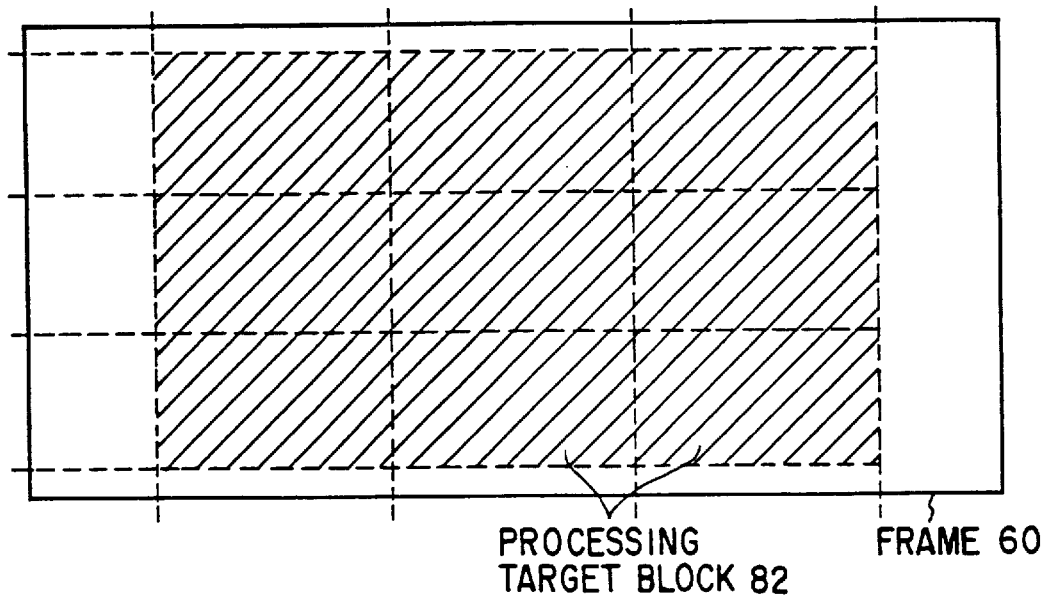
FIGS. 52 and 53 are views each for explaining a method of selecting a set of markers for selecting a processing target block.

As shown in FIG. 52, the marker set selecting section 94 may select all the marker sets constituting the blocks 20 to set all the blocks 20 in the frame 60 as processing target blocks 82. In this case, the base marker pair selecting section 92 can be omitted.

As described above, in the case of the double height, identical codes are printed in two rows. When the original code consists of two horizontal blocks, a frame image consists of four horizontal blocks. The codes are generally imaged in units of three horizontal blocks in one frame owing to the size of each block and the size of the frame 60. If all the marker sets constituting the blocks 20 in the frame are selected in this manner, the blocks having the same contents are read redundantly. When the same contents are read from the two blocks, it is determined that the correct data is read. With this operation, the reliability of the data can be improved.

That is, an improvement in reliability can be attained by setting all blocks selected redundantly as processing target blocks.

Figure 53:
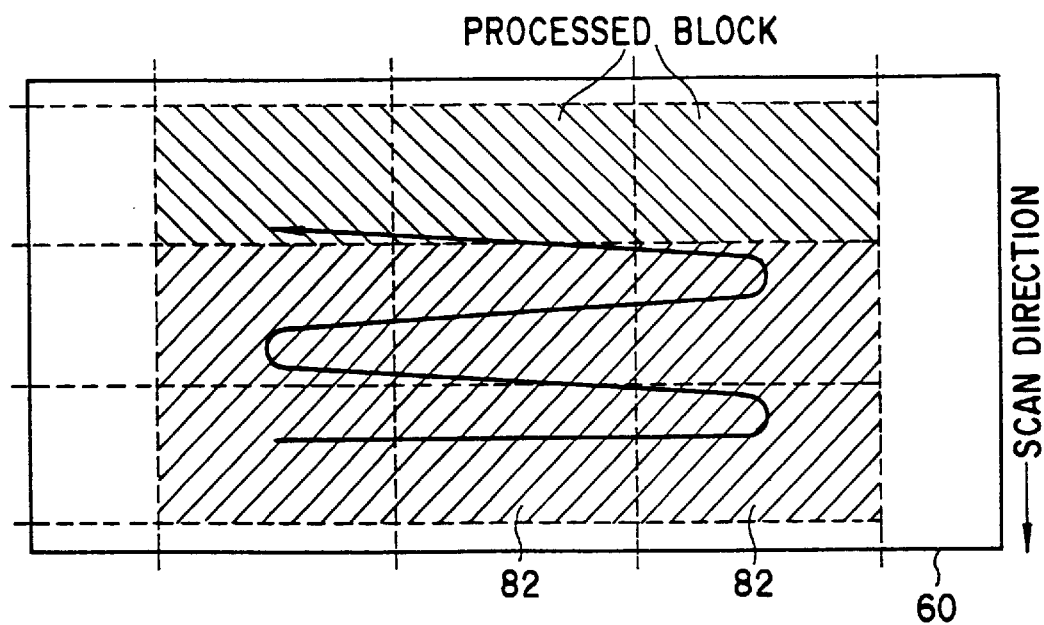

Alternatively, as shown in FIG. 53, the marker set selecting section 94 may sequentially select marker sets constituting blocks in the scan direction to set them as processing target blocks 82. When a block which has been processed in the previous frame appears, the processing may be stopped, and processing for the next frame may be started.

Figure 54:
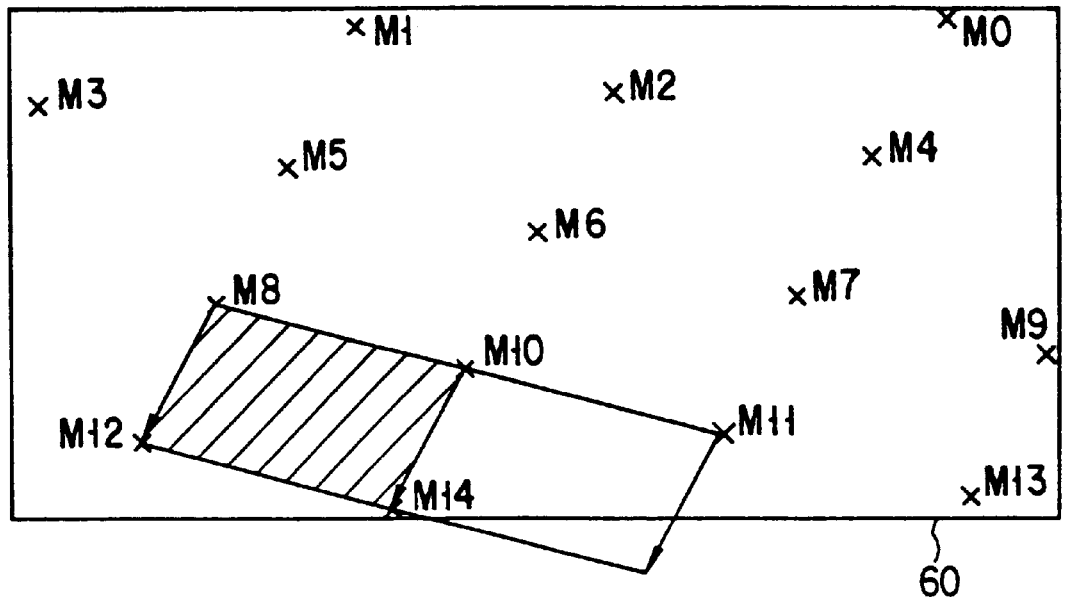
FIG. 54 is a view for explaining a method of reading blocks when a reference marker is selected from marker candidates in the scan direction.

When, for example, the base marker pair selecting section 92 selects a reference marker from marker candidates in the scan direction, the markers M8, M10, and M11 are selected as base marker pair, as shown in FIG. 54. Since a read operation is started from a lower block, extrapolation is performed once downward from the selected base marker pair to search for markers. With this operation, the markers M12 and M14 are detected and regarded as a marker set constituting one block. The markers M8, M10, M14, and M12 are therefore selected. An upper block is then selected and processed. It can be determined from the block address whether the selected block is a block which has already been processed. When a block which has already been processed is detected, the processing for the frame is stopped, thereby omitting unnecessary processing, i.e., re-processing of the block which has already been processed.

As described above, by sequentially selecting marker sets constituting blocks in a frame in the scan direction, no processed blocks are set as processing target blocks, thereby omitting redundant processing.

When the image pickup section 46 undergoes optical distortion, the distortion is larger at a peripheral portion of the frame 60 than at its central portion. For this reason, the marker set selecting section 94 sequentially selects marker sets constituting blocks on side end portions of the frame 60 to read the data of the blocks on peripheral sides first. The data of the blocks closer to the frame center are then read, and the read data are overwritten. With this operation, the reliability of the data can be further improved.

Figure 55:
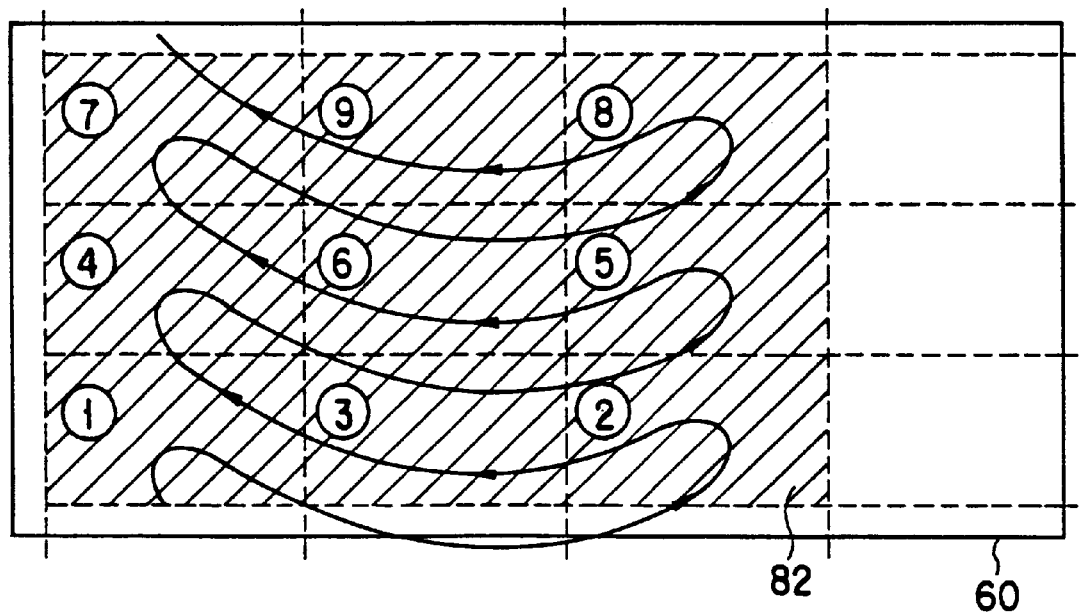
FIG. 55 is a view for explaining the order in which blocks are read in the presence of optical distortion.

If, for example, a code is recorded with a double height, processing target blocks 82 are sequentially read in the order of numbers ① to ⑨, as indicated in FIG. 55. In this case, although identical data are recorded on blocks ① and ⑨, since block ① is closer to an end of the frame 60, a read error is caused by optical distortion at a higher probability. If, therefore, the data of block ② is read once more and overwritten after the above read operation, more accurate data can be obtained. Assume that block ② cannot be read because of noise or the like. In this case, since the data of block ① has been read, a complete failure to read the data of this block can be prevented, even though the data may include some errors.

That is, a block located closer to a frame end is affected more by distortion, and hence errors increase. For this reason, marker sets constituting blocks near frame end portions in a direction perpendicular to the scan direction are sequentially selected, and the data of the blocks are sequentially read toward the frame center to be overwritten, thereby obtaining highly reliable data without requiring any extra memory.

Alternatively, when a failure to read a selected block occurs, the marker set selecting section 94 may re-select a block having the same address as that of the selected block.

Figure 56:
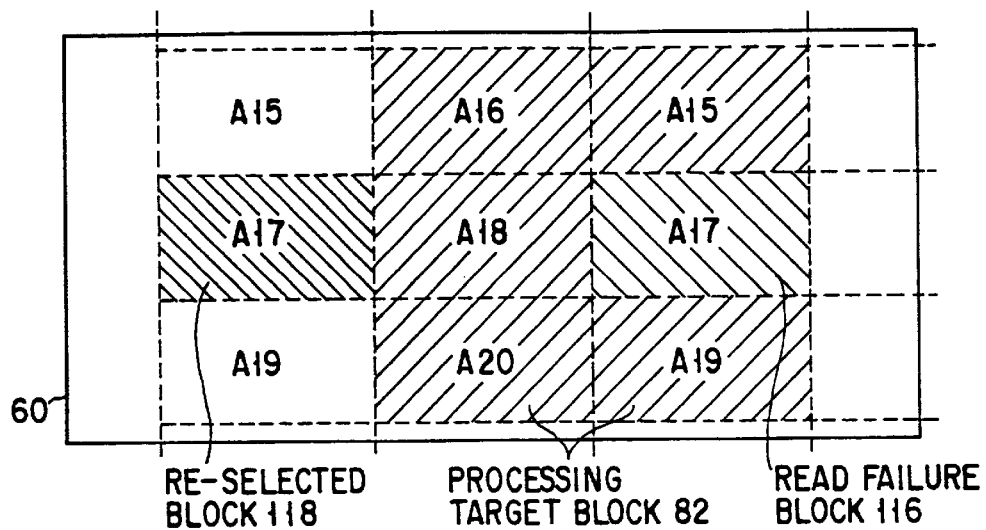
FIG. 56 is a view for explaining block re-selection processing to be performed when a failure to read a selected block occurs.

Assume that three markers (not shown) in the center of a double height code are selected as base marker pair, and processing target blocks 82 are sequentially read, as shown in FIG. 56. In this case, if a block having an address A17 is a read failure block 116, a marker set is selected again to select a block having the same data (address) as that of the read failure block as a re-selected block 118.

Note that a read error occurs, and the read failure block 116 is set when, for example, the address dots 18 cannot be read because of noise, or no marker is detected.

When a failure to read a given block occurs, read errors due to block omissions can be reduced by selecting a marker set constituting another block having the same address.

A method of estimating a read reference point for the data code 10 will be describe next.

Figure 57:
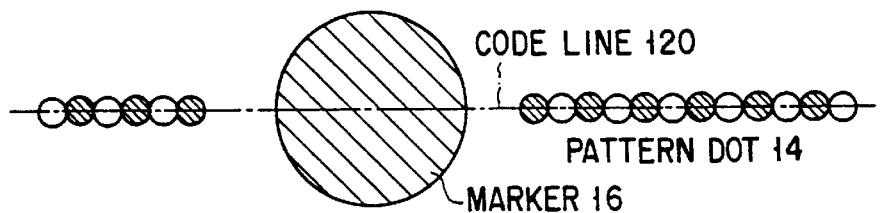
FIG. 57 is a view showing the positional relationship between a marker and each pattern dot.

As shown in FIG. 57, the marker 16 and the pattern dots 14 are arranged on a code line 120 in a straight line. That is, the true center of the marker 16 as a read reference point for the data code 10 and the center of each dot of the pattern dots 14 are arranged on the code line 120. Therefore, by using the pattern dots 14 recorded in a predetermined format, it can be immediately determined whether a read approximate marker center is the correct true center.

In addition, by using a plurality of pattern dots 14, the precision of an obtained read reference point can be improved. That is, since the format of the pattern dots 14 is determined in advance, when the pattern dots 14 are detected, it can be discriminated whether the detected dots are dots at predetermined positions or noise. The centers of all the pattern dots 14 at the predetermined positions can therefore be obtained, and the true center of the marker 16 can be obtained by using the center positions of these dots, thereby improving the precision of a read reference point position.

Figure 58:
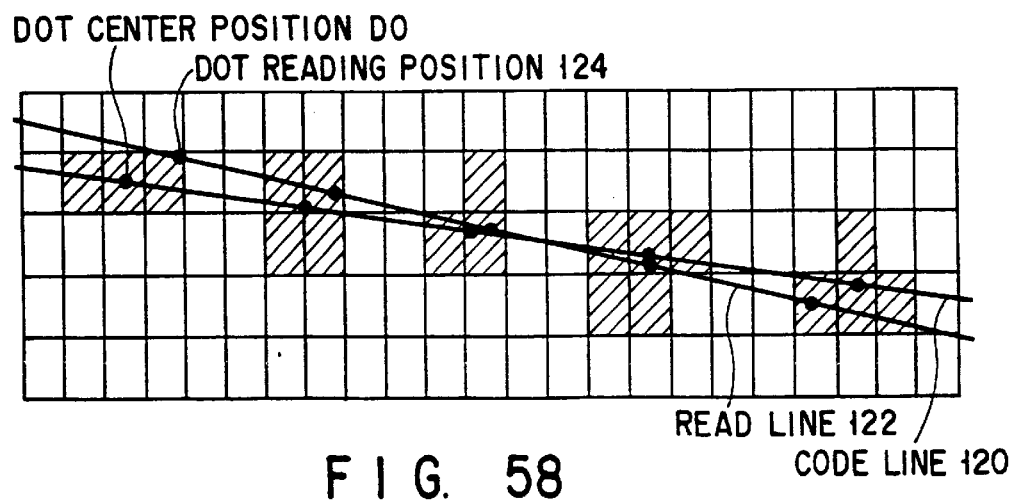
FIG. 58 is a view showing the relationship between each dot read position and the center position of each dot.

Assume that a pattern shape is obtained by binarization processing of each dot of the pattern dots 14, as shown in FIG. 58. In this case, dots are detected on a read line 122 connecting the approximate centers of the markers 16 at dot read positions 124 based on format information. Central positions DO of the detected dots are calculated, and a true marker center as a read reference point for the data code 10 can be calculated from these coordinates by linear recurrence.

The center position detection precision of each dot is expressed as an error corresponding to a fraction of a pixel. By preparing a plurality of pattern dots 14 for one marker 16, the precision can be improved.

In estimating a data read reference point by using the pattern dots 14 recorded in a predetermined format, whether read information is correct can be immediately determined by comparing it with the predetermined format. In addition, by using at least one pattern dot 14, the reference point estimation precision can be improved.

When a data read reference point, i.e., the true center of the marker 16, is to be estimated by using the pattern dots 14, a correct data read reference point is estimated by using only the pattern dots 14 having a predetermined positional relationship with an approximate marker center.

Figure 59A:
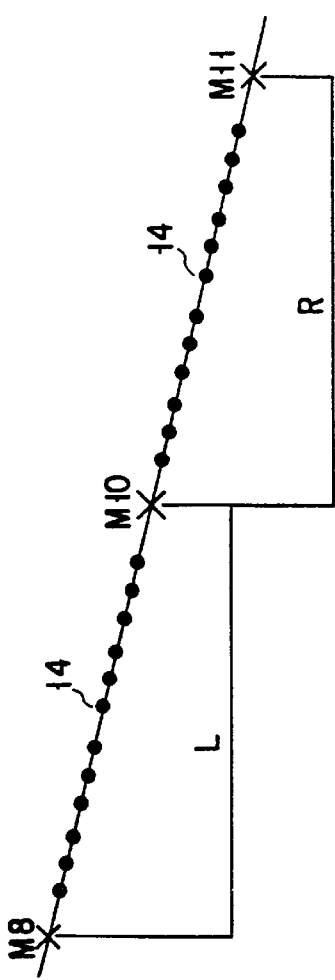
FIGS. 59A and 59B are views for explaining a method of estimating a data read reference point from an approximate marker center by using pattern dots.
Figure 59B:
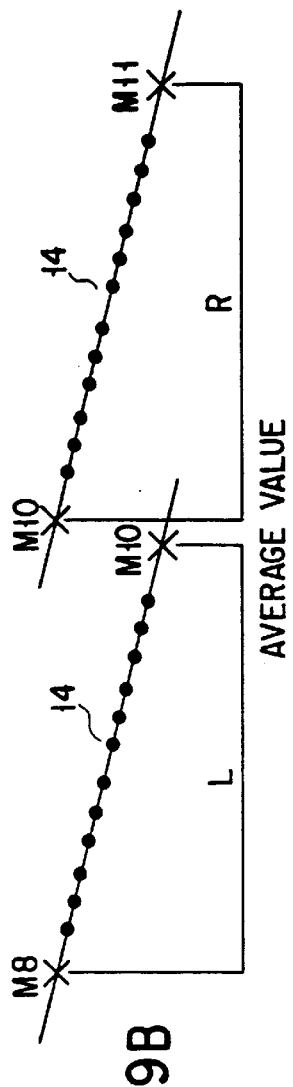

The pattern dots 14 having the above predetermined positional relationship are the pattern dots 14 between adjacent markers, as shown in, e.g., FIG. 59A. This estimation of a true marker center is performed in units of blocks to cope with distortion. For example, when the true centers of the markers M8 and M10 are to be obtained, the pattern dots 14 between the markers are used. When the true centers of the markers M10 and M11 are to be obtained, the pattern dots 14 between the markers are used. In this case, since the true center of the marker M10 is obtained by using the pattern dots 14 on both sides of the marker, the average of the left and right blocks is used, as shown in FIG. 59B.

Figure 60:
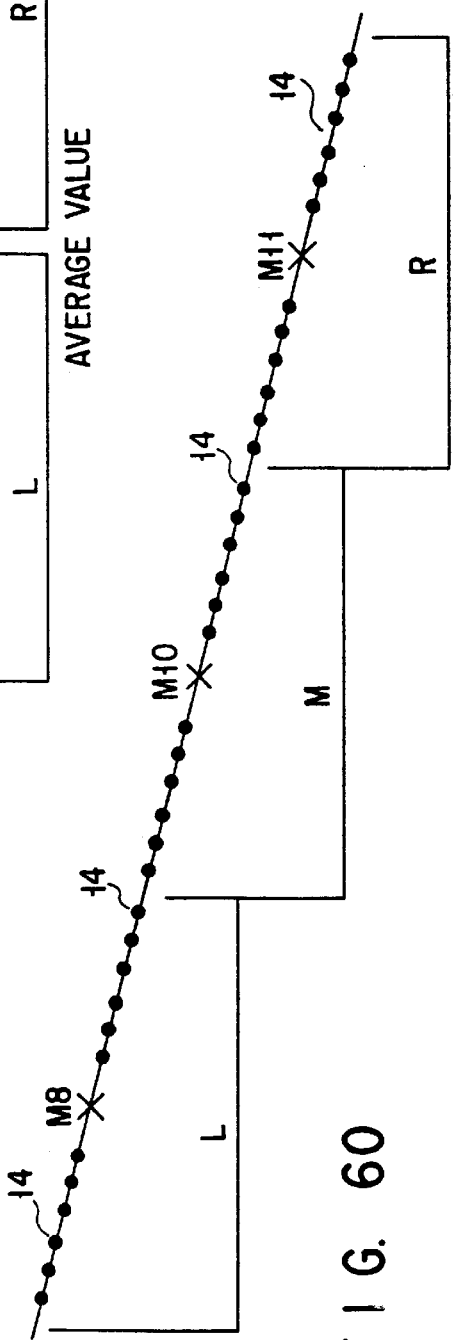
FIG. 60 is a view for explaining another estimation method.

As the pattern dots 14 having the predetermined positional relationship, the pattern dots 14 within predetermined ranges, including the pattern dots 14 outside the blocks, may be used, as shown in FIG. 60. In this case, the true centers of the markers M8, M10, and M11 are obtained by using the pattern dots in ranges L, M, and R, respectively.

In this case, for example, in the absence of optical distortion, one data read reference point, i.e., the true center of the marker 16, is preferably obtained by using the pattern dots 14 as many as possible to improve the precision. In the absence of optical distortion, therefore, the true center of the marker 16 is preferably obtained by using the pattern dots 14 in a wide range, as shown in FIG. 61A.

In contrast to this, in the presence of optical distortion, errors are accumulated to cause a large error as pattern dots separate from the marker 16. For this reason, the reliability of an obtained data read reference point is improved by limiting the range in which the pattern dots 14 are read (using only the pattern dots 14 near the marker, as shown in FIG. 61B) instead of using the pattern dots 14 in a wide range.

A correct data read reference point is estimated by using only the pattern dots 14 having a predetermined positional relationship with an approximate marker center in this manner. With this operation, in the absence of distortion, the estimation precision can be improved by broadening the range of pattern dots and increasing the number of dots. In the presence of distortion, the estimation precision can be improved by limiting the range. In addition, the processing can be facilitated by setting the range between a marker pair.

In addition, in using the pattern dots 14 between markers, a data read reference point can be estimated by using a general tree search method. More specifically, as shown in FIG. 62A, the pattern dots 14 are read not only on a line connecting the approximate centers of a marker pair, but also on lines connecting eight approximate centers near each marker. That is, a read operation is performed nine times with respect to each point. In this case, all the pattern dots 14 cannot be read at an offset position, but all the dots can be read at a correct position. For this reason, points (indicated by "o" in FIG. 62B) at which the number of times all the pattern dots 14 can be read is maximum are set as data read reference points. Alternatively, data read reference points with higher precision may be used, which are obtained by performing a read operation at eight points within smaller ranges near the reference points obtained in the above manner.

By using the tree search method in this manner, a data read reference point can be determined without requiring complicated calculation.

Furthermore, in this case, instead of performing full tree search processing, limited tree search processing may be performed on the basis of the result obtained by reading the pattern dots 14 between approximate marker centers once.

Assume that when dots 1 and 10 are set as approximate marker centers, dots 2, 3, 4, and 5 can be read, but dots 6,7, 8, and 9 cannot be read, i.e., only the dots on the left side can be read, as shown in FIG. 63A. In this case, it can be determined that the left approximate center (dot 1) is an almost correct position, but the right approximate center (dot 10) is offset. Therefore, the left approximate center may be kept unchanged, but only a right approximate center may be obtained by tree search processing using eight adjacent points.

In addition, as shown in FIG. 63B, the pattern dots 14 are constituted by dots 2 and 6 which are offset to the right, dots 3, 5, and 7 at normal positions, and dots 4 and 8 which are offset to the left. When only dots 4 and 8 offset to the left cannot be read after a read operation, it can be determined that the position of the approximate center is offset to the right. That is, the occurrence of read errors with respect to dots 4 and 8 offset to the left indicates that the overall pattern dots are offset to the right. In such a case, in continuing tree search processing with the approximate centers of dots 1 and 9 being offset, search processing may be mainly performed with respect to the points offset to the left.

Similarly, by inserting vertically offset dots like those shown in FIG. 17 into the dot pattern, an offset in the vertical direction can also be detected. Limited tree search processing can be performed accordingly.

When all the dots of the pattern dots 14 are detected almost uniformly, an almost accurate data read reference point is detected.

As described above, pattern dots are read at dot read points determined by the approximate centers of a marker pair and the format, and the offset amount and direction of the approximate center positions are estimated from the positions of dots at which read errors have occurred and their offset amounts. The approximate centers of the marker pair are then moved on the basis of the estimation results to perform tree processing. With this processing, the number of times of search operations can be decreased as compared with full tree search processing.

Note that the pattern dots 14 need not always be aligned in a straight line between a marker pair, but the positional relationship between the dots and the marker pair may be determined by a format.

Assume that the pattern dots 14 are arranged in a circle between markers or around a marker, and the center of this circle is set as a data read reference point, as shown in FIG. 64. In this case, if the format indicates that the pattern dots 14 are arranged with a radius $\underline{r}$, each dot is detected in accordance with the approximate marker center to obtain the center (indicated by "x" in FIG. 64) of each dot. The center (x,y) of the circle with the radius r is obtained such that the square-sum of the distances from the eight dot centers to the circle is minimized. The obtained center is then set as a data read reference point. In terms of association, this operation is equivalent to moving the circle with the radius $\underline{r}$, searching for a position where the obtained dot centers properly fit in the circle, and setting the center (x,y) of the circle at the position as a data read reference point. Alternatively, the center of gravity of these dot centers may be simply set as the center of the circle, i.e., a data read reference point.

As described above, pattern dots are detected at dot read points determined by the approximate centers of a marker pair and the format, and the centers of the detected pattern dots are calculated. Each read reference point is then estimated such that a predetermined error function determined by the relationship between the calculated dot centers and the format is minimized. With this operation, therefore, each data read reference point is estimated by using the centers of a plurality of pattern dots. As a result, the precision can be greatly improved.

As described above, in the marker center detecting section 56, a pattern dot detecting section 126 detects the pattern dots 14 arranged between the respective markers of a marker set selected by the marker set selecting section 94 at dot read points determined by the approximate centers of the markers and the format, and a dot center calculating section 128 calculates the center of each detected dot, as shown in FIG. 38. A error minimizing section 130 then estimates read reference points for the respective data dots of the data code 10 such that a predetermined error function determined by the relationship between the calculated dot centers and the format is minimized, and outputs the estimated reference points to the data reading section 42.

The pattern dot detecting section 126 will be described in detail next.

The pattern dot detecting section 126 has a black dot detecting section 132 for detecting black dots at dot read points determined by the approximate centers of a marker pair and the format. As shown in FIG. 65, when no black dots are detected at a dot read point 134 at which black dots are to be detected, the black dot detecting section 132 searches four pixels near the dot read point 134 for a black pixel in the order of numbers 1 to 4 in FIG. 65. If a black pixel is detected, the pixel set as a dot. That is, each dot constituting the pattern dots 14 is detected as the pixel value of a dot read point which satisfies a predetermined positional relationship with respect to an approximate marker center. If, therefore, no black dot is detected at a dot read point at which a black dot is to be detected, the dot read point is considered to be offset, and a search for a dot is made while the dot read position is shifted one pixel at a time in the vertical and horizontal directions.

As described above, even if a calculated approximate marker center is offset because of noise or the like, or the dot read point 134 calculated by dividing the distance between approximate centers at a predetermined ratio is offset, the pattern dots 14 can be reliably detected by searching for a black dot near the point. This prevents a deterioration in precision due to a decrease in the number of detected dots.

When a dot is detected at a pixel near the dot read point 134 in this manner, the corresponding offset amount is preferably stored to be given as an offset to the next dot read point 134.

More specifically, for example, when the dot indicated by the black circle on the left side of FIG. 66 is the dot read point 134 obtained by calculation, since no black pixel is present at the point, a search for a black dot is made. If a dot is detected at a position offset from the dot read point 134 to the left by one pixel, the position offset to the left by one pixel is stored as an offset. Even if the next dot read point 134 is the point indicated by the white circle in FIG. 66 according to the initial calculation, a point offset from that point to the left by one pixel is set as the dot read point 134 to perform a read operation.

That is, when a given dot is detected with an offset, it is highly possible that an adjacent dot is detected with an offset, the processing amount can be decreased by reading a point to which an offset is given in advance rather than searching for the calculated dot read point 134.

As described above, when a given one of the pattern dots 14 is detected at an offset position, a dot near the detected dot is often offset. For this reason, when a dot is detected at a position offset from the dot read point 134 obtained by calculation, the search efficiency can be improved by shifting the next dot read point 134 in accordance with the offset in advance. If a dot detection point is offset by distortion, offsets are accumulated to cause a failure to detect dots unless the dot read point 134 is shifted in accordance with the distortion amount. This can be prevented by shifting the read point.

As shown in FIG. 38, the marker center detecting section 56 may further include an approximate marker center re-calculating section 136 for re-calculating an approximate marker center on the basis of a data read reference point obtained by the error minimizing section 130.

That is, each dot constituting the pattern dots 14 is detected as the pixel value of the dot read point 134 which satisfies a predetermined positional relationship with an approximate marker center. When only several dots can be detected, the approximate marker center is regarded as an offset center, and an approximate marker center is re-calculated by using only the read dots. Each dot is then detected by reading the pixel value of the dot read point 134 which satisfies the predetermined positional relationship with the approximate marker center obtained in this manner.

For example, an approximate marker center is detected, as indicated by "x" on the upper side of FIG. 67, and the first read operation for the pattern dots 14 is performed. At this time, if the approximate marker center position on the right side is detected with an offset, dots near the approximate marker center on the right side are omitted even though dots near the approximate marker center on the left side can be detected. When the center positions of the dot read in this manner are calculated by the dot center calculating section 128, and a data read reference point is estimated by the error minimizing section 130, the estimated data read reference point includes a large error because the number of detected dots is small. For this reason, the approximate marker center re-calculating section 136 causes the pattern dot detecting section 126 to detect the pattern dots 14 again by using this data read reference point as a new approximate marker center. With this operation, as indicated on the lower side of FIG. 67, all the pattern dots 14 can be detected to allow estimation of a data read reference point with high precision.

By re-calculating an approximate center from several pattern dots detected by the first read operation in this manner, the precision of the approximate center can be improved, and the number of re-detected dots can be increased.

The black dot detecting section 132 detects only black dots, and hence may detect a white dot as a black dot because of dirt or the like. For this reason, the pattern dots 14 may be constituted by signals and error detection codes to allow error detection processing on the basis of signals representing detected black dots so that dot center calculation can be performed with respect to only points as black dots.

More specifically, as shown in FIG. 38, in the pattern dot detecting section 126, a detection result obtained by the black dot detecting section 132 is input to a buffer 138 in the form a signal. For example, the detection result is rearranged into "1,0,0,1,1,0,0" with "1" representing a black dot. Since this form is of a signal, error detection can be performed. An error detecting section 140 therefore performs error detection. If there is a black dot which has been erroneously detected, a selecting section 142 selectively supplies the output from the black dot detecting section 132 to the dot center calculating section 128 so as not to use the erroneous black dot, i.e., not to supply it to the dot center calculating section 128.

As described above, after dots are detected, only correct dots are selected from the detected dots by error detection. With this operation, even if the pattern dots 14 have information, since a position where the dots are correctly detected can be determined, a deterioration in data read reference point due to noise can be prevented.

The dot center calculating section 128 will be described next.

When a dot printed in the form of a circle is coarsely imaged by a CCD camera, and the obtained data is binarized, the resultant pattern is not circular. For this reason, the dot center cannot be easily calculated.

Figure 68A:
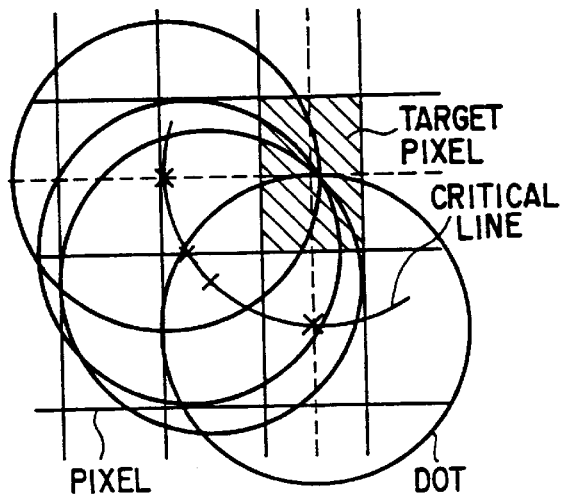
FIGS. 68A and 68B are views for explaining an operation of estimating a dot center position existing area, which is performed by a dot center position calculating section.

Assume that ideal binarization is performed. In this case, if half of a pixel crosses a dot, as shown in FIG. 68A, the pixel is turned on. The dot center position existing range in which a given pixel is turned on can therefore be defined. More specifically, assuming that the locus of a dot center obtained when half of a pixel crosses the dot is regarded as a critical line, the pixel is turned on when the dot center is inside the critical line (on the target pixel side), and is turned off when the dot center is outside the critical line. Consider a given pattern. When dot center position existing ranges are obtained with respect to an ON pixel in the pattern and OFF pixels around the ON pixel, a dot center position can be estimated as an overlapping area.

Figure 68B:
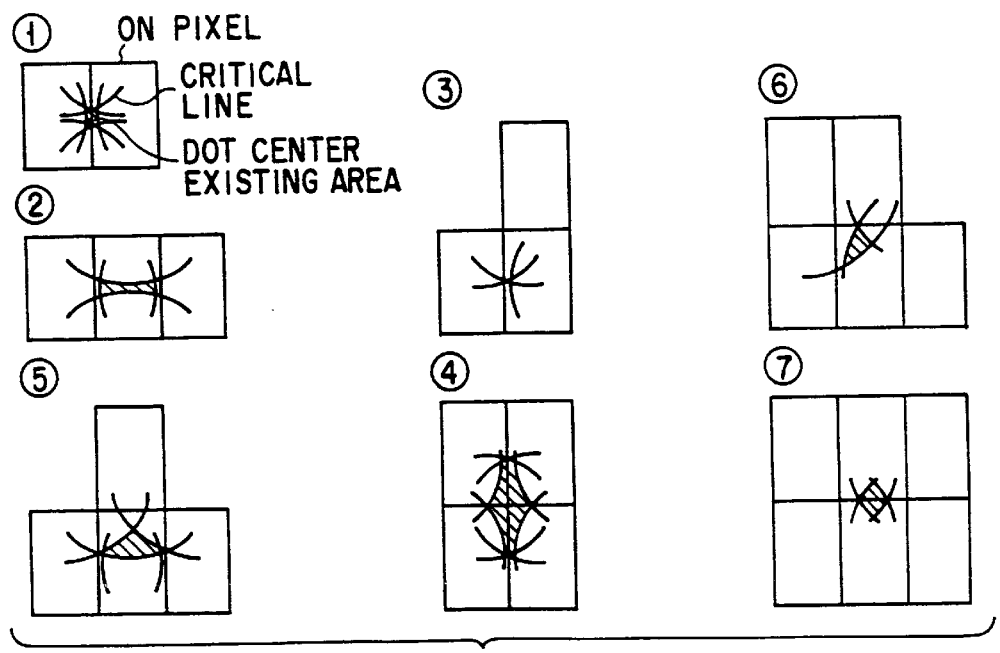

Assume that one pixel is imaged with a size of two pixels (in the vertical direction)×three pixels (in the horizontal direction), and ideal binarization is performed. In this case, only seven types of pixel patterns appear, as indicated by the encircled numbers ①to ⑦ in FIG. 68B. As shown in FIG. 68B, each dot center position existing area can be estimated.

The dot center calculating section 128 holds a table representing the relationship between such pattern shapes and dot center existing areas.

As described above, a center position existing area can be obtained from a pattern shape obtained by binarizing a dot whose shape is known. By setting a point in this area as a representative central point, a dot center can be estimated with higher resolution than the inherent resolution even by coarse sampling.

As described above, when one dot is imaged with a size of two pixels×three pixels, only seven patterns appear. If, however, imaging is performed with higher resolutions of, e.g., three pixels×three pixels and four pixels×three pixels, the number of patterns exponentially increase with an increase in resolution. In order to hold a corresponding table as in the above case, a memory having a very large capacity is required.

For this reason, the dot center calculating section 128 may calculate the centroid of an imaged dot and uses the centroid as a dot center. With this operation, the dot center calculating section 128 need not hold a table representing the relationship between dot shapes and representative points, and hence no memory is required. In addition, since one dot may be imaged without a predetermined resolution, i.e., a specific pixel matrix size, scalability, i.e., the ability to cope with variations in the magnification of an optical system and the diameter of a dot, can be obtained.

In performing such centroid calculation, as shown in FIG. 69, a mask 144 having a predetermined size, e.g., 4×4, may be applied to the dot read point 134, and a centroid 146 may be calculated by using only the pixels within the mask.

Centroid calculation will be described below with reference to the case in FIG. 69.

Referring to FIG. 69, 11 black pixels are present in the mask. When these pixels are seen in the row direction, one black pixel is present on the row above the row of the dot read point 134. A row weighting coefficient "−1" of this row and "1 (pixel)" are therefore multiplied, and the result is temporarily stored. Similarly, since four black pixels are present on the row below the row of the dot read point 134, row weighting coefficients "1" and "4" are multiplied, and the resultant data is added to the temporarily stored result. Similarly, with regard to the row two rows below the row of the dot read point 134, three black pixels are multiplied by a row weighting coefficient "2", and the resultant data is added to the temporarily stored result. The sum obtained in this manner is divided by the number of black pixels to obtain "9/11", which corresponds to the offset of the centroid 146 from the dot read point 134 in the y direction.

The offset in the x direction is calculated in the same manner. As a result, "(−1×3+1×3+2×1)/11=2/11" is obtained, which corresponds to the offset of the centroid 146 from the dot read point 134 in the x direction.

When an area for center calculation is limited by the mask 144 having an appropriate size, the influence of an error caused by noise (stain) on the estimation of a read reference point can be reduced.

In this case, in order to reduce the influence of noise, the size of the mask 144 is preferably set to be as close to the size of a dot as possible. Assume, however, that the size of the mask 144 is set to be equal to that of a dot. In this case, if the dot read point 134 is not detected at a position near the centroid, the mask is positioned at an offset position, and pixels for centroid calculation are also offset. As a result, the calculated centroid includes a larger error.

For this reason, as shown in FIG. 70A, the mask 144 is applied first at a position based on the dot read point 134 to detect the offsets of the dots within the mask. The mask 144 is then moved in a direction to eliminate the offsets, as shown in FIG. 70B. Thereafter, the centroid is calculated. With this operation, even if the size of the mask 144 is set to be equal to that of a dot, an accurate centroid can be calculated.

In this case, the moving amount of the mask 144 in the horizontal (vertical) direction is calculated by referring to the table shown in FIG. 70C, in which "o" indicates that at least one black pixel is present in a column (row), and "x" indicates that no black pixel is present.

This operation will be described in detail below with reference to FIGS. 70A, 70B, and 70C.

FIG. 70A shows a case wherein the pattern dots 14 are offset to a lower left position. In this case, nine black pixels are present in the mask.

When the pixels in the mask are checked in the row direction, three black pixels, three black pixels, and no black pixel are respectively detected on the row above the row of the dot read point 134, the row below the row the dot read point 134, and the row two rows below the row of the dot read point 134. In this case, since no black pixel is present on the row two rows below the row of the dot read point 134, the mask position is shifted upward by one row.

Similarly, when the pixels in the mask are checked in the column direction, no black pixel, three black pixels, and three black pixels are respectively detected on the column shifted to the left from the column of the dot read point 134 by one column, the column shifted to the right from the column of the dot read point 134 by one column, and the column shifted to the right from the column of the pattern dots 14 by two columns. In this case, the mask 144 is shifted to the right by one column.

FIG. 70C shows a table summarizing these relationships.

As described above, the mask 144 is applied with reference to the position of a detected dot to detect the offset of the dot within the mask. After the mask 144 is moved in a direction to eliminate the offset, the center of the dot is calculated. That is, by determining a mask position with two paths, the mask size can be decreased in accordance with the dot size. Therefore, a memory having a small capacity can be used, and a reduction in error due to noise can be attained.

Figure 71:
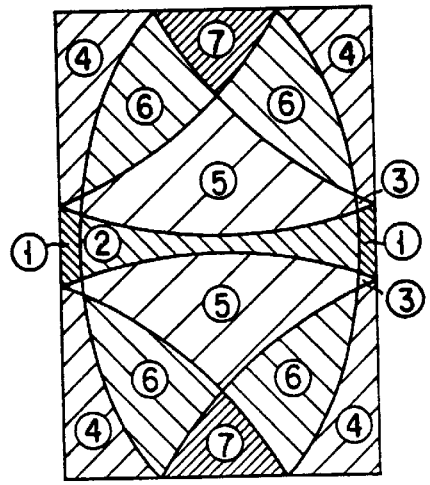
FIG. 71 is a view for explaining a dot center position existing area and the reliability of each representative central point.

When a center position existing area is obtained from a pattern shape obtained by binarizing a dot whose shape is known, the center existing area varies in size depending on a pattern. As shown in FIG. 71, therefore, each representative central point may be weighted in accordance with the size of the center existing area to reflect the resultant accuracy in the detection of a true marker center.

Consider the pattern indicated by encircled number ③ in FIG. 68B. The dot center existing area is a very small area, and hence the reliability is very high. In the case of the pattern indicated by encircled number ④ in FIG. 68B, the dot center existing area is a very large area, and hence the reliability is very low. For this reason, weighting is performed in accordance with the areas of the center existing areas. If, for example, the weight for the representative central point of the pattern indicated by encircled number ④ is set to be "1", "2.5" is set for the pattern indicated by number ①; "1.5", for the pattern indicated by number ②; "5.0", for the pattern indicated by number ③; "1.3", for the pattern indicated by number ⑤; "1.3", for the pattern indicated by number ⑥; and "1.5", for the pattern indicated by number ⑦. By weighting the representative central points in this manner, the reliability of an obtained data read reference point can be calculated in accordance with the reliability corresponding to each dot shape.

The estimation precision can be improved by estimating a data read reference point using the degrees of reliability of representative central points of detected dots, which are different from each other depending on the pattern shapes of the dots.

As shown in FIG. 72, the error minimizing section 130 determines a data read reference point such that the error between the central point (representative centroid point position 150) actually calculated by the dot center calculating section 128 on the basis of an approximate marker center in the above manner and the estimated central point of the dot determined by an estimated data read reference point (an true marker center 152 in this case) and the format is minimized. In this case, a data read reference point can be calculated with a very high precision by using the least squares method.

A method of calculating a data read reference point (a true marker center in this case) by using the least mean-square method will be briefly described below.

Let $\hat{M}_1$ be an estimated true marker center on the left side, $\hat{M}_2$ be an estimated true marker center on the right side, $D_i$ be the center of the ith dot of the pattern dots 14, and $d_i$ be the inter-marker division ratio of the ith dot of the pattern dots 14, as shown in FIG. 73.

A dot center $\hat{D}_i$ obtained from the estimated true marker centers $\hat{M}_1$ and $\hat{M}_2$ is given by:

$$\hat{D}_i = \hat{M}_1 + (\hat{M}_2 - \hat{M}_1)d_i$$

$$\begin{cases} \hat{x}_i = \hat{x}_1 + (\hat{x}_2 - \hat{x}_1)d_i = (1 - d_i)\hat{x}_1 + d_i\hat{x}_2 \\ \hat{y}_i = \hat{y}_1 + (\hat{y}_2 - \hat{y}_1)d_i = (1 - d_i)\hat{y}_1 + d_i\hat{y}_2 \end{cases}$$

By using an estimated error $\epsilon_i$ with respect to the dot pattern center $D_i$, a square-sum E of the error is expressed as:

$$E = \sum_{i=1}^{N} e_i^2, \; e_i = |\hat{D}_i - D_i|$$

The estimated true marker centers $\hat{M}_1$ and $\hat{M}_2$ which minimize the square-sum E are obtained as follows:

$$E = \sum_{i=1}^{N} \{(\hat{x}_i - x_i)^2 + (\hat{y}_i - y_i)^2\} \quad (1)$$

$$\frac{\partial E}{\partial \hat{x}_1} = \sum_{i=1}^{N} 2\{(1 - d_i)\hat{x}_1 + d_i\hat{x}_2 - x_i\}(1 - d_i) = 0$$

$$\rightarrow \hat{x}_1 \sum_{i=1}^{N}(1 - d_i)^2 + \hat{x}_2 \sum_{i=1}^{N}(1 - d_i)d_i - \sum_{i=1}^{N} x_i(1 - d_i) = 0$$

$$\frac{\partial E}{\partial \hat{x}_2} = \sum_{i=1}^{N} 2\{(1 - d_i)\hat{x}_1 + d_i\hat{x}_2 - x_i\}d_i = 0 \quad (2)$$

$$\rightarrow \hat{x}_1 \sum_{i=1}^{N}(1 - d_i)d_i + \hat{x}_2 \sum_{i=1}^{N} d_i^2 - \sum_{i=1}^{N} x_i d_i = 0$$

In this case, if $$\sum_{i=1}^{N}(1-d_i)^2 = A,$$

$$\sum_{i=1}^{N}(1-d_i)d_i = B,$$

$$\sum_{i=1}^{N}d_i^2 = C,$$

$$\sum_{i=1}^{N}x_i(1-d_i) = P,$$

$$\sum_{i=1}^{N}x_i d_i = Q$$

Then, according to equation (1), $$A\hat{x}_1 + B\hat{x}_2 = P \qquad (3)$$

according to equation (2), $$B\hat{x}_1 + C\hat{x}_2 = Q \qquad (4)$$

according to (3)×C−(4)×B, $$(AC - B^2)\hat{x}_1 = CP - BQ \rightarrow \hat{x}_1 = \frac{CP - BQ}{AC - B^2}$$

according to (4)×A−(3)×B, $$(AC - B^2)\hat{x}_2 = AQ - BP \rightarrow \hat{x}_2 = \frac{AQ - BP}{AC - B^2}$$

Similarly, if $$\sum_{i=1}^{N} y_i(1-d_i) = R,$$

$$\sum_{i=1}^{N} y_i d_i = S$$

Then, $$\hat{y}_1 = \frac{CR - BS}{AC - B^2}, \hat{y}_2 = \frac{AS - BR}{AC - B^2}$$

In this manner, position coordinates $(\hat{x}_1, \hat{y}_1)$ and $(\hat{x}_2, \hat{y}_2)$ the estimated true marker centers $\hat{M}_1$ and $\hat{M}_2$ are calculated.

As described above, the uncertainty of the calculated center position of each pattern dot is canceled out by minimizing the square-sum of the offset amount using the least mean-square method, thereby improving the estimation precision of a data read reference point.

The following method is a method of simplifying the mathematical expressions.

In the coordinate system on a recording medium, let $D_{di}(u_i)$ be a design dot position, U be the first unit vector, and O be the origin position, as shown in FIG. 74A. In the coordinate system on an image pickup plane, let $D_{oi}(x_i, y_i)$ be an observed dot position, $\hat{U}(\hat{u}_x, \hat{u}_y)$ be the first estimated unit vector, $(\hat{o}_x, \hat{o}_y)$ be an estimated origin position, and $\hat{D}_{oi}(x_i, y_i)$ be an estimated dot position, as shown in FIG. 74B.

In this case, the estimated dot position oi obtained from the design dot position, the estimated reference point position, and the unit vector is given by:

$$\hat{D}_{oi} = \hat{U} D_{di} + \hat{O}$$

$$\begin{cases} \hat{x}_i = \hat{u}_x u_i + \hat{o}_x \\ \hat{y}_i = \hat{u}_y u_i + \hat{o}_y \end{cases}$$

In addition, by using an estimated error $\epsilon_i$ with respect to the observed dot position $D_{oi}$, the square-sum E of the error is expressed as:

$$E = \sum_{i=1}^{N} \varepsilon_i^2, \varepsilon_i = |\hat{D}_{oi} - D_{oi}|$$

The positions $\hat{U}$ and $\hat{O}$ which minimize this square-sum E are obtained as follows:

$$E = \sum_{i=1}^{N} \{(\hat{x}_i - x_i)^2 + (\hat{y}_i - y_i)^2\} \qquad (5)$$

$$\frac{\partial E}{\partial \hat{u}_x} = \sum_{i=1}^{N} 2(\hat{u}_x u_i + \hat{o}_x - x_i) u_i = 0$$

$$\rightarrow \hat{u}_x \sum_{i=1}^{N} u_i^2 + \hat{o}_x \sum_{i=1}^{N} u_i - \sum_{i=1}^{N} x_i u_i = 0$$

$$\frac{\partial E}{\partial \hat{o}_x} = \sum_{i=1}^{N} 2(\hat{u}_x u_i + \hat{o}_x - x_i) = 0 \qquad (6)$$

$$\rightarrow \hat{u}_x \sum_{i=1}^{N} u_i + \hat{o}_x N - \sum_{i=1}^{N} x_i = 0$$

In order to independently obtain the positions $\hat{U}$ and $\hat{O}$, $$u_i \rightarrow u_i - \bar{u}$$

Then, equations (5) and (6) are rewritten as follows:

$$\hat{u}_x \sum_{i=1}^{N}(u_i - \bar{u})^2 = \sum_{i=1}^{N} x_i(u_i - \bar{u}) \rightarrow \hat{u}_x = \frac{\sum_{i=1}^{N} x_i(u_i - \bar{u})}{\sum_{i=1}^{N}(u_i - \bar{u})^2} \qquad (7)$$

$$\hat{o}_x \sum_{i=1}^{N} x_i = \rightarrow \hat{o}_x = \frac{\sum_{i=1}^{N} x_i}{N} = \bar{x} \qquad (8)$$

Similarly, $$\hat{u}_y = \frac{\sum_{i=1}^{N} y_i(u_i - \bar{u})}{\sum_{i=1}^{N}(u_i - \bar{u})^2} \qquad (9)$$

$$\hat{o}_y = \frac{\sum_{i=1}^{N} y_i}{N} = \overline{y} \qquad (10)$$

The positions û and ô can be obtained while the calculation amount is reduced in this manner.

A case wherein a marker pair and ten dot patterns are arranged according to the relationship shown in FIG. 75 will be described below.

Dot read points Ui of the respective pattern dots are respectively expressed by 7, 10, 13, 16, 19, 24, 27, 30, 33, and 36 with respect to the approximate marker center on the left side, and N=10. Therefore, $$\overline{u} = \sum_{i=1}^{N} \frac{u_i}{N} \qquad (11)$$

That is, =21.5.

If, however, the pattern dot detecting section 126 fails to detect the second ($U_i$=10) dot from the left owing to dot omission, dirt, or the like, N is 9, and the points Ui are 7, 13, 16, 19, 24, 27, 30, 33, and 36. In this case, since N=9, the solution of equation (11) is "22.78".

That is, when the pattern dot detecting section 126 detects all the ten dots, the following denominator in equations (7) and (9) has a fixed value of "902.5":

$$\sum_{i=1}^{N} (u_i - \overline{u})^2 \qquad (12)$$

However, every time a few dots cannot be detected, the corresponding calculation is required.

The dot code is often printed on a medium such as paper. For this reason, dots may be omitted depending on the printing conditions or the manner of handling the code after printing. In practice, all the ten dots may not be detected.

The apparatus therefore needs a means for calculating mathematical expression (12). This calculation is processing of adding squares, and hence the value of each term is large. In consideration of calculation precision, a register having a considerably large number of bits is required. Consequently, the size of hardware actually realizing a device is large.

For this reason, when a given dot is not detected by a dot detecting operation, a dot read point is set as the center of the given dot, and processing is performed assuming that all the dots are detected.

With this method, since N=10 is always set, and the solution of mathematical expression (12) becomes "902.5", all the denominators in equations (7) to (10) have fixed values.

That is, no means is required to calculate mathematical expression (12). In addition, divisions in equations (7) to (10) are performed with constants and hence can be replaced with multiplications of the reciprocals, thereby making this system more suitable for hardware.

Figure 76:
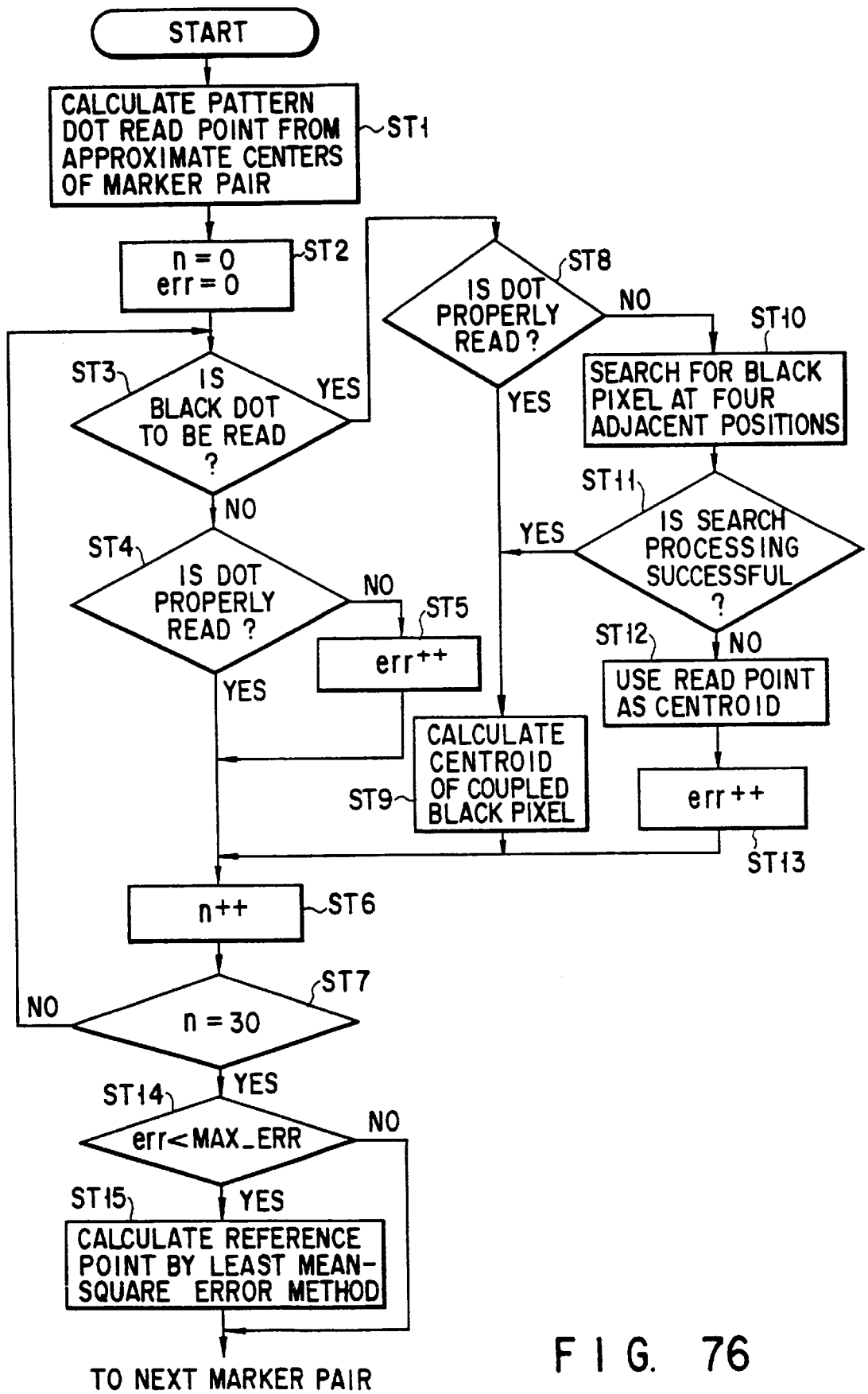
FIG. 76 is a flow chart showing an operation in a case wherein when a given dot is not detected in a dot detecting operation, the dot read point is regarded as the center of the dot, and processing is performed assuming that all dots are detected.

This method will be described below with reference to the flow chart in FIG. 76.

First of all, read points for the ten pattern dots are calculated from the approximate centers of the marker pair (step ST1). In this case, the read points include not only black dots but also white pixels therebetween. A dot detection counter n and a detection error counter err are then reset to "0" (step ST2).

Subsequently, 30 read points are sequentially processed. In this process, it is checked whether the current point is a point on a black dot (step ST3). If NO in step ST3, it is checked whether the current pixel is white or black (step ST4). If the pixel is black, it indicates that a point which is not a dot is read as a black pixel. It is therefore determined that an error has occurred, and the detection error counter err is counted up (step ST5). If the pixel is white, the counter is not counted up. The number of read pixels is then incremented, i.e., the dot detection counter n is counted up (step ST6), and whether all the pixels are read is determined by checking whether the dot detection counter n is "30" (step ST7). If the number of processed pixels is less than "30", the flow returns to step ST3 to process the next read point.

If it is determined in step ST3 that the read pixel is on a black dot, whether the dot is correctly read is determined by checking whether the read pixel is black (step ST8). If it is determined that the dot is correctly read, the centroid of the coupled pixels is calculated (step ST9).

If it is determined in step ST8 that the dot is not correctly read, four pixels adjacent to the read point are searched for a black pixel (step ST10). If a black pixel is searched out (step ST11), the flow advances to step ST9 to calculate the centroid of the coupled pixels. If no black pixel is searched out, the dot read point is regarded as a dot center (step ST12), and the detection error counter err is counted up (sep ST13). The flow then advances to step ST6 to count up the dot detection counter n for counting read pixels. In step ST7, whether all the pixels are read is determined by checking whether the dot detection counter n is "30". If the number of processed pixels is less than "30", the flow returns to step ST3 to process the next read point.

When all the pixels are read in this manner, the sum of the number of black pixels in pixels which are not dots and the number of black pixels not present in dot positions and four adjacent pixels, i.e., the value of the detection error counter err is compared with a threshold (MAX_ERR) (step ST14). Note that it is known that the appropriate value of the threshold MAX_ERR is about 25.

If the value of the detection counter err is smaller than the threshold, a data read reference point is calculated by the least mean-square method using the ten dot centers (step ST15). If the counter err exceeds the threshold, it is determined that a data read reference point cannot be detected with a desired precision by using the pattern codes, and processing of the next marker pair is started.

When a data read reference point is calculated in the above manner, the data reading section 42 causes an address dot read section 154 to read the address dots 18 on the basis of this data read reference point to obtain a block address, and causes a data read section 156 to read the data dots of the block 20, as shown in FIG. 25. The data reading section 42 supplies the read data to the data reproduction section 44 to reproduce the data.

In this case, the address dot read section 154 is constituted by an address dot reading section 158, an error correcting section 160, a checking section 162, and an address determining section 164.

The address dot reading section 158 detects the address dots 18 by dividing the true centers of vertically adjacent markers to read an address. If the read address coincides with the address of a block which has already been read, the processing is stopped, and processing of the next frame is started. In this address dot read operation, similar to the above read operation for the pattern dots 14, the tree search method may be used.

When a CRC (error detection) code or a BCH (error detection) code is added to the address dots 18, the error correcting section 160 checks whether the correct address is read by the address dot reading section 158, or corrects the read address.

The checking section 162 checks whether the address is within the range of the addresses of data to be handled by the system. For example, in the system designed to handle only data from addresses "0" to "100", an address such as "−5" or "200" is excluded. Assume that it is known that only ten blocks can be set in one frame, and addresses are sequentially recorded. In this case, if, for example, "2", "3", "5", "6", "25", and "9" are obtained as addresses, it can be determined from continuity and the like that address "25" is outside the range, and hence the data of a block having address "25" is excluded.

The address determining section 164 supplies the address, which is determined as a correct address by the checking section 162, to the data read section 156.

If an error is detected in the address dots 18 read by the address dot reading section 158, the error correcting section 160 can correct the error by calculating the address of the block on the basis of the addresses of adjacent blocks. By using this function, addresses may be read by the address dot reading section 158 while some addresses are properly omitted, thereby simultaneously determining the addresses of at least two blocks. When blocks are recorded to be arranged in the address order, the address of a given block can be easily estimated from the addresses of adjacent blocks. For this reason, even if the address dots 18 are read while some dots are properly omitted, no problem is posed. The amount of address read processing can be reduced accordingly. In addition, as shown in FIG. 24, the address dots 18 can be thinned out and recorded.

Figure 77:
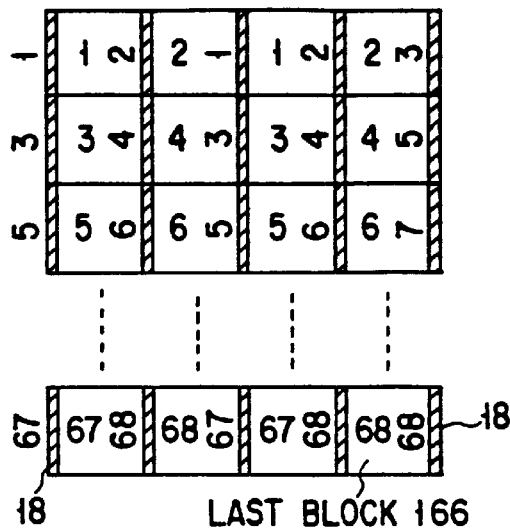
FIGS. 77 and 78 are views each showing the arrangement order of blocks and contents of recorded block addresses.

As shown in FIG. 77, the address dots 18 recorded on the left side of each of the blocks 20 constituting the code are the address of each block. The address of the next block is recorded on the rightmost address code of codes recorded with a double height as described above. The address dots 18 recorded on the right side of a last block 166 are the address of the last block. The last block 166 can therefore be detected by comparing the contents of the left and right addresses of the block 20 when it is read.

Figure 78:
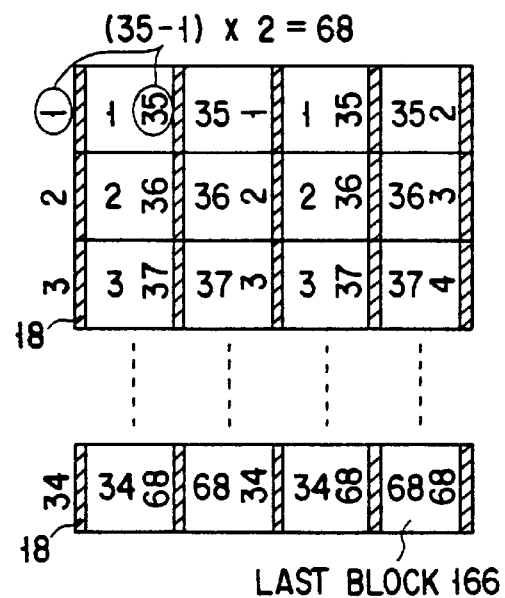

Alternatively, as shown in FIG. 78, a relative relationship indicating the last block address may be set between the addresses of a read block pair so that the last block can be detected by comparing the contents of the addresses of a block pair when they are read.

For example, in recording 68 blocks with double height, the blocks of addresses "1" to "34" are arranged in a column, the blocks of addresses "35" to "68" are arranged in a column, and these columns are recorded double, i.e., with a double height. In this case, since the adjacent blocks of addresses "1" and "35" are detected from the first received frame image, it can be immediately determined that one column consists of "35−1" blocks, i.e., 34 blocks, and a total of 68 blocks are present (34 blocks×2 columns). Therefore, a specific memory capacity to be ensured and a specific block at which the processing is to be terminated can be determined first. This makes it possible to omit unnecessary processing.

As is apparent, the same applies to a case wherein a code is not recorded with a double height.

As described above, according to the format of the address dots 18, a code is recorded such that the addresses of adjacent blocks have a predetermined relationship with the total number of blocks of the code. The total number of blocks can therefore be obtained from the addresses of adjacent blocks. This makes it possible to assign a necessary memory. In addition, the last block can be detected, thereby allowing omission of unnecessary processing.

Alternatively, the address dots 18 may be recorded in a format which allows determination of the total number of blocks, e.g., 1/68, 2/68, 3/68, . . .

Figure 79:
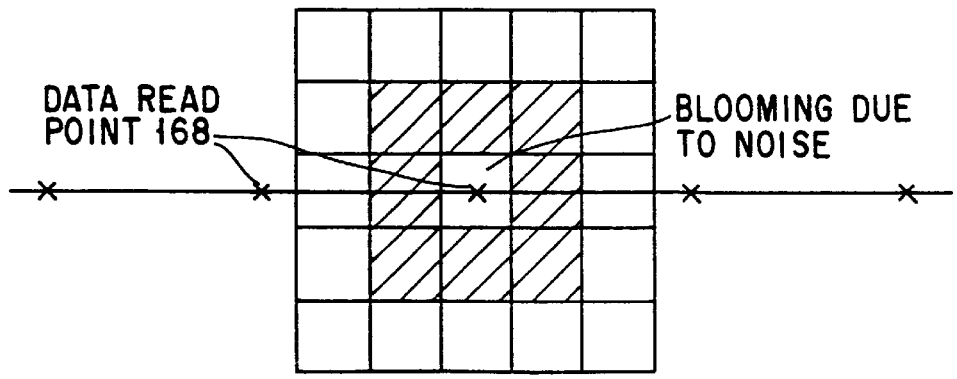
FIG. 79 is a view for explaining a data dot read operation.

The data read section 156 equally divides each side of an area defined by connecting four data read reference points to form a mesh pattern, and read a data code by using the resultant data read points. In this case, as shown in FIG. 79, the pixel at a data read point 168 may be read as data different from the actual data owing to noise or the like.

For this reason, instead of using the data at the data read point 168 as the read data, eight pixels around the data read point 168 are used as follows. A predetermined calculation expression is applied to a total of nine pixels. For example, an average pixel value is obtained. With this operation, the data of this pixel is determined. Assume that blooming occurs in the pixel at the data read point 168. Even in this case, if the eight pixels around the point are black, the data at the data read point 168 becomes 8/9. Since this value is larger than 0.5, the data can be read as a black pixel, i.e., "1".

As the predetermined calculation expression, an expression for weighted mean or the like may be used. For example, an area slightly larger than the above area, e.g., neighboring 24 pixels, may be used. In this case, the data of the eight pixels on the central portion of the area may be multiplied by "2", and the data of the 16 pixels on the peripheral portion of the area may be multiplied by "1". The average of the resultant data may be calculated.

As described above, pixels around a read point calculated from a data read reference point are also read simultaneously, and the attribute of the data read point is determined by a predetermined calculation expression, thereby enhancing the ability to read degraded dots.

Although the present invention has been described above with reference to the embodiments, the present invention is not limited to the embodiments described above. Various changes and modifications can be made within the gist of the present invention. The gist of the present invention will be briefly described below.

(1) An information recording medium on which a dot code is recorded, the dot code being constituted by a data code corresponding to contents of multimedia information to be reproduced, and a pattern code for determining a read reference point, is characterized in that the pattern code includes:

pattern dots arranged at predetermined positions with respect to the data code; and markers arranged at predetermined positions with respect to the pattern dots and used to detect the pattern dots.

According to this arrangement, with the use of markers for detecting pattern dots, even pattern dots similar to dots constituting a data code can be detected.

(2) The information recording medium according to arrangement (1) is characterized in that the dot code is formed by two-dimensionally arranging a plurality of blocks, each having the data code consisting of a plurality of dots in a predetermined area, and the markers are arranged on part of each block to allow determination of a relative positional relationship between the respective blocks, According to this arrangement, block boundaries can be easily extracted by using markers.

(3) The information recording medium according to arrangement (2) is characterized in that the block has a rectangular shape, and the markers are arranged on vertexes which define different opposite sides between adjacent blocks in a first direction, and which define the same opposite sides between adjacent blocks in a second direction perpendicular to the first direction (i.e., arranged in the form of a striped pattern).

According to this arrangement, the number of markers each requiring a large area can be reduced to ½ that required when markers are arranged on the four corners of each rectangular block. Data dots can also be arranged at the positions where markers are omitted. The recording capacity can therefore be increased accordingly.

(4) The information recording medium according to arrangement (2) is characterized that the block has a rectangular shape, and the markers are arranged on vertexes which define different opposite sides between adjacent blocks (i.e., arranged in the form of a checkered pattern).

According to this arrangement, the number of markers each requiring a large area can be reduced to ½ that required when markers are arranged on the four corners of each rectangular block. Data dots can also be arranged at the positions where markers are omitted. The recording capacity can therefore be increased accordingly.

(5) The information recording medium according to arrangement (1) is characterized in that the pattern dots have a format corresponding to a code having adjacent dots arranged to be separated from each other.

According to this arrangement, the center of each of dots constituting a pattern dot can be accurately obtained by a relatively easy calculation, e.g., a calculation for the centroid or the center of a circumscribed rectangle.

According to this arrangement, even if information (address information or header information) is recorded on a pattern code, black dots can be prevented from being coupled and inseparable.

(6) The information recording medium according to arrangement (1) is characterized in that the pattern dots have a format corresponding to a code which is modulated such that adjacent dots can be separated from each other.

According to this arrangement, even if information (address information or header information) is recorded on a pattern code, black dots can be prevented from being coupled and inseparable.

(7) The information recording medium according to arrangement (1) is characterized in that the pattern dots constitute a special code having a positional relationship or structure which allows estimation of a position of a read reference point.

According to this arrangement, as pattern dots, not only an array of dots but also another form may be used as long as it allows estimation of a read reference point. A read reference point can be easily estimated by using such pattern dots.

(8) The information recording medium according to arrangement (7) is characterized in that the special code is formed by setting phase offsets at recording points for at least some of the pattern dots.

According to this arrangement, since various phase offsets are provided, the detection conditions for pattern dots are made stricter. This makes it possible to improve the read reference point estimation precision.

(9) The information recording medium according to arrangement (7) is characterized in that the special code is recorded with at least some pattern dots having a smaller diameter than the remaining pattern dots.

According to this arrangement, by recording a pattern dots with a smaller dot diameter, more pattern dots can be recorded in the same space, thereby increasing the recording density of pattern dots.

In addition, since the detection conditions for pattern dots are made stricter, the read reference point estimation precision can be improved.

(10) The information recording medium according to arrangement (7) is characterized in that the special code is recorded with at least some pattern dots near a center of the code having a larger diameter than the remaining pattern dots.

According to this embodiment, in detecting pattern dots on a line connecting the approximate centers of a marker pair, since pattern dots near the center, which are difficult to detect, are recorded in advance to have a large size, a failure to detect the pattern dots can be prevented.

In addition, the pattern dots near the center may be detected first, and the remaining dots may be coarsely detected.

(11) The information recording medium according to arrangement (1) is characterized in that the data code is recorded for at least not less than one block, the data code of each block is constituted by address dots indicating an address of the block, and the address dots have a format corresponding to a code at least partially including a fixed pattern.

According to this arrangement, a fixed pattern can be used for positioning and error detection.

(12) The information recording medium according to arrangement (1) is characterized in that the data code is recorded in units of at least not less than one block, the data code of each block is constituted by address dots indicating an address of the block, and the address dots have a format for recording address dots while properly omitting some dots to simultaneously determine addresses of at least not less than two blocks.

According to this arrangement, when blocks are recorded to be arranged in the address order, the address of a given block can be easily estimated from the addresses of neighboring blocks. For this reason, address dots can be properly omitted without posing any problem, and a data code can be recorded on each portion from which the dots are omitted, thereby increasing the recording capacity.

(13) An information reproduction system for optically reading and reproducing a dot code including a data code corresponding to contents of multimedia information to be reproduced from an information recording medium on which the dot code is recorded is characterized by comprising:

image input means for imaging the dot code;

data read reference point determining means for recognizing the pattern code from the image picked up by the image input means and determining a data read reference point for reading the data code;

data reading means for reading the data code on the basis of the data read reference point determined by the data read reference point determining means; and data reproduction means for reproducing the data read by the data reading means.

With this arrangement, a high-density dot code can be accurately read at high speed.

(14) The information reproduction system according to arrangement (13) is characterized in that the image input means includes binarizing means for binarizing an image.

According to this arrangement, an image obtained by imaging a dot code in the image input means is binarized, and only this binarized data is processed in the data read reference point determining means and the subsequent means. With this operation, the capacity of a memory for holding an image can be reduced, and high-speed processing can be realized. With the use of binarized data, the data read reference point determining means and the subsequent means can be constituted by an information processing apparatus such as a personal computer. In addition, since only the image input means can be housed in a separate housing, the operator can move the housing with less burden.

(15) The information reproduction system according to arrangement (13) is characterized in that the pattern code is constituted by pattern dots arranged at predetermined positions with respect to the data code, and markers arranged at predetermined positions with respect to the pattern dots and used to detect the pattern dots, and the data read reference point determining means includes marker detecting means having: marker extracting means for extracting the marker from the image picked up by the image input means; and approximate center calculating means for calculating an approximate center of the marker extracted by the marker extracting means.

According to this arrangement, by obtaining approximate marker centers, detection of pattern dots is facilitated.

(16) The information reproduction system according to arrangement (15) is characterized in that the marker extracting means includes means for performing erosion processing and labeling processing.

According to this arrangement, erosion processing can be performed by using various types of existing hardware. In addition, the influence of noise near markers can be reduced.

(17) The information reproduction system according to arrangement (15) is characterized in that the marker extracting means includes marker central portion detecting means for obtaining a minimum value of luminance of at least part of a frame, and performing binarization by using a threshold obtained by adding a predetermined offset to the minimum value.

According to this arrangement, the central portion of a marker can be detected without requiring calculation for erosion processing, steak processing, and the like.

(18) The information reproduction system according to arrangement (17) is characterized in that the marker central portion detecting means includes a low-pass filter.

According to this arrangement, when a given marker is recorded to have a larger size than the remaining dots, the central portion of the given marker can be detected more reliably.

(19) The information reproduction system according to arrangement (15) is characterized in that the marker extracting means includes means for obtaining a center calculation range by streak processing and the number of adjacent streaks.

According to this arrangement, since processing requiring a large calculation amount, e.g., erosion processing, need not be performed, the processing is facilitated. In addition, an increase in resistance to spot-like flaws is attained.

(20) The information reproduction system according to arrangement (15) is characterized in that the marker extracting means includes means for detecting at least not less than one marker, and means for searching for markers, with reference to the detected marker, in only a range in which other markers may be present.

According to this arrangement, since calculation for marker extraction need not be performed for the entire frame, the processing speed can be increased.

(21) The information reproduction system according to arrangement (15) is characterized in that the marker extracting means includes means for stopping processing of a frame when the number of markers detected in the frame is smaller than the number of markers required to form a block.

According to this arrangement, if a marker indispensable for constituting a block is not detected, it is known that the frame requires no subsequent processing. If, therefore, the processing of this frame is stopped, unnecessary processing can be omitted.

(22) The information reproduction system according to arrangement (15) is characterized in that the approximate center calculating means includes means for calculating a centroid of a marker.

According to this arrangement, since the centroid of all the black pixels in a marker existing area is set as an approximate center, the resistance to blooming noise, smearing noise, and glitch noise is high.

(23) The information reproduction system according to arrangement (15) is characterized in that the approximate center calculating means includes means for obtaining a circumscribed rectangle of a marker and calculating a center of the rectangle.

According to this arrangement, the calculation amount is smaller than that required when the centroid is calculated.

(24) The information reproduction system according to arrangement (15) is characterized in that the approximate center calculating means includes approximate center position correcting means for correcting an approximate center position of a marker which may be omitted at a frame end.

According to this arrangement, since the approximate center position of a marker crossing a frame end can be obtained assuming that no omission of the marker has occurred, pattern dots can be detected more reliably.

(25) The information reproduction system according to arrangement (24) is characterized in that the approximate center position correcting means is a table for outputting a predetermined correction amount in accordance with a distance from the frame end.

According to this arrangement, since a correction amount is obtained by using a look-up table, calculation for a correction amount is not required.

(26) The information reproduction system according to arrangement (24) is characterized in that the approximate center position correcting means includes means for selectively correcting only a marker as a processing target.

According to this arrangement, correction processing is performed for only markers associated with a block to be read instead of detecting markers requiring correction of approximate center positions from all the markers in a frame and correcting the detected markers. The calculation amount is therefore small.

(27) The information reproduction system according to arrangement (13) is characterized in that the pattern code is constituted by pattern dots arranged at predetermined positions with respect to the data code, and markers arranged at predetermined positions with respect to the pattern dots and used to detect the pattern dots, and the data read reference point determining means includes marker pair selecting means for selecting a marker pair to detect the pattern dots.

According to this arrangement, by selecting a marker pair, pattern dots can be detected more reliably.

(28) The information reproduction system according to arrangement (27) is characterized in that the marker pair selecting means includes means for calculating an existing area of marker to be paired in accordance with a specification skew angle and format information, and searching the existing area to detect marker candidates.

According to this arrangement, since detection of marker candidates need not be performed with respect to the entire frame, the search efficiency can be improved.

In addition, since areas to be searched are narrowed down to right and left adjacent marker existing areas, marker detection errors due to noise can be reduced. In other words, even if marker candidates are erroneously detected because of noise, the candidates can be excluded owing to the limitation on the format for forming a marker pair.

(29) The information reproduction system according to arrangement (27) is characterized in that the marker pair selecting means includes means for calculating positions of a marker to be paired by extrapolation.

According to this arrangement, marker omissions and marker detection errors due to noise are not easily caused.

In addition, a code from which markers are properly omitted can also be read.

(30) The information reproduction system according to arrangement (29) is characterized in that the marker position calculating means using extrapolation includes extrapolation vector calculating means for calculating an extrapolation vector from a positional relationship with a previously detected marker pair.

According to this arrangement, a set of markers constituting a block can be reliably detected in accordance with a marker pair.

(31) The information reproduction system according to arrangement (29) is characterized in that the marker position calculating means using extrapolation includes means for referring to an extrapolation vector for an immediately preceding frame from a second and subsequent frames.

According to this arrangement, since almost no change in skew occurs between consecutive frames, an extrapolation vector hardly changes. If, therefore, an extrapolation vector for the immediately preceding frame is used, no vector need not be obtained by calculation.

(32) The information reproduction system according to arrangement (30) or (31) is characterized in that the marker position calculating means using extrapolation includes means for correcting an extrapolation vector by using a marker center position detected on the basis of the extrapolation vector.

According to this arrangement, since processing is performed while an extrapolation vector is corrected, a marker can be reliably detected without being missed even in the presence of distortion and inclination.

(33) The information reproduction system according to arrangement (27) is characterized in that the marker pair selecting means includes base marker pair selecting means for selecting a series of marker pairs existing over at least not less than two blocks as base marker pair.

According to this arrangement, marker detection errors due to noise can be reduced owing to the limitation (a pair being limited) on the format for constituting base marker pair.

In addition, in the case of a code recorded with a double height, by selecting marker pairs existing over reproduction block rows as a base marker pair, a redundant read operation can be prevented.

Furthermore, by selecting marker pairs existing over a plurality of blocks, more pattern dots can be read to improve the data read reference point precision.

Moreover, since data read reference points can be simultaneously determined over a plurality of blocks, the calculation amount is small.

(34) The information reproduction system according to arrangement (33) is characterized in that the base marker pair selecting means includes reference marker selecting means for selecting one marker existing in a range in which at least adjacent markers on both sides in a direction perpendicular to a scan direction can be detected, and the reference marker selecting means includes means for selecting a reference marker from marker candidates in the scan direction, and selecting a base marker pair on the basis of the reference marker.

According to this arrangement, since a reference marker is selected in the range in which an adjacent marker can be detected, if an adjacent marker which should be detected is not detected, it can be estimated that the code protrudes from the frame, or some accident has occurred.

In addition, since a reference marker is selected from marker candidates in the scan direction, processing is started from a marker which has not been detected in the preceding frame. Redundant processing can therefore be prevented.

(35) The information reproduction system according to arrangement (33) is characterized in that the base marker pair selecting means includes reference marker selecting means for selecting one marker existing in a range in which at least adjacent markers on both sides in a direction perpendicular to a scan direction can be detected, and the reference marker selecting means includes means for, when only a marker on one side in the direction perpendicular to the scan direction can be detected with respect to the marker, replacing the reference marker with a detected adjacent marker and searching for a marker by extrapolation.

According to this arrangement, since blocks are read on the basis of reference markers, if a marker on a code end is selected as a reference marker, the number of blocks which can be read decreases. For this reason, if a selected reference marker is on a code end, another marker is selected. With this operation, more blocks can be read.

In addition, since search areas are narrowed down by extrapolation, marker detection errors due to noise can be reduced.

(36) The information reproduction system according to arrangement (35) is characterized in that the means for searching for a marker by extrapolation includes means for setting an extrapolation point as a virtual marker when a marker search area protrudes from a frame upon extrapolation.

According to this arrangement, even if a marker protrudes from a frame, pattern dots remaining in the frame can be used. Therefore, by providing a virtual marker in this manner, these pattern dots can be effectively used.

In addition, blocks are sequentially read with reference to a base marker pair by extrapolation. Even if a portion of a marker of a base marker pair protrudes from the frame, markers obtained by extrapolation and constituting blocks may enter the frame owing to skew. In this case, these blocks can be read.

(37) The information reproduction system according to arrangement (33) is characterized in that the base marker pair selecting means includes means for, when not less than two base marker pairs can be selected, re-selecting a base marker pair with which the possibility that more blocks can be read is high.

According to this arrangement, more read blocks can be extracted from one frame.

(38) The information reproduction system according to arrangement (37) is characterized in that the means for re-selecting a base marker pair re-selects a left marker pair when a code skews to the right, and a right marker pair when the code skews to the left.

According to this arrangement, markers constituting a block are sequentially obtained with reference to base marker pair by extrapolation. This arrangement can prevent a marker from protruding a frame due to skew and causing block omissions (in the horizontal direction).

(39) The information reproduction system according to arrangement (37) is characterized in that the means for re-selecting a base marker pair re-selects a marker pair near a center when a middle point between a left marker and a reference marker is on the right side of a frame center, or a middle point between a right marker and the reference marker is on the left side of the frame center.

According to this arrangement, markers constituting a block are sequentially obtained with reference to base marker pair by extrapolation. This arrangement can prevent a marker from protruding a frame due to skew and causing block omissions.

In addition, since blocks near the center are selected, the influence of distortion is small.

(40) The information reproduction system according to arrangement (27) is characterized in that the marker pair selecting means includes means for selecting a set of markers constituting a block.

According to this arrangement, for example, by selecting a set of markers on the four corners of each block, read data can be divided and processed in units of blocks.

(41) The information reproduction system according to arrangement (40) is characterized in that the means for selecting a set of markers includes means for storing all sets of markers constituting blocks in a memory on the basis of an approximate center position.

According to this arrangement, even if blocks are not aligned, data can be read in units of blocks.

(42) The information reproduction system according to arrangement (40) is characterized in that the means for selecting a set of markers stores a predetermined marker of a plurality of markers constituting a block, and a relation representing a relationship between the marker and remaining markers in a memory.

According to this arrangement, if the relationship between at least one of the markers constituting a block and the remaining markers is known, only this at least one marker may be stored in a memory. This makes it possible to save a memory capacity.

(43) The information reproduction system according to arrangement (40) is characterized in that the means for selecting a set of markers includes means for selecting all sets of markers constituting blocks in a frame.

According to this arrangement, since even blocks which are redundantly selected are used as processing target blocks, the reliability can be improved.

(44) The information reproduction system according to arrangement (40) is characterized in that the means for selecting a set of markers includes means for sequentially selecting sets of markers in a frame, starting from sets of markers constituting blocks in a scan direction.

According to this arrangement, since processed blocks are not used as processing target blocks, redundant processing can be prevented.

(45) The information reproduction system according to arrangement (40) is characterized in that the means for selecting a set of markers includes means for sequentially selecting sets of markers in a frame, starting from sets of markers constituting blocks near end portions in a direction perpendicular to a scan direction.

According to this arrangement, since blocks closer to frame ends are affected more by distortion to increase errors, data are sequentially read from blocks closer to frame ends to be overwritten. With this operation, highly reliable data can be obtained without requiring any extra memory.

(46) The information reproduction system according to arrangement (40) is characterized in that the means for selecting a set of markers includes means for, when a failure to read a given block occurs, selecting a set of markers constituting another block having the same address as that of the given block.

According to this arrangement, read errors due to block omissions can be reduced.

(47) The information reproduction system according to arrangement (13) is characterized in that the data read reference point determining means includes means for estimating a data read reference point by using pattern dots recorded in a predetermined format.

According to this arrangement, by using pattern dots recorded in a predetermined format, whether read information is correct can be quickly determined.

In addition, by using at least one pattern dot, the reference point estimation precision can be improved.

(48) The information reproduction system according to arrangement (47) is characterized in that the pattern code is constituted by pattern dots arranged at predetermined positions with respect to the data code, and markers arranged at predetermined positions with respect to the pattern dots and used to detect the pattern dots, and the means for estimating a data read reference point by using the pattern dots estimates a correct data read reference point by using only the pattern dots having a predetermined positional relationship with an approximate reference point obtained by using the marker.

According to this arrangement, in the absence of distortion, the dot read range is broadened to increase the number of dots to be read, thereby improving the estimation precision.

In the presence of distortion, the range is limited to improve the estimation precision.

In addition, by setting a range between a marker pair, the processing is facilitated.

(49) The information reproduction system according to arrangement (47) is characterized in that the pattern code is constituted by pattern dots arranged at predetermined positions with respect to the data code, and markers arranged at predetermined positions with respect to the pattern dots and used to detect the pattern dots, the data read reference point determining means includes marker pair selecting means for selecting a marker pair for detecting the pattern dots, and also detecting approximate centers of the selected marker pair, and the means for estimating a data read reference point by using the pattern dots includes tree search means for reading pattern dots at dot read points determined by the approximate centers of the marker pair selected by the marker pair selecting means and a format, estimating an offset amount and direction of an approximate marker center position on the basis of a position and offset of a dot at which a read error has occurred, moving the approximate marker center on the basis of the estimation result, and setting a point at which a pattern dot can be read the maximum number of times as a data read reference point.

According to this arrangement, a reference point can be determined without requiring any complicated calculation.

In addition, the number of times of search processing can be set to be smaller than that required for full tree search processing.

(50) The information reproduction system according to arrangement (47) is characterized in that the pattern code is constituted by pattern dots arranged at predetermined positions with respect to the data code, and markers arranged at predetermined positions with respect to the pattern dots and used to detect the pattern dots, the data read reference point determining means further includes marker pair selecting means for selecting a marker pair for detecting the pattern dots, and also detecting approximate centers of the selected marker pair, and the means for estimating a data read reference point by using the pattern dots includes:

dot detecting means for detecting pattern dots at dot read points determined by the approximate centers of the marker pair and a format;

dot center calculating means for calculating a center of each of the detected pattern dots; and error minimizing means for estimating a read reference point such that a predetermined error function determined by a relationship between each calculated dot center and a format is minimized.

According to this arrangement, since a data read reference point is estimated by using the centers of a plurality of pattern dots, the precision is high.

(51) The information reproduction system according to arrangement (50) is characterized in that the dot detecting means includes means for detecting a dot at a dot read point determined by the approximate centers of the marker pair and the format, and searching for a dot near the point when no dot is detected.

According to this arrangement, even if the approximate center of a marker is calculated with an offset because of noise or the like, or a read point obtained by dividing the distance between approximate centers at a predetermined ratio is calculated with an offset because of distortion or inclination, pattern dots can be reliably detected. This prevent a deterioration in precision due to a decrease in the number of detected dots.

(52) The information reproduction system according to arrangement (51) is characterized in that the means for searching for a dot near the dot read point includes means for, when a dot is detected at a position with a deviation from the dot read point, shifting a next dot read point in advance in accordance with the deviation as an offset.

According to this arrangement, when a given dot is detected at an offset position, an adjacent dot tends to be offset in the same manner. For this reason, in reading the adjacent dot, the dot read point is shifted in advance by the offset amount to improve the search efficiency.

Assume that a dot detection point is offset due to distortion. In this case, if the dot read point is not shifted in accordance with the distortion amount, offsets are accumulated, resulting in a failure to detect dots. However, by shifting the read point in advance, this failure can be prevented.

(53) The information reproduction system according to arrangement (50) is characterized in that the dot detecting means includes means for calculating a center of each pattern dot detected at a dot read point, and re-calculating an approximate marker center by using each calculated dot center, thereby detecting a dot again.

According to this arrangement, since an approximate center is re-calculated on the basis of several pattern dots detected by the first read operation, the precision of the approximate center can be improved, and the number of dots to be re-detected can be increased.

(54) The information reproduction system according to arrangement (50) is characterized in that the dot detecting means includes means for, after detecting dots, selecting only a correct dot by error detection from the detected dots, and obtaining only the selected dot as a detection result.

According to this arrangement, even if pattern dots have information, a position where a dot is correctly detected can be determined. This makes it possible to prevent a deterioration in data read reference point precision due to noise.

(55) The information reproduction system according to arrangement (50) is characterized in that the dot center calculating means includes means for estimating a dot center position from a pattern shape of each dot.

According to this arrangement, a center position existing area can be obtained from a pattern shape obtained by binarizing a dot whose shape is known. For this reason, by setting a point in this area as a representative central point, a dot center can be estimated with higher resolution than the inherent resolution even by coarse sampling.

(56) The information reproduction system according to arrangement (50) is characterized in that the dot center calculating means includes means for calculating a centroid of a dot.

According to this arrangement, since the relationship between a dot shape and a representative point need not be held as a table, scalability can be obtained.

(57) The information reproduction system according to arrangement (50) is characterized in that the dot center calculating means includes mask means for limiting an area contributing to calculation of a center by using a mask having an appropriate size.

According to this arrangement, by using a mask with reference to a position where a dot is detected, the influence of an error due to noise (stain) on the estimation of a read reference point can be reduced.

(58) The information reproduction system according to arrangement (57) is characterized in that the mask means includes means for determining a mask position and a mask size on the basis of pixel information of the limited area.

According to this arrangement, a mask is used, with reference to a position where a dot is detected, to detect the offset of a dot within the mask, and the mask is moved in a direction to eliminate the offset. Thereafter, the center is calculated. With this operation, the mask size can be decreased in accordance with the dot size, thereby allowing the use of a memory having a small capacity and reducing errors caused by noise.

(59) The information reproduction system according to arrangement (50) is characterized in that the dot center calculating means includes means for adding a weight contributing to estimation of a data read reference point in accordance with a pattern shape of a detected dot.

According to this arrangement, the representative central points of dots differ in reliability depending on generated pattern shapes. The estimation precision can therefore be improved by estimating a data read reference point using these different degrees of reliability as weights.

(60) The information reproduction system according to arrangement (50) is characterized in that when the dot detecting means cannot detect a pattern dot at the dot read point, the dot center calculating means sets the dot read point as a center of the pattern dot which cannot be read.

According to this arrangement, no means is required to calculate mathematical expression (12). In addition, divisions in equations (7) to (10) are performed with constants and hence can be replaced with multiplications of the reciprocals, thereby making this system more suitable for hardware.

(61) The information reproduction system according to arrangement (13) is characterized in that the data code is recorded for at least not less than one block, the data code of each block is constituted by data dots and address dots recorded in a predetermined format indicating an address of the block, and the data reading means includes address reading means for reading the address dots while omitting some dots, and simultaneously determining addresses of at least not less than two blocks.

According to this arrangement, when blocks are recorded to be arranged in the address order, the address of a given block can be easily estimated from the addresses of neighboring blocks. A read operation can therefore be performed with same address dots being properly omitted without posing any problem. The reading processing amount can be reduced accordingly.

(62) The information reproduction system according to arrangement (13) is characterized in that the data code is recorded for at least not less than one block, the data code of each block is constituted by data dots and address dots recorded in a predetermined format indicating an address of the block, the address dots has a format corresponding to a code in which addresses of adjacent blocks have a predetermined relationship with the total number of blocks of the code, and the data reading means includes total-number-of-blocks calculating means for reading the address dots and obtaining the total number of blocks from adjacent addresses.

According to this arrangement, by obtaining the total number of blocks, a necessary memory can be assigned.

In addition, since the last block can be detected, unnecessary processing can be omitted.

(63) The information reproduction system according to arrangement (13) is characterized in that the data reading means includes near point reading means for simultaneously reading a point near a read point calculated from a data read reference point, and determining an attribute of a read point according to a predetermined calculation expression.

According to this arrangement, the ability to read degraded dots can be enhanced by using the states of adjacent pixels.

Additional advantages and modifications will readily occur to those skilled in the art. Therefore, the invention in its broader aspects is not limited to the specific details, representative devices shown and described herein. Accordingly, various modifications may be made without departing from the spirit or scope of the general inventive concept as defined by the appended claims and their equivalents.

What is claimed is:

1. An information reproduction system comprising:

image inputting means for imaging parts of a dot code a plurality of times, respectively, which is optically readably recorded on an information recording medium, and which comprises a plurality of blocks arranged adjacent to each other, such that each time the image inputting means images the dot code, those blocks of the plurality of blocks which are located within an imaging area of the image inputting means are imaged, thereby obtaining a plurality of images each of which includes images of those blocks of the plurality of blocks which are located within the imaging area of the image inputting means when said each of the plurality of images is obtained, the plurality of images constituting an image of the dot code, each of the blocks comprising (i) a plurality of data dots arranged in accordance with contents of multimedia information to be reproduced, and (ii) a marker located to have a predetermined positional relationship with the data dots, the marker being located to determine reference read points for use in reading the data dots, respectively;

restoring means for restoring the plurality of images obtained by the image inputting means to data of the multimedia information; and data reproducing means for reproducing the data obtained by the restoring means as original multimedia information, wherein the restoring means includes selecting/reading means for selecting and reading at least one of the images of the blocks in said each of the plurality of images, on which optical distortion has a smaller effect than on any of the other images of the blocks in said each of the plurality of images.

2. The information reproduction system according to claim 1, wherein the selecting/reading means includes means for selecting and reading at least one of the images of the blocks in said each of the plurality of images, which is close to a center of the imaging area of the image inputting means.

3. The information reproduction system according to claim 1, wherein the selecting/reading means includes means for selecting and detecting images of markers from images of the markers which are associated with the images of the blocks in said each of the plurality of images, the selected and detected images of the markers being marker images on which optical distortion has a smaller effect than on any of the other images of the markers which are associated with the images of the blocks in said each of the plurality of images.

4. The information reproduction system according to claim 1, wherein the selecting/reading means includes means for selecting and reading images of data dots from images of the data dots which are located in the images of the blocks in said each of the plurality of images, the selected and read images of the data dots being data dot images on which optical distortion has a smaller effect than on any of the other images of the data dots which are located in the images of the blocks in said each of the plurality of images.

5. The information reproduction system according to claim 1, wherein the image inputting means is manually operable to scan the dot code in order to optically read the dot code.

6. An information reproduction system comprising:

image inputting means for imaging a dot code which is optically readably recorded on an information recording medium, and which comprises a plurality of blocks arranged adjacent to each other, such that the plurality of blocks are imaged, thereby obtaining an image of the dot code, each of the plurality of blocks comprising (i) a plurality of data dots arranged in accordance with contents of multimedia information to be reproduced, and (ii) a marker located to have a predetermined positional relationship with the data dots, the marker being located to determine reference read points for use in reading the data dots, respectively;

restoring means for restoring the image obtained by the image inputting means to data of the multimedia information; and data reproducing means for reproducing the data obtained by the restoring means as original multimedia information, wherein of the plurality of the blocks in the dot code, there are blocks having identical data dots, and the restoring means includes selecting/reading means for selecting and reading images of blocks from images of the plurality of blocks, the selected and read images of the blocks being block images on which optical distortion has a smaller effect than on any of the images of the other blocks.

7. The information reproduction system according to claim 6, wherein the selecting/reading means includes means for selecting and reading images of those blocks of the plurality of blocks, which are close to a center of an imaging area of the image inputting means.

8. The information reproduction system according to claim 6, wherein the selecting/reading means includes means for selecting and detecting images of markers from images of the markers of the plurality of blocks, the selected and detected images of the markers being marker images on which optical distortion has a smaller effect than on any of the images of the other markers.

9. The information reproduction system according to claim 6, wherein the selecting/reading means includes means for selecting and reading images of data dots from images of the data dots of the plurality of blocks, the selected and read images of the data dots being data dot images on which optical distortion has a smaller effect than on any of the images of the other data dots.

10. The information reproduction system according to claim 6, wherein the image inputting means is manually operated, thereby optically reading the dot code.

* * * * *